United States Patent
Fujiwara et al.

(10) Patent No.: US 10,720,333 B2
(45) Date of Patent: Jul. 21, 2020

(54) SUBSTRATE PROCESSING APPARATUS AND SUBSTRATE PROCESSING METHOD

(71) Applicant: SCREEN Holdings Co, Ltd., Kyoto (JP)

(72) Inventors: Tomonori Fujiwara, Kyoto (JP); Nobuyuki Shibayama, Kyoto (JP); Yukifumi Yoshida, Kyoto (JP); Tetsuya Shibata, Kyoto (JP); Akiyoshi Nakano, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/198,410

(22) Filed: Nov. 21, 2018

(65) Prior Publication Data

US 2019/0096688 A1    Mar. 28, 2019

Related U.S. Application Data

(62) Division of application No. 14/487,573, filed on Sep. 16, 2014, now Pat. No. 10,199,231.

(30) Foreign Application Priority Data

Sep. 27, 2013 (JP) .................................. 2013-201103
Sep. 27, 2013 (JP) .................................. 2013-201118

(Continued)

(51) Int. Cl.
*H01L 21/306* (2006.01)
*H01L 21/67* (2006.01)
(Continued)

(52) U.S. Cl.
CPC .... *H01L 21/30604* (2013.01); *H01L 21/0209* (2013.01); *H01L 21/02087* (2013.01);
(Continued)

(58) Field of Classification Search
None
See application file for complete search history.

(56) References Cited

U.S. PATENT DOCUMENTS 5,785,068 A    7/1998  Sasaki
6,079,428 A    6/2000  Anai .............................. 134/172
(Continued)

FOREIGN PATENT DOCUMENTS

JP    07-115081    5/1995
JP    H7-115060    5/1995
(Continued)

OTHER PUBLICATIONS

Office Action dated Apr. 30, 2019 issued in corresponding Chinese Application No. 201410482761.5 with English translation.
(Continued)

*Primary Examiner* — Allan W. Olsen
(74) *Attorney, Agent, or Firm* — Ostrolenk Faber LLP

(57) ABSTRACT

A substrate processing apparatus includes: a substrate holder to hold a substrate in a horizontal posture while rotating the substrate about a vertical rotary axis passing through the center of a plane of the substrate; a guard member having a shape extending along at least part of a surface peripheral area of the substrate, the guard member being placed in a position close to the surface peripheral area of the substrate held by the substrate holder in a noncontact manner; a cup being a tubular member with an open top end, the cup being provided so as to surround the substrate held by the substrate holder and the guard member together; and a nozzle from which a processing liquid is discharged to the surface peripheral area of the substrate held by the substrate holder. The nozzle is placed on a side opposite the cup with respect to at least part of the guard member.

12 Claims, 36 Drawing Sheets

(30) Foreign Application Priority Data

Sep. 27, 2013 (JP) ................................ 2013-201263
Sep. 27, 2013 (JP) ................................ 2013-201425

(51) Int. Cl.
*H01L 21/687* (2006.01)
*H01L 21/02* (2006.01)

(52) U.S. Cl.
CPC .. *H01L 21/67028* (2013.01); *H01L 21/67051* (2013.01); *H01L 21/68728* (2013.01)

(56) References Cited

U.S. PATENT DOCUMENTS

| | | | | |
|---|---|---|---|---|
| 6,568,408 | B2 * | 5/2003 | Mertens | G03F 7/423 134/144 |
| 6,586,342 | B1 * | 7/2003 | Mayer | C23F 1/08 156/345.17 |
| 6,712,926 | B2 | 3/2004 | Chiang | |
| 6,793,769 | B2 | 9/2004 | Kajino et al. | 156/345.55 |
| 7,182,821 | B2 | 2/2007 | Izumi et al. | 134/36 |
| 7,332,055 | B2 | 2/2008 | Orii | |
| 7,543,593 | B2 | 6/2009 | Orii et al. | 134/1.3 |
| 7,608,152 | B2 | 10/2009 | Miya et al. | 134/33 |
| 7,722,736 | B2 | 5/2010 | Miya | 156/345.17 |
| 7,780,867 | B1 * | 8/2010 | Mayer | H01L 21/6708 216/105 |
| 7,793,610 | B2 | 9/2010 | Akimoto et al. | 118/52 |
| 7,811,412 | B2 | 10/2010 | Miya et al. | 156/345.55 |
| 7,862,680 | B2 | 1/2011 | Orii et al. | 156/345.21 |
| 7,935,217 | B2 | 5/2011 | Yashiki et al. | 156/345.17 |
| 8,127,391 | B2 | 3/2012 | Nonomura et al. | 15/77 |
| 8,372,757 | B2 * | 2/2013 | Mayer | C23F 1/02 438/754 |
| 8,734,593 | B2 | 5/2014 | Kishimoto et al. | 134/33 |
| 8,828,183 | B2 | 9/2014 | Namba et al. | 156/345.21 |
| 9,305,770 | B2 * | 4/2016 | Kinoshita | H01L 21/67051 |
| 9,548,197 | B2 * | 1/2017 | Yoshizumi | H01L 21/67028 |
| 10,424,496 | B2 * | 9/2019 | Inoue | H01L 21/67109 |
| 2003/0017665 | A1 | 2/2003 | Tamada | |
| 2003/0024645 | A1 | 2/2003 | Orii et al. | 156/345.33 |
| 2003/0079835 | A1 | 5/2003 | Kajino | |
| 2003/0098040 | A1 | 5/2003 | Nam et al. | 134/1.3 |
| 2004/0040177 | A1 | 3/2004 | Izumi | |
| 2004/0084144 | A1 | 5/2004 | Yokouchi et al. | 156/345.11 |
| 2005/0077182 | A1 * | 4/2005 | Balisky | C25D 21/12 205/82 |
| 2005/0247667 | A1 * | 11/2005 | Kim | H01L 21/67051 216/57 |
| 2005/0276921 | A1 | 12/2005 | Miya et al. | 427/240 |
| 2006/0130968 | A1 | 6/2006 | Orii et al. | 156/345.11 |
| 2007/0113874 | A1 | 5/2007 | Izumi et al. | 134/33 |
| 2007/0119476 | A1 | 5/2007 | Hara et al. | |
| 2007/0277930 | A1 | 12/2007 | Yokoyama et al. | 156/345.31 |
| 2008/0035610 | A1 | 2/2008 | Miya et al. | 216/84 |
| 2008/0210278 | A1 | 9/2008 | Orii et al. | 134/198 |
| 2009/0181546 | A1 * | 7/2009 | Katoh | H01L 21/67063 438/745 |
| 2009/0202951 | A1 | 8/2009 | Yamamoto | G03F 7/168 430/322 |
| 2010/0032097 | A1 | 2/2010 | Ohashi | |
| 2013/0048610 | A1 * | 2/2013 | Goodman | B44C 1/22 216/83 |
| 2013/0171831 | A1 | 7/2013 | Namba et al. | 438/748 |
| 2014/0051258 | A1 | 2/2014 | Izumoto et al. | 438/748 |
| 2014/0051259 | A1 | 2/2014 | Shibayama | 438/748 |
| 2014/0374022 | A1 | 12/2014 | Namba et al. | 156/345.15 |
| 2015/0340251 | A1 * | 11/2015 | Wakita | H01L 21/67051 438/748 |

FOREIGN PATENT DOCUMENTS

| | | |
|---|---|---|
| JP | 08-001064 | 1/1996 |
| JP | 09-260277 | 10/1997 |
| JP | 11054424 A | 2/1999 |
| JP | H11-54424 | 2/1999 |
| JP | 11-260780 | 9/1999 |
| JP | 2000-235948 | 8/2000 |
| JP | 2001-060576 | 3/2001 |
| JP | 2001-319849 A | 11/2001 |
| JP | 2002-343700 A | 11/2002 |
| JP | 2002-359220 | 12/2002 |
| JP | 2003-45839 | 2/2003 |
| JP | 2003-264168 | 9/2003 |
| JP | 2003-286597 | 10/2003 |
| JP | 2004-006672 | 1/2004 |
| JP | 2004-55927 | 2/2004 |
| JP | 2004-221244 | 8/2004 |
| JP | 3761482 | 1/2006 |
| JP | 2006-32891 | 2/2006 |
| JP | 2006-060252 | 3/2006 |
| JP | 2006-114884 A | 4/2006 |
| JP | 2006-210580 | 8/2006 |
| JP | 2006-229057 | 8/2006 |
| JP | 2007-103956 A | 4/2007 |
| JP | 2007-165488 A | 6/2007 |
| JP | 2007-258274 | 10/2007 |
| JP | 2008-300454 | 12/2008 |
| JP | 2009-070946 | 4/2009 |
| JP | 2009-158564 | 7/2009 |
| JP | 2010-080583 A | 4/2010 |
| JP | 2011-238967 | 11/2011 |
| JP | 2012-256743 A | 12/2012 |
| JP | 2013-153135 | 8/2013 |

OTHER PUBLICATIONS

Machine Generated Translation of JP11054424A, Published Feb. 26, 1999 (Year: 1999).
Machine Generated English Translation of JP09-260277, Published Oct. 3, 1997.
Office Action dated Aug. 9, 2018 in counterpart Chinese Patent Application No. 2014104827615 with Japanese translation and English partial translation based on the Japanese translation.
Japanese Decision of Grant (Application No. 2013-201118) dated Oct. 17, 2017.
Japanese Office Action (Application No. 2013-201103) dated Nov. 14, 2017 and partial English translation thereof.
Japanese Office Action (Application No. 2013-201263) dated Sep. 19, 2017 and English translation thereof.
Japanese Office Action dated Feb. 21, 2017 issued for a counterpart Japanese application (Application No. 2013-201103) and English translation thereof.
Decision of Grant dated Mar. 7, 2017 issued for a Japanese counterpart application (Application No. 2013-201425).
Chinese Office Action dated May 4, 2017 issued for Chinese counterpart (Application No. 201410482761.5) of the present application with English partial translation based on Japanese translation of same.
Japanese Office Action (Application No. 2013-201118) dated Mar. 21, 2017 w/English translation thereof.
Japanese Office Action (Application No. 2013-201263) dated Apr. 25, 2017 w/English translation thereof.
Jun. 8, 2016 Office Action in corresponding Taiwanese application; partial English translation based on Japanese translation of same.
Taiwanese Office Action dated Jan. 7, 2016 with partial English translation.

* cited by examiner

F I G. 1
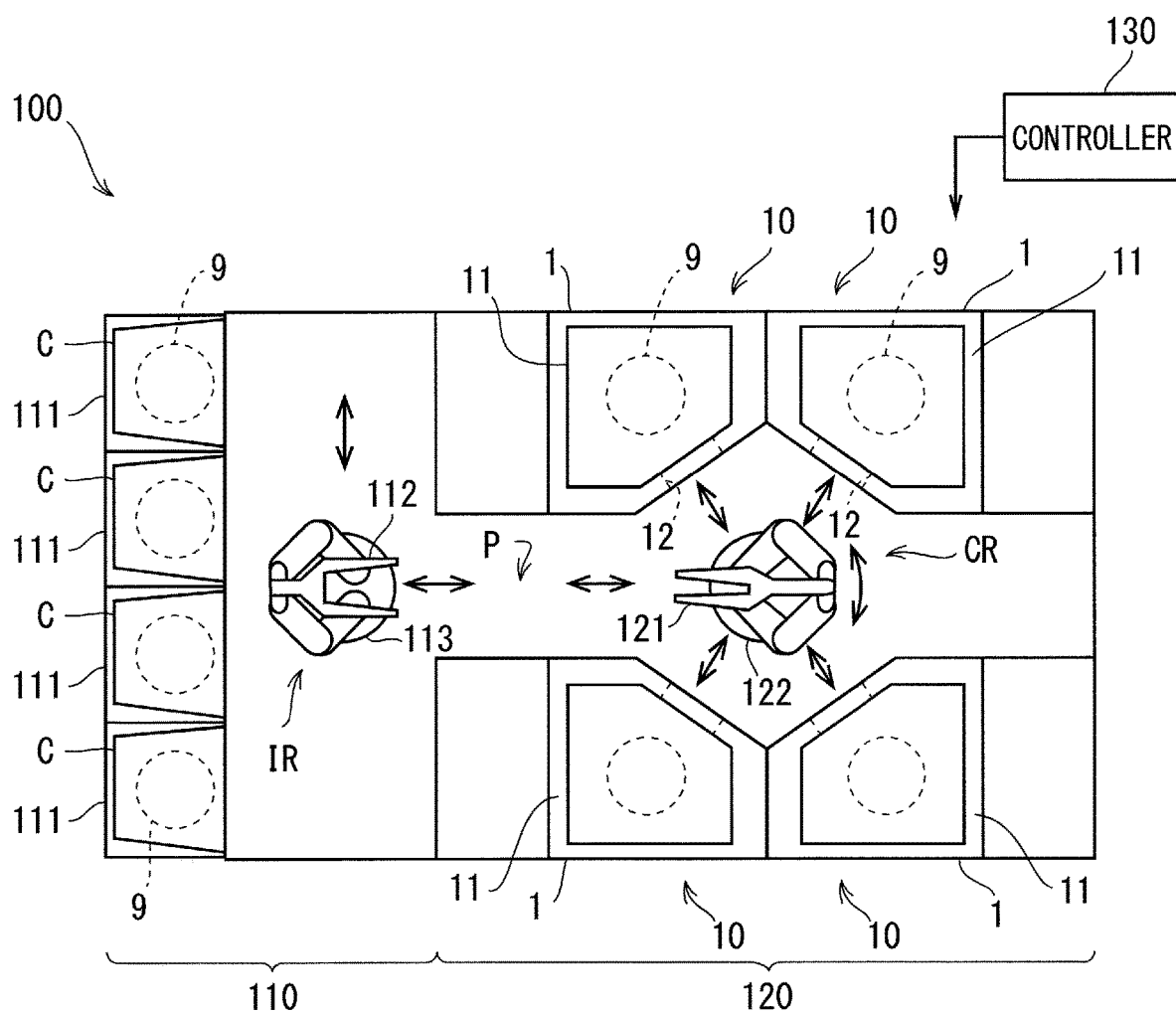

FIG. 2
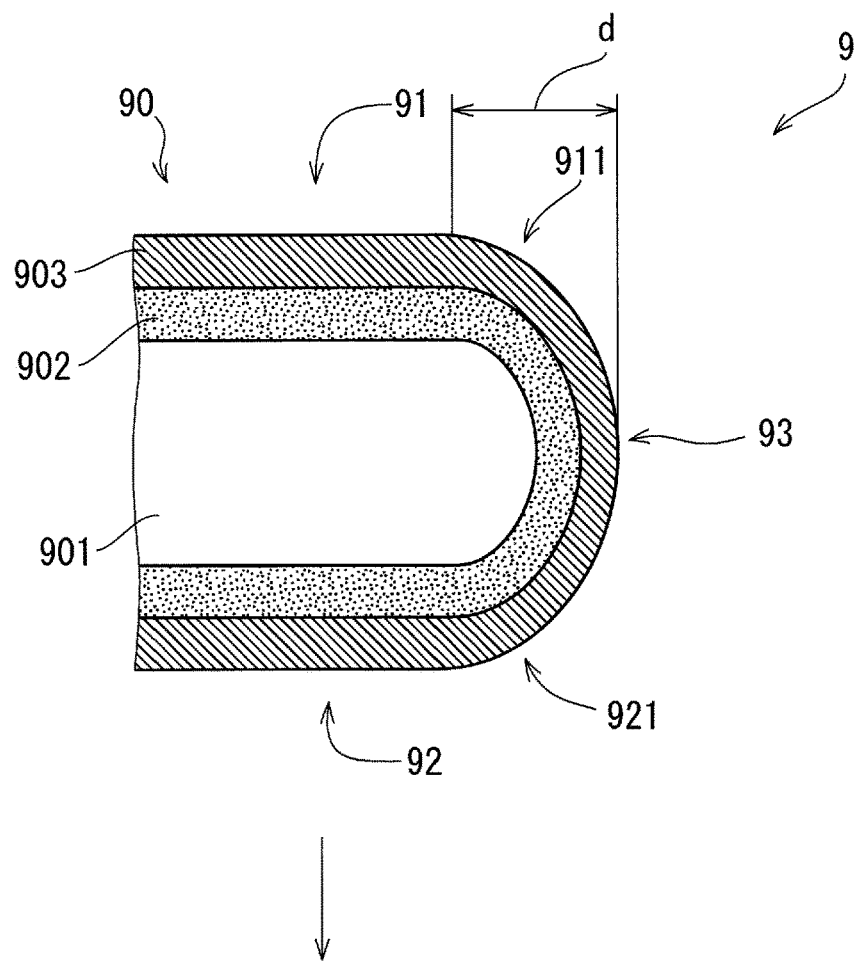
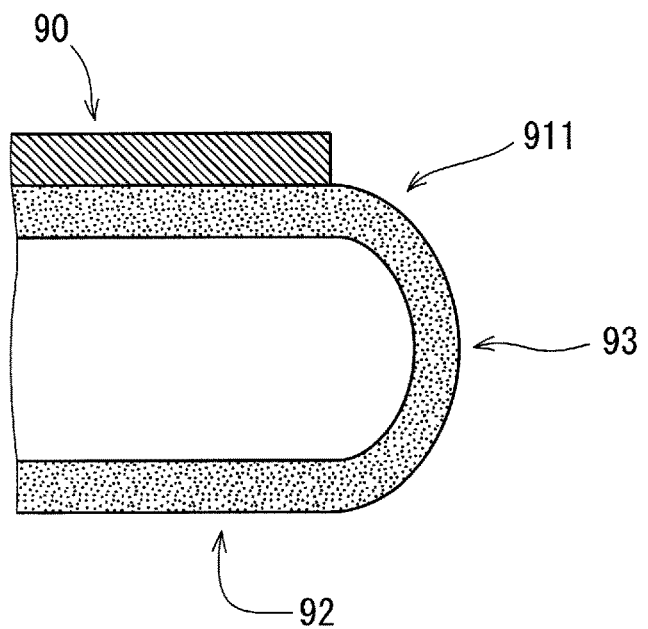

F I G. 4
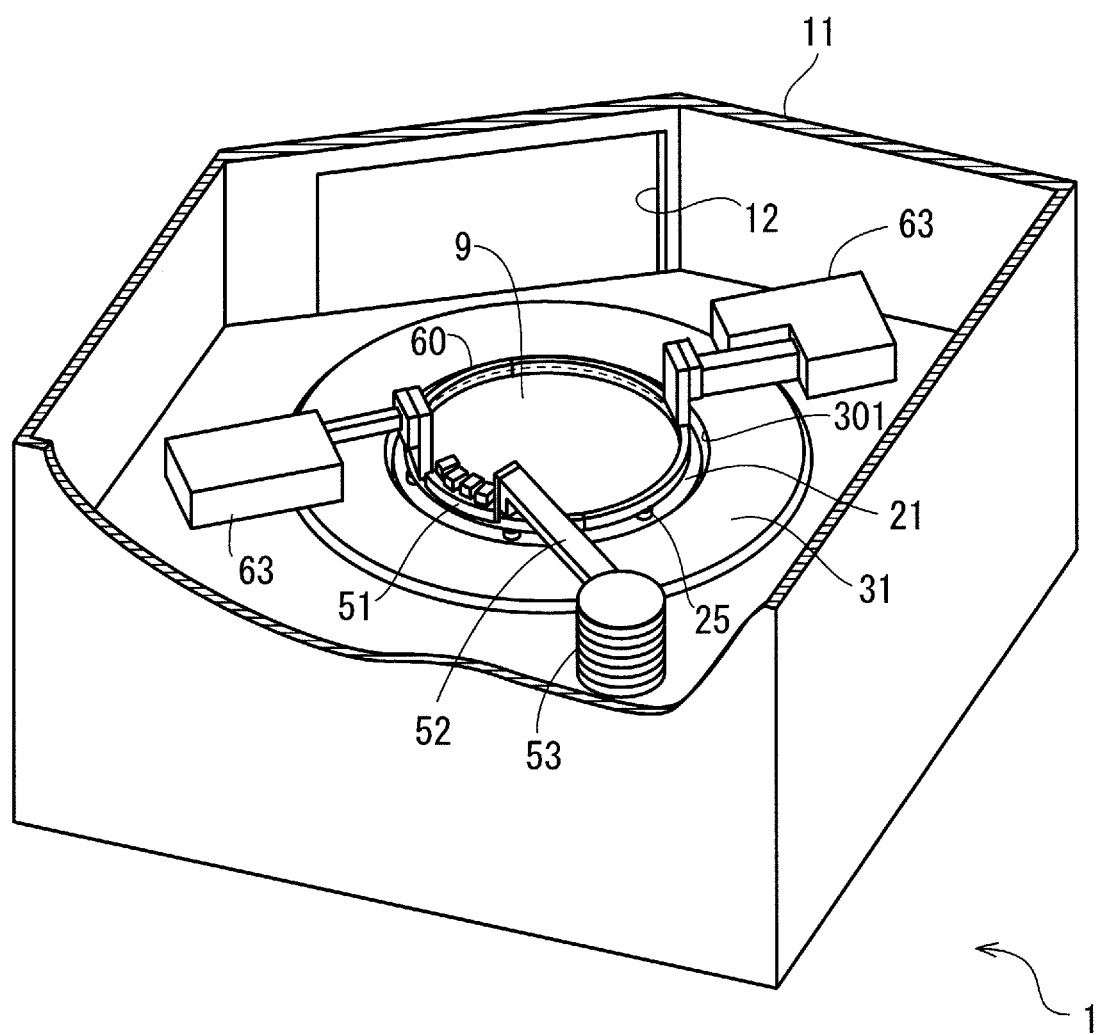

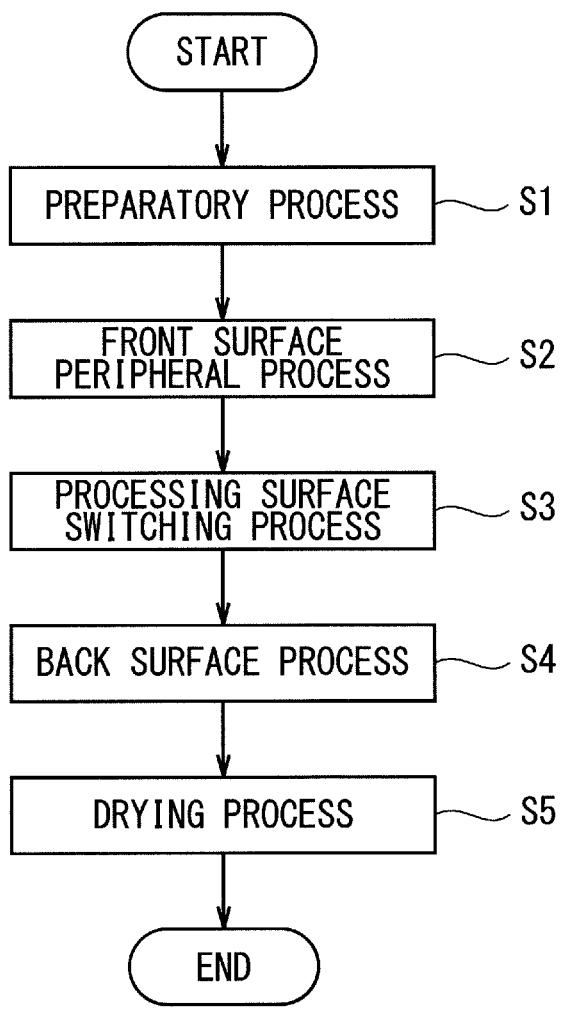
F I G. 1 4

F I G. 1 7
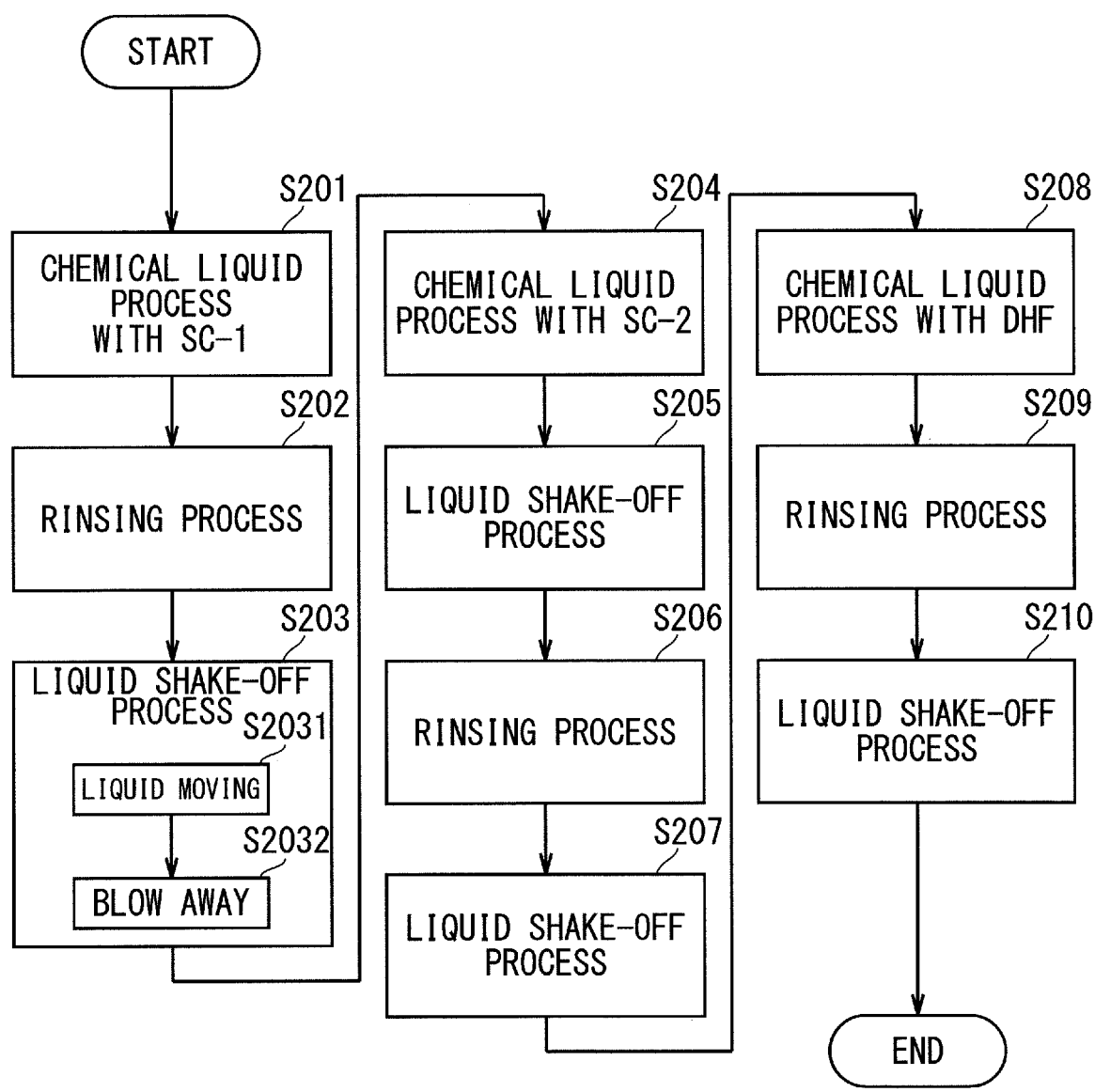

F I G. 2 7
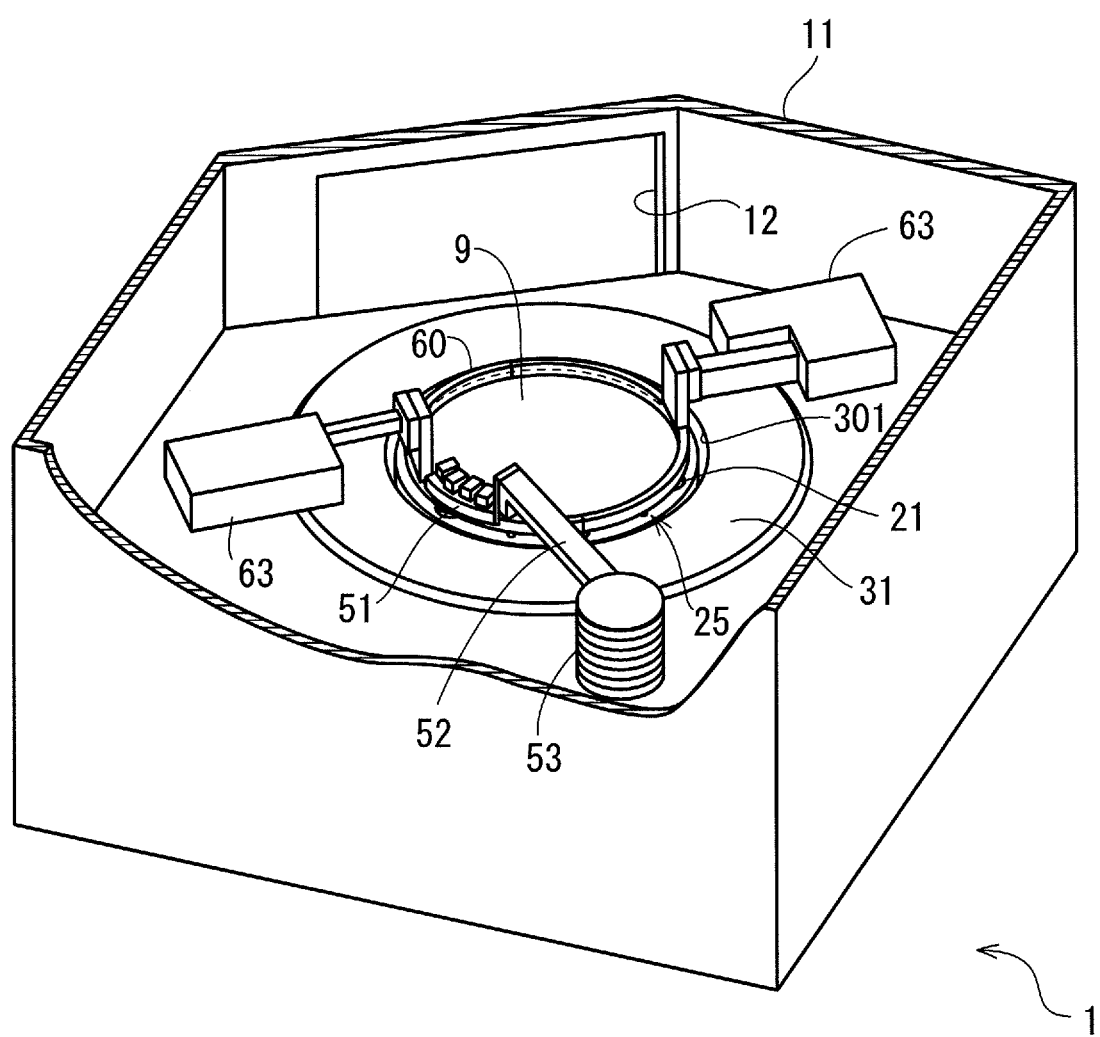

F I G. 3 7
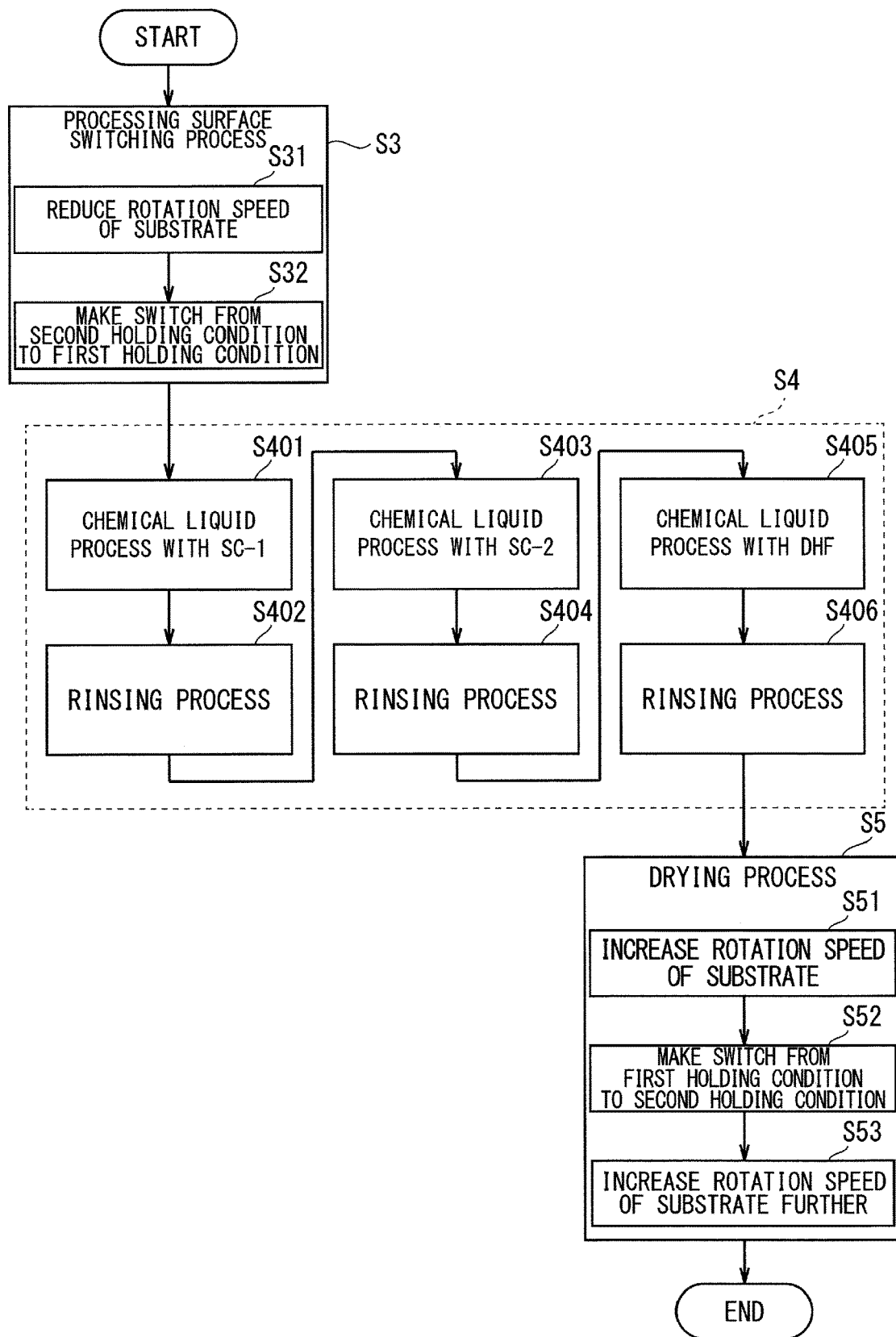

SUBSTRATE PROCESSING APPARATUS AND SUBSTRATE PROCESSING METHOD

CROSS-REFERENCE TO RELATED APPLICATIONS

The present patent application is a divisional under 37 C.F.R. § 1.53(b) of prior U.S. patent application Ser. No. 14/487,573, filed Sep. 16, 2014, by Tomonori FUJIWARA, Nobuyuki SHIBAYAMA, Yukifumi YOSHIDA, Tetsuya SHIBATA and Akiyoshi NAKANO, entitled "SUBSTRATE PROCESSING APPARATUS AND SUBSTRATE PROCESSING METHOD," which claims priority to Japanese Patent Application Nos. JP2013-201118, filed Sep. 27, 2013, JP2013-201103, filed Sep. 27, 2013, JP2013-201425, filed Sep. 27, 2013 and JP2013-201263, filed Sep. 27, 2013. The entire contents of each of these patent applications are incorporated herein by reference.

BACKGROUND OF THE INVENTION

Field of the Invention

The present invention relates to a technique of processing a semiconductor wafer, a glass substrate for a liquid crystal display, a glass substrate for a plasma display, a substrate for an optical disk, a substrate for a magnetic disk, a substrate for a magnetooptical disk, a glass substrate for a photomask, and a substrate for a solar cell (these substrates are hereinafter simply called "substrates"), for example.

Description of the Background Art

There has conventionally been a substrate processing apparatus that supplies a processing liquid to a rotated substrate to process the substrate with the liquid (see Japanese Patent Application Laid-Open Nos. 7-115081 (1995), 2000-235948 and 2002-359220).

Processing a substrate with liquid has encountered many problems. As an example, while a processing liquid is supplied to part of the substrate such as an area (surface peripheral area) in a surface of the substrate outside a region (device region) where a device pattern is to be formed to process this part of the substrate, the processing liquid supplied to the substrate may partially adhere to a region (such as the device region) not to be processed with the processing liquid. Such adhesion of the processing liquid may become a cause for some problem.

SUMMARY OF THE INVENTION

The present invention is intended for a substrate processing apparatus. The substrate processing apparatus according to an aspect of this invention includes: a substrate holder to hold a substrate in a horizontal posture, the substrate holder rotating the substrate about a vertical rotary axis passing through the center of a plane of the substrate; a guard member having a shape extending along at least part of a surface peripheral area of the substrate, the guard member being placed in a position close to the surface peripheral area of the substrate held by the substrate holder in a noncontact manner; a cup being a tubular member with an open top end, the cup being provided so as to surround the substrate held by the substrate holder and the guard member together; and a nozzle from which a processing liquid is discharged to the surface peripheral area of the substrate held by the substrate holder. The nozzle is placed on a side opposite the cup with respect to at least part of the guard member.

Space between the nozzle and the cup is filled at least partially with the guard member. This structure reduces space that might permit floating for example of mist of a processing liquid splashed from the substrate by the space filled with the guard member. This reduction of the space reduces the probability of re-adhesion for example of mist of the processing liquid to the substrate. Specifically, this can suppress re-adhesion of part of the processing liquid to the substrate after the processing liquid is splashed from the substrate.

In the substrate processing apparatus according to a different aspect of this invention, at least part of a lower surface of the guard member is placed to face the surface peripheral area.

At least part of the lower surface of the guard member is placed to face the surface peripheral area of the substrate held by the substrate holder. In this structure, a processing liquid splashed from the substrate is guided along the lower surface of the guard member into the cup. This can sufficiently suppress re-adhesion of the splashed processing liquid to the substrate.

In the substrate processing apparatus according to a different aspect of this invention, the lower surface of the guard member is placed in the same height as or below a discharge surface of the nozzle through which the processing liquid is discharged.

The lower surface of the guard member is placed in the same height as or below the discharge surface of the nozzle through which the processing liquid is discharged. This structure can particularly effectively suppress re-adhesion of a processing liquid to the substrate after the processing liquid is splashed from the substrate.

In the substrate processing apparatus according to a different aspect of this invention, the lower surface of the guard member is placed in the same height as or below a lower surface of a top edge portion of the cup.

The lower surface of the guard member is placed in the same height as or below the lower surface of the top edge portion of the cup. This structure can particularly effectively suppress re-adhesion of a processing liquid to the substrate after the processing liquid is splashed from the substrate.

In the substrate processing apparatus according to a different aspect of this invention, the guard member is a ring-shaped member extending along an entire circumference of the surface peripheral area of the substrate.

The guard member is a ring-shaped member extending along the entire circumference of the surface peripheral area of the substrate. This structure can suppress re-adhesion of a processing liquid to the substrate throughout the circumferential direction of the substrate after the processing liquid is splashed from the substrate.

In the substrate processing apparatus according to a different aspect of this invention, the guard member is formed by making abutting contact between multiple arcuate members as separate members at respective end faces thereof in their circumferential directions. While the substrate is not held by the substrate holder, each of the arcuate members is placed in a retreat position outside a transport path for the substrate while being spaced from different one of the arcuate members.

The guard member is formed by making abutting contact between the multiple arcuate members as separate members at respective end faces thereof in their circumferential directions. While the substrate is not held by the substrate holder, each of the arcuate members is placed in the retreat position outside the transport path for the substrate while being spaced from different one of the arcuate members. In this structure, the guard member can retreat easily to the outside of the transport path for the substrate.

In the substrate processing apparatus according to a different aspect of this invention, while the substrate is not held by the substrate holder, the cup is in a retreat position that places the top edge portion of the cup below an upper surface of the substrate holder. The retreat position of each of the arcuate members is below the upper surface of the substrate holder and outside the top edge portion of the cup as viewed from above.

While the substrate is not held by the substrate holder, the cup and each of the arcuate members are placed in their retreat positions below the upper surface of the substrate holder. In this structure, by supplying a cleaning liquid to the substrate holder not holding the substrate while rotating the substrate holder, the substrate holder, the cup, and each of the arcuate members can be cleaned together.

The substrate processing apparatus according to a different aspect of this invention includes: an up-and-down drive part to move each of the arcuate members up and down along a vertical axis; and an advance-and-retreat drive part to move each of the arcuate members in a horizontal plane in a direction where each of the arcuate member gets closer to or farther from different one of the arcuate members.

In the substrate processing apparatus according to a different aspect of this invention, the guard member includes: a body; and a canopy projecting from an outer circumferential wall of the body. The outer circumferential wall of the body extends along at least part of the top edge portion of the cup while being close to the top edge portion in a noncontact manner. The canopy covers a gap between the outer circumferential wall of the body and the top edge portion of the cup.

The canopy covers the gap between the outer circumferential wall of the body and the top edge portion of the cup. This structure makes the canopy block a route of a processing liquid to be splashed into the substrate after flowing upward in this gap. This can sufficiently suppress re-adhesion of a processing liquid to the substrate after the processing liquid is splashed from the substrate.

In the substrate processing apparatus according to a different aspect of this invention, the guard member includes a cut where at least part of the nozzle is housed.

At least part of the nozzle is housed in the cut of the guard member. This structure can place the nozzle above the surface peripheral area of the substrate while preventing interference between the guard member and the nozzle.

The present invention is also intended for a substrate processing apparatus. The substrate processing apparatus according to an aspect of this invention includes: a substrate holder to hold a substrate in a horizontal posture, the substrate holder rotating the substrate about a vertical rotary axis passing through the center of a plane of the substrate; a discharge head for peripheral area from which a processing liquid is discharged to a front surface peripheral area of the substrate held by the substrate holder; a back surface processing unit to discharge a processing liquid to a back surface of the substrate held by the substrate holder; and a controller to control the substrate holder, the discharge head for peripheral area, and the back surface processing unit. The controller causes a processing liquid to be discharged from the discharge head for peripheral area toward the front surface peripheral area of the substrate held and rotated by the substrate holder and thereafter, the controller makes the back surface processing unit discharge a processing liquid toward the back surface of the substrate.

While the substrate continues to be held by the substrate holder, the front surface peripheral area of this substrate and the back surface of this substrate are processed continuously. This can process both the front surface peripheral area and the back surface of the substrate while suppressing reduction of a throughput. Meanwhile, a processing liquid is discharged toward each of the front surface peripheral area and the back surface of the substrate. This can stably control the amount of a processing liquid held on each of the front surface peripheral area and the back surface. Additionally, a processing liquid is supplied to the back surface after a processing liquid is supplied to the front surface peripheral area. Thus, if the processing liquid supplied to the front surface peripheral area is splashed from the substrate and then adheres to the back surface, the processing liquid adhering to the back surface can be washed away with the processing liquid supplied to the back surface of the substrate thereafter. In this way, both the front surface peripheral area and the back surface can be processed properly. As a result, the front surface peripheral area and the back surface can be processed properly while reduction of a throughput is suppressed.

In the substrate processing apparatus according to a different aspect of this invention, the controller makes the substrate holder reduce a rotation speed of the substrate after stopping discharge of the processing liquid from the discharge head for peripheral area and before starting discharge of the processing liquid from the back surface processing unit.

The rotation speed of the substrate is reduced before the processing liquid is discharged toward the back surface. Specifically, the substrate is rotated at a relatively high speed while the processing liquid is supplied to the front surface peripheral area and is rotated at a relatively low speed while the processing liquid is supplied to the back surface. This structure can suppress entry of the processing liquid supplied to the front surface peripheral area into a device region. This structure can also suppress entry of the processing liquid supplied to the back surface into the device region to be caused if this processing liquid goes into the front surface of the substrate.

The substrate processing apparatus according to a different aspect of this invention includes: a guard member having a shape extending along at least part of the front surface peripheral area of the substrate, the guard member being placed in a position close to the front surface peripheral area of the substrate held by the substrate holder in a noncontact manner; and a cup being a tubular member with an open top end. The cup is provided so as to surround the substrate held by the substrate holder and the guard member together. The discharge head for peripheral area is placed on a side opposite the cup with respect to at least part of the guard member, and a processing liquid is discharged from the discharge head for peripheral area toward the front surface peripheral area.

Space between the discharge head for peripheral area and the cup is filled at least partially with the guard member. This structure reduces space that might permit floating for example of mist of a processing liquid splashed from the substrate by the space filled with the guard member. This reduction of the space reduces the probability of re-adhesion for example of mist of the processing liquid to the substrate. Specifically, this can suppress re-adhesion of part of the processing liquid to the substrate after the processing liquid is splashed from the substrate.

The present invention is also intended for a substrate processing method. The substrate processing method according to an aspect of this invention includes the steps of: a) making a substrate holder hold a substrate in a horizontal posture; b) rotating the substrate held by the substrate holder about a vertical rotary axis passing through the center of a plane of the substrate; c) discharging a processing liquid toward a front surface peripheral area of the substrate held and rotated by the substrate holder; and d) discharging a processing liquid toward a back surface of the substrate held and rotated by the substrate holder. The step d) is performed after the step c).

The substrate processing method according to a different aspect of this invention includes the step of e) reducing a rotation speed of the substrate held by the substrate holder. The step e) is performed after the step c) and before the step d).

The substrate processing method according to a different aspect of this invention includes the steps of: f) placing a guard member in a position close to the front surface peripheral area of the substrate held by the substrate holder in a noncontact manner, the guard member having a shape extending along at least part of the front surface peripheral area; g) placing a cup such that the cup surrounds the substrate held by the substrate holder and the guard member together, the cup being a tubular member with an open top end; and h) placing a discharge head for peripheral area on a side opposite the cup with respect to at least part of the guard member. The steps f), g), and h) are performed after the step a) and before the step b).

Thus, it is an object of the present invention to provide a technique capable of performing appropriate process when a substrate is processed with liquid.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagrammatic plan view schematically showing a substrate processing system;

FIG. 2 is a sectional view showing a peripheral area and its vicinity of a substrate to be processed;

FIGS. 3 and 4 are diagrammatic perspective views of a substrate processing apparatus;

FIG. 14 shows an entire flow of operation performed in the substrate processing apparatus;

FIG. 17 shows a flow of front surface peripheral process;

FIGS. 26 and 27 are diagrammatic perspective views of a substrate processing apparatus;

FIG. 37 shows a flow of process including back surface process;

DESCRIPTION OF THE PREFERRED EMBODIMENTS

Figure 3:
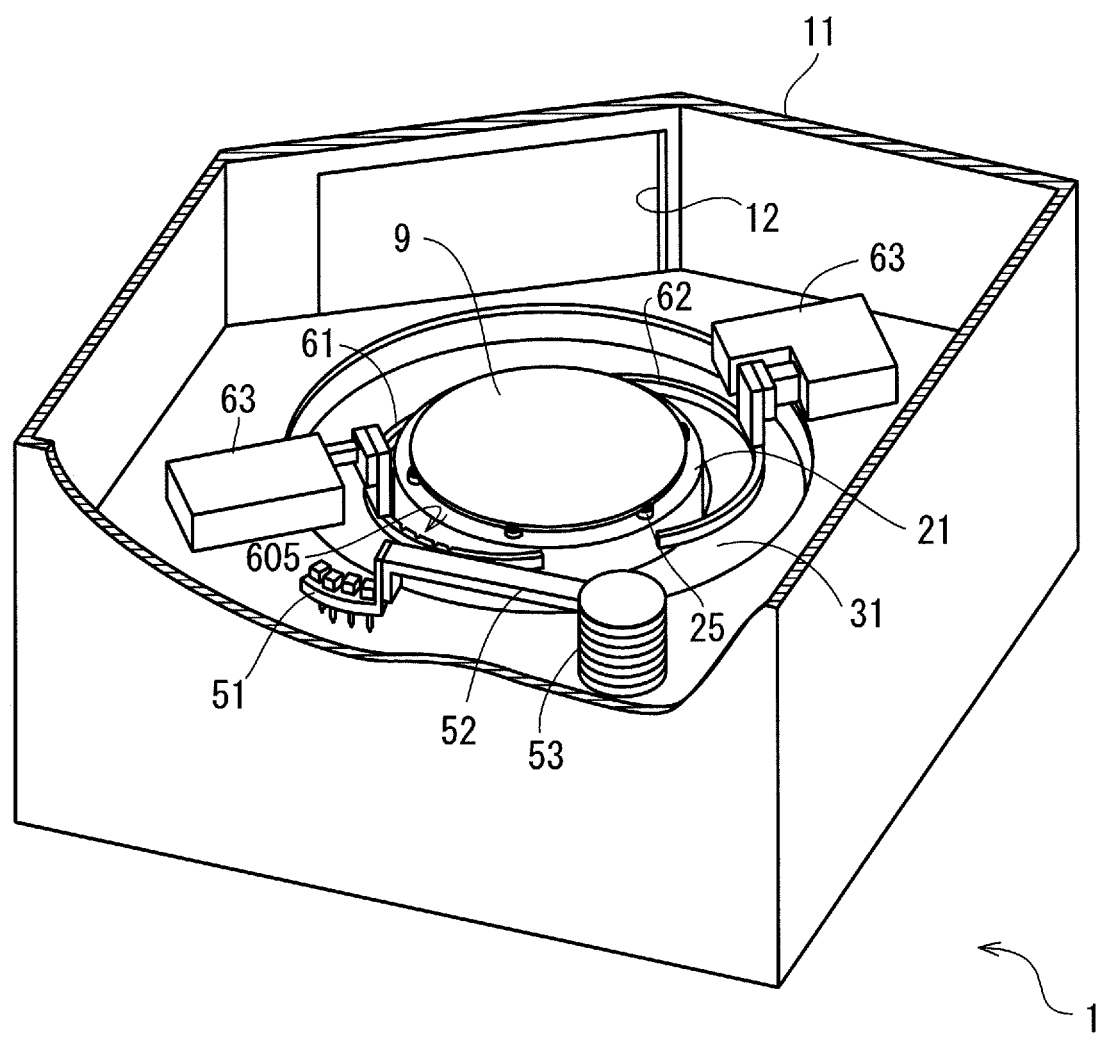

The following describes preferred embodiments by referring to the drawings. The preferred embodiments described below are examples of an embodiment of the present invention and are not intended to limit the technical scope of the present invention. In order to facilitate understanding, in each drawing referred to in the following description, the dimension of each part or the number of parts of each structure may be exaggerated or simplified.

First Preferred Embodiment

<1. Substrate Processing System 100>
<1-1. Structure>

The structure of a substrate processing system 100 is described below by referring to FIG. 1. FIG. 1 is a diagrammatic plan view schematically showing the substrate processing system 100.

The substrate processing system 100 is a system to successively process multiple substrates 9 one by one. In the below, a substrate 9 to be processed in the substrate processing system 100 is a circular semiconductor wafer, for example.

The substrate processing system 100 includes multiple cells (processing blocks) (more specifically, indexer cell 110 and processing cell 120) arranged in juxtaposition, and a controller 130 to control each operating mechanism and the like of the cells 110 and 120.

<Indexer Cell 110>

The indexer cell 110 is a cell to transfer an unprocessed substrate 9 received from outside the system to the processing cell 120 and to transport a processed substrate 9 received from the processing cell 120 to the outside of the system. The indexer cell 110 includes carrier stages 111 on which multiple carriers C are placed, and a substrate transport unit (transfer robot) IR to carry the substrate 9 into and out of each carrier C.

The carrier C housing unprocessed substrates 9 is transported from the outside of the system for example by an OHT (overhead hoist transfer) into the system and then placed on the carrier stage 111. The unprocessed substrates 9 are taken out of the carrier C one by one and processed inside the system. The substrates 9 after being processed by the system are housed in the carrier C again. The carrier C housing the processed substrates 9 are transported to the outside of the system by the OHT, for example. In this way, the carrier stage 111 functions as a substrate collecting unit to collect unprocessed substrates 9 and processed substrates 9. The carrier C can be an FOUP (front opening unified pod) housing substrates 9 in hermetically-sealed space, an SMIF (standard mechanical interface) pod, or an OC (open cassette) to expose substrates 9 housed in the carrier C to external air.

The transfer robot IR includes a hand 112 to hold the substrate 9 in a horizontal posture (posture that places a main surface of the substrate 9 in a horizontal posture) by supporting the substrate 9 from below, and a hand drive mechanism 113 to drive the hand 112. The transfer robot IR takes an unprocessed substrate 9 out of the carrier C placed on the carrier stage 111, and transfers this substrate 9 in a substrate transfer position P to a transport robot CR (described later). The transfer robot IR receives a processed substrate 9 in the substrate transfer position P from the transport robot CR, and houses this substrate 9 into the carrier C placed on the carrier stage 111.

<Processing Cell 120>

The processing cell 120 is a cell to process the substrate 9. The processing cell 120 includes multiple substrate processing apparatuses 1, and a substrate transport unit (transport robot CR) to carrier the substrate 9 into and out of the substrate processing apparatuses 1. Here, multiple (such as three) substrate processing apparatuses 1 are stacked in the vertical direction to form one substrate processing apparatus group 10. Multiple (in the example of FIG. 1, four) substrate processing apparatus groups 10 are arranged in a cluster pattern (tufted pattern) so as to surround the transport robot CR.

Each of the substrate processing apparatuses 1 has a casing 11 inside that forms processing space. The casing 11 is given a gateway 12 through which a hand 121 of the transport robot CR is inserted into the casing 11. The substrate processing apparatuses 1 are arranged such that their gateways 12 face space where the transport robot CR is placed. The specific structure of the substrate processing apparatuses 1 is described later.

The transport robot CR includes a hand 121 to hold the substrate 9 in a horizontal posture by supporting the substrate 9 from below, and a hand drive mechanism 122 to drive the hand 121. As described above, the transport robot CR (more specifically, a base of the transport robot CR) is placed in the center of the space surrounded by the substrate processing apparatus groups 10. The transport robot CR takes a processed substrate 9 out of a designated substrate processing apparatus 1, and transfers this substrate 9 in the substrate transfer position P to the transfer robot IR. The transport robot CR receives an unprocessed substrate 9 in the substrate transfer position P from the transfer robot IR, and transports this substrate 9 to a designated substrate processing apparatus 1.

<Controller 130>

The controller 130 controls each of the transfer robot IR, the transport robot CR, and the substrate processing apparatuses 1 in groups. The hardware structure of the controller 130 can be the same as that of a generally used computer. Specifically, the controller 130 for example includes a CPU to make various calculations, a ROM as a read-only memory to store a basic program, a RAM as a freely readable and writable memory to store information of various types, and a magnetic disk to store control software or data. In the controller 130, the CPU functioning as a main controller makes calculations according to a procedure written in a program, thereby realizing each functional unit to control each part of the substrate processing system 100. Some or all of the functional units realized by the controller 130 can be realized in terms of hardware by a dedicated logic circuit, for example.

<1-2. Operation>

The overall operation of the substrate processing system 100 is described below by further referring to FIG. 1. In the substrate processing system 100, the controller 130 controls each part of the substrate processing system 100 according to a recipe describing a procedure for transporting the substrate 9, a condition for processing the substrate 9 and the like, thereby executing a series of operations described below.

When the carrier C housing an unprocessed substrate 9 is placed on the carrier stage 111, the transfer robot IR takes the unprocessed substrate 9 out of this carrier C. Then, the transfer robot IR moves the hand 112 holding the unprocessed substrate 9 to the substrate transfer position P and transfers the unprocessed substrate 9 in the substrate transfer position P to the transport robot CR. The transport robot CR having received the unprocessed substrate 9 transferred onto the hand 121 transports the unprocessed substrate 9 into a substrate processing apparatus 1 designated in the recipe. Transfer of the substrate 9 between the transfer robot IR and the transport robot CR can be done directly between the hands 112 and 121 or through a placement unit provided in the substrate transfer position P, for example.

The substrate processing apparatus 1 having received the substrate 9 performs prescribed process on the substrate 9. A flow of the process performed in the substrate processing apparatus 1 is described later.

After the process on the substrate 9 is finished in the substrate processing apparatus 1, the transport robot CR takes the processed substrate 9 out of the substrate processing apparatus 1. Then, the transport robot CR moves the hand 121 holding the processed substrate 9 to the substrate transfer position P and transfers the processed substrate 9 in the substrate transfer position P to the transfer robot IR. The transfer robot IR having received the processed substrate 9 transferred onto the hand 112 houses the processed substrate 9 into the carrier C.

In the substrate processing system 100, the transport robot CR and the transfer robot IR perform the aforementioned transporting operation repeatedly according to the recipe and each substrate processing apparatus 1 processes the substrate 9 according to the recipe. As a result, the substrates 9 are processed one after another.

<2. Substrate 9>

The substrate 9 to be processed by the substrate processing apparatus 1 is described next by referring to FIG. 2. FIG. 2 is a sectional view showing a peripheral area and its vicinity of the substrate 9.

The substrate 9 to be processed by the substrate processing apparatus 1 has a three-layer structure including a center layer 901 made for example of silicon (Si), an underlying film 902 outside the center layer 901, and an overlying film 903 outside the underlying film 902. The underlying film 902 is a thermally-oxidized film (Th—$SiO_2$) or a dielectric film (such as an Hf (hafnium) film or an Hf oxide film), for example. The overlying film 903 is a barrier metal film (such as a TiN film or a TaN film) or a metal film (such as an Al film, a W film, an NiSi film or a Cu film). The substrate 9 to be processed by the substrate processing apparatuses 1 may also have a two-layer structure including the center layer 901 and the underlying film 902, or a structure with four layers or more.

In the below, a main surface of the substrate 9 on which a device pattern is to be formed is called a "front surface 91," and a surface opposite the front surface 91 is called a "back surface 92." A region of the front surface 91 where the device pattern is to be formed is called a "device region 90." A peripheral area of the front surface 91 outside the device region 90 (more specifically, this peripheral area is an annular region of a minute width d (d=0.5 mm to 3.0 mm (millimeters), for example) extending from an end face 93 of the substrate 9) is called a "front surface peripheral area 911." An annular region of the minute width d extending from an end face 93 of the back surface 92 is called a "back surface peripheral area 921."

The substrate processing apparatus 1 is to process the substrate 9 of the aforementioned multilayer structure and can process the front surface peripheral area 911 and the back surface 92 of the substrate 9 (such as removal of a thin film formed on the front surface peripheral area 911 and the back surface 92, for example).

<3. Structure of Substrate Processing Apparatus 1>

Figure 5:
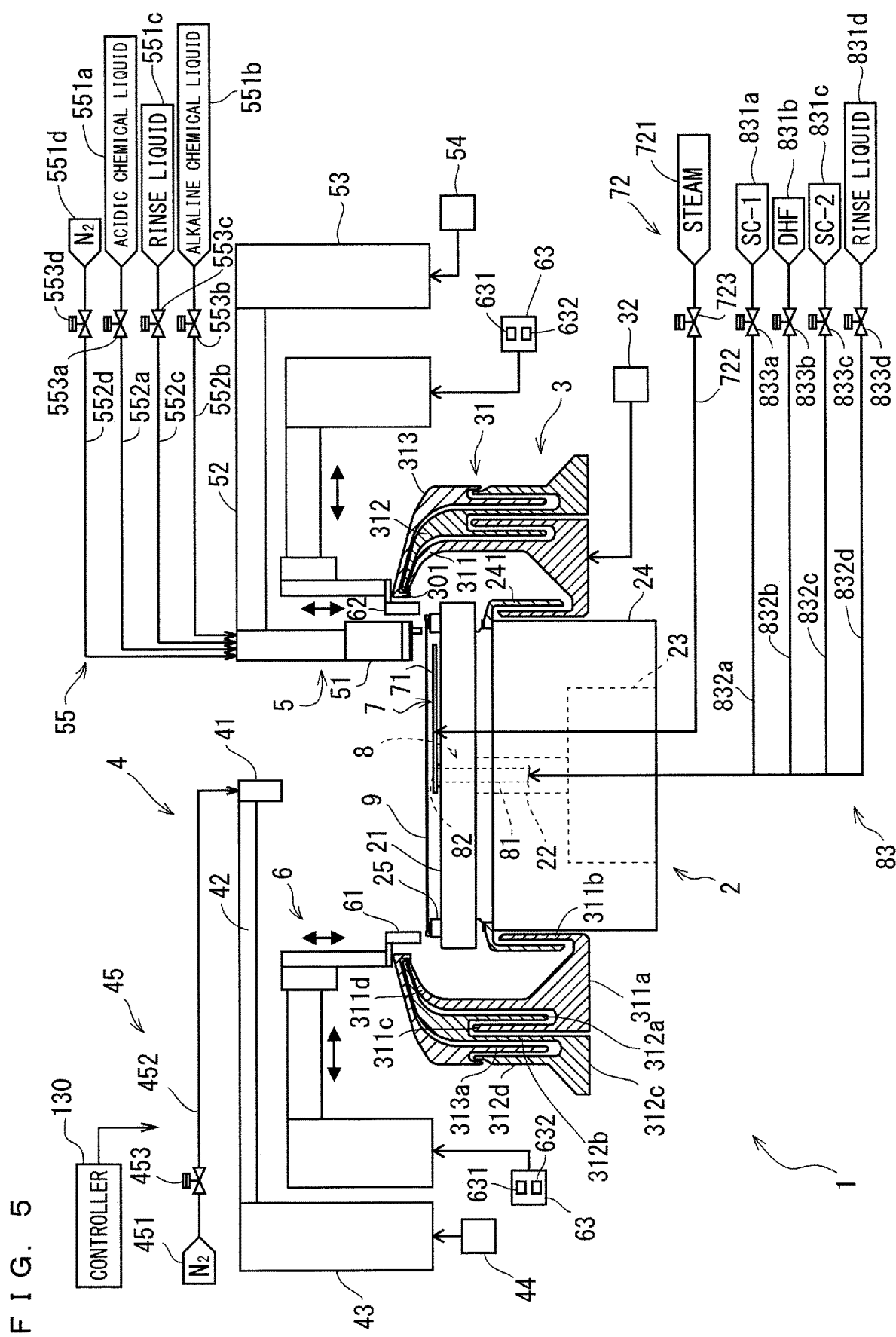
FIG. 5 is a schematic view describing the structure of the substrate processing apparatus.

The following describes the structure of the substrate processing apparatus 1 by referring to FIGS. 3 to 5. FIG. 3 is a diagrammatic perspective view of the substrate processing apparatus 1 showing a condition where semicircular members 61 and 62 forming a guard member 60, a cup 31, and a discharge head 51 for peripheral area are placed in their respective retreat positions. FIG. 4 is also a diagrammatic perspective view of the substrate processing apparatus 1 showing a condition where the guard member 60, the cup 31, and the discharge head 51 are placed in their respective processing positions. FIG. 5 is a schematic view describing the structure of the substrate processing apparatus 1.

In the following description, a "processing liquid" includes a "chemical liquid" used in chemical liquid process, and a "rinse liquid" used in rinsing process performed to wash out the chemical liquid.

The substrate processing apparatus 1 includes a spin chuck 2, an anti-splash unit 3, a front surface protecting unit 4, a peripheral processing unit 5, a liquid bounce suppressing unit 6, a heat processing unit 7, and a back surface processing unit 8. Each of these units 2 to 8 is electrically connected to the controller 130 and operates in response to an order from the controller 130.

<Spin Chuck 2>

The spin chuck 2 is a substrate holder to hold the substrate 9 in a substantially horizontal posture while pointing the front surface 91 of the substrate 9 upward. The spin chuck 2 rotates the substrate 9 about a vertical rotary axis passing through the center of the front surface 91 of the substrate 9.

The spin chuck 2 includes a spin base 21 that is a circular plate member slightly larger than the substrate 9. A rotary shaft part 22 is coupled to a lower surface central area of the spin base 21. The rotary shaft part 22 is placed in a posture that makes the shaft line of the rotary shaft part 22 extend in the vertical direction. The rotary shaft part 22 is connected to a rotary drive part (such as a motor) 23 to rotate the rotary shaft part 22 about the shaft line of the rotary shaft part 22. The rotary shaft part 22 and the rotary drive part 23 are housed in a tubular casing 24. Appropriately spaced multiple (such as six) holding members 25 are provided on a peripheral area and its vicinity of the upper surface of the spin base 21. The holding members 25 make abutting contact with the end face 93 of the substrate 9 to determine the position of the substrate 9 in the horizontal direction while holding the substrate 9 in a substantially horizontal posture in a position slightly higher than the upper surface of the spin base 21 (specifically, in a position spaced by a given distance from the upper surface of the spin base 21).

In this structure, the rotary drive part 23 rotates the rotary shaft part 22 while the holding members 25 hold the substrate 9 above the spin base 21. This rotates the spin base 21 about a shaft center extending in the vertical direction, thereby rotating the substrate 9 held on the spin base 21 about the vertical rotary axis passing through the center of the plane of the substrate 9.

The holding members 25 and the rotary drive part 23 are electrically connected to the controller 130 and operate under control by the controller 130. Specifically, the controller 130 controls timing of holding the substrate 9 onto the spin base 21, timing of releasing the substrate 9, and a mode of rotation of the spin base 21 (more specifically, timing of starting rotation, timing of finishing the rotation, and the frequency of rotation (specifically, a rotation speed), for example).

<Anti-Splash Unit 3>

The anti-splash unit 3 receives a processing liquid and the like splashed from a rotated substrate 9 held on the spin base 21.

The anti-splash unit 3 includes the cup 31. The cup 31 is a tubular member with an open top end. The cup 31 is provided so as to surround the spin chuck 2. In the first preferred embodiment, the cup 31 is composed for example of three members including an inner member 311, an intermediate member 312, and an outer member 313.

The inner member 311 is a tubular member with an open top end. The inner member 311 has a bottom part 311a of a circular ring shape, a circularly cylindrical inner wall part 311b extending upward from an inner edge portion of the bottom part 311a, a circularly cylindrical outer wall part 311c extending upward from an outer edge portion of the bottom part 311a, and a circularly cylindrical guide wall 311d standing upright between the inner and outer wall parts 311b and 311c. The guide wall 311d extends upward from the bottom part 311a. The guide wall 311d curves inward and upward at an upper end portion and its vicinity. The inner wall part 311b is housed, at least at its tip and the vicinity thereof, in internal space defined by a flange member 241 of the casing 24 of the spin chuck 2.

The bottom part 311a is provided with a drain groove (not shown in the drawings) that makes communication with space between the inner wall part 311b and the guide wall 311d. This drain groove is connected to a drain line of a factory. This drain groove is connected to an evacuation and drain mechanism to exhaust air compulsorily out of the inside of the drain groove to place the space between the inner wall part 311b and the guide wall 311d in a negative pressure. The space between the inner wall part 311b and the guide wall 311d is space where a processing liquid having been used for processing the substrate 9 is gathered for drainage. The processing liquid gathered in this space is drained out of the drain groove.

The bottom part 311a is further provided with a first collection groove (not shown in the drawings) that makes communication with space between the guide wall 311d and the outer wall part 311c. The first collection groove is connected to a first collection tank. The first collection groove is connected to an evacuation and drain mechanism to exhaust air compulsorily out of the inside of the first collection groove to place the space between the guide wall 311d and the outer wall part 311c in a negative pressure. The space between the guide wall 311d and the outer wall part 311c is space where a processing liquid having been used for processing the substrate 9 is gathered for collection. The processing liquid gathered in this space passes through the first collection groove to be collected in the first collection tank.

The intermediate member 312 is a tubular member with an open top end and is arranged outside the guide wall 311d of the inner member 311. The intermediate member 312 curves inward and upward at an upper portion. The intermediate member 312 has a top edge portion bent so as to extend along a top edge portion of the guide wall 311d. The intermediate member 312 has an inner circumferential wall part 312a extending downward along an inner circumferential surface and an outer circumferential wall part 312b extending downward along an outer circumferential surface that are formed at a lower portion of the intermediate member 312. In a condition where the inner and intermediate members 311 and 312 are close to each other (condition of FIG. 5), the inner circumferential wall part 312a is housed between the guide wall 311d and the outer wall part 311c of the inner member 311. The lower end of the outer circumferential wall part 312b is attached to an inner edge portion of a bottom part 312c of a circular ring shape. A circularly cylindrical outer wall part 312d stands upward from an outer edge portion of the bottom part 312c.

The bottom part 312c is provided with a second collection groove (not shown in the drawings) that makes communication with space between the outer circumferential wall part 312b and the outer wall part 312d. The second collection groove is connected to a second collection tank. The second collection groove is connected to an evacuation and drain mechanism to exhaust air compulsorily out of the inside of the second collection groove to place the space between the outer circumferential wall part 312b and the outer wall part 312d in a negative pressure. The space between the outer circumferential wall part 312b and the outer wall part 312d is space where a processing liquid having been used for processing the substrate 9 is gathered for collection. The processing liquid gathered in this space passes through the second collection groove to be collected in the second collection tank.

The outer member 313 is a tubular member with an open top end and is arranged outside the intermediate member 312. The outer member 313 curves inward and upward at an upper portion. The outer member 313 has a top edge portion 301 that is bent downward in a position slightly inside the respective top edge portions of the intermediate and inner members 312 and 311. In a condition where the inner, intermediate, and outer members 311, 312, and 313 are close to each other (condition of FIG. 5), the respective top edge portions of the intermediate and inner members 312 and 311 are covered by the bent portion of the outer member 313.

The outer member 313 has a lower portion provided with an inner circumferential wall part 313a extending downward along an inner circumferential surface. In a condition where the intermediate and outer members 312 and 313 are close to each other (condition of FIG. 5), the inner circumferential wall part 313a is housed between the outer circumferential wall part 312b and the outer wall part 312d of the intermediate member 312.

The cup 31 is provided with a cup drive mechanism 32 to move the cup 31 up and down. The cup drive mechanism 32 is composed for example of a stepping motor. In the first preferred embodiment, the cup drive mechanism 32 moves the three members 311, 312, and 313 of the cup 31 up and down independently.

Each of the inner, intermediate, and outer members 311, 312 and 313 is moved between an upper position and a lower position in response to drive by the cup drive mechanism 32. The respective upper positions of the members 311, 312 and 313 are positions that place respective top edge portions of the members 311, 312 and 313 lateral to the substrate 9 held on the spin base 21. The respective lower positions of the members 311, 312 and 313 are positions that place respective top edge portions of the members 311, 312, and 313 below the upper surface of the spin base 21. The cup drive mechanism 32 is electrically connected to the controller 130 and operates under control by the controller 130. Specifically, the position of the cup 31 (more specifically, the respective positions of the inner, intermediate, and outer members 311, 312, and 313) is controlled by the controller 130.

In the below, "the cup 31 being placed in a retreat position" means a condition where the outer member 313 is placed in its lower position (specifically, a condition where all the inner, intermediate, and outer members 311, 312, and 313 are placed in their lower positions). Where the substrate 9 is not held on the spin base 21, the cup 31 is placed in the retreat position. Specifically, where the substrate 9 is not held on the spin base 21, the cup 31 is in a position that places the top edge portion of the cup 31 (specifically, the top edge portion 301 of the outer member 313) below the upper surface of the spin base 21.

In the below, "the cup 31 being placed in a processing position" means a condition where the outer member 313 is placed in its upper position. The top edge portion of the cup 31 (specifically, the top edge portion 301 of the outer member 313) in the processing position is placed lateral to the substrate 9 held on the spin base 21. "The cup 31 being placed in the processing position" includes three conditions as follows. In a first condition, all the inner, intermediate, and outer members 311, 312, and 313 are placed in their upper positions (condition of FIG. 5). In this condition, a processing liquid splashed from the substrate 9 held by the spin chuck 2 is gathered in the space between the inner wall part 311b and the guide wall 311d of the inner member 311 and is then drained out of the drain groove. In a second condition, the inner member 311 is placed in its lower position whereas the intermediate and outer members 312 and 313 are placed in their upper positions. In this condition, a processing liquid splashed from the substrate 9 held by the spin chuck 2 is gathered in the space between the guide wall 311d and the outer wall part 311c of the inner member 311 and is then collected in the first collection tank. In a third condition, the inner and intermediate members 311 and 312 are placed in their lower positions whereas the outer member 313 is placed in its upper position. In this condition, a processing liquid splashed from the substrate 9 held by the spin chuck 2 is gathered in the space between the outer circumferential wall part 312b and the outer wall part 312d of the intermediate member 312 and is then collected in the second collection tank.

<Front Surface Protecting Unit 4>

The front surface protecting unit 4 supplies gas (cover gas) to the center and its vicinity of the front surface 91 of the substrate 9 held on the spin base 21, thereby protecting the device region 90 from the atmosphere of a processing liquid supplied to the front surface peripheral area 911, for example.

The front surface protecting unit 4 includes a cover gas nozzle 41 from which gas is discharged toward the center and its vicinity of the front surface 91 of the substrate 9 held on the spin base 21. The cover gas nozzle 41 is attached to a tip portion of a horizontally extending arm 42. A base end portion of the arm 42 is coupled to a nozzle base 43. The nozzle base 43 is placed in a posture that makes the axis line of the nozzle base 43 extend in the vertical direction. The base end portion of the arm 42 is coupled to the upper end of the nozzle base 43.

The nozzle base 43 is provided with a drive unit 44 to drive the cover gas nozzle 41. The drive unit 44 is composed for example of a rotation drive part (such as a servomotor) to rotate the nozzle base 43 about the axis line of the nozzle base 43, and an up-and-down drive part (such as a stepping motor) to expand and contract the nozzle base 43 along the axis line of the nozzle base 43. In response to rotation of the nozzle base 43 by the drive unit 44, the cover gas nozzle 41 moves along an arcuate orbit in a horizontal plane. In response to expansion or contraction of the nozzle base 43 by the drive unit 44, the cover gas nozzle 41 moves in a direction where the cover gas nozzle 41 gets closer to or farther from the substrate 9.

In response to drive by the drive unit 44, the cover gas nozzle 41 moves between a processing position and a retreat position. The processing position of the cover gas nozzle 41 mentioned herein is a position above the substrate 9 held on the spin base 21 that makes the cover gas nozzle 41 face the center and its vicinity of the front surface 91 while placing the cover gas nozzle 41 close to the front surface 91 in a noncontact manner. The retreat position of the cover gas nozzle 41 is a position that does not interfere with a transport path for the substrate 9 which is outside the top edge portion 301 of the cup 31 as viewed from above, for example. The drive unit 44 is electrically connected to the controller 130 and operates under control by the controller 130. Specifically, the position of the cover gas nozzle 41 is controlled by the controller 130.

The cover gas nozzle 41 is connected to a cover gas supplier 45 that is a pipe system to supply gas (nitrogen ($N_2$) gas is supplied here, for example) to the cover gas nozzle 41. As an example, the specific structure of the cover gas supplier 45 includes a nitrogen gas source 451 as a source for nitrogen gas that is connected to the cover gas nozzle 41 through a pipe 452 in which an open-close valve 453 is interposed. In this structure, opening the open-close valve 453 discharges nitrogen gas from the cover gas nozzle 41 supplied from the nitrogen gas source 451. Gas to be supplied to the cover gas nozzle 41 can be different from nitrogen gas (such as inert gases of various types except nitrogen gas or dry air).

If gas is supplied from the cover gas supplier 45 to the cover gas nozzle 41 placed in the processing position, gas (cover gas) is discharged from the cover gas nozzle 41 toward the center and its vicinity of the front surface 91 of the substrate 9 held on the spin base 21. The open-close valve 453 of the cover gas supplier 45 is electrically connected to the controller 130 and is opened and closed under control by the controller 130. Specifically, a mode of discharge of gas from the cover gas nozzle 41 (more specifically, timing of starting discharge, timing of finishing the discharge, and discharge flow rate, for example) is controlled by the controller 130.

<Peripheral Processing Unit 5>

The peripheral processing unit 5 is to process the front surface peripheral area 911 of the substrate 9 held on the spin base 21.

<i. Overall Structure>

The peripheral processing unit 5 includes the discharge head 51 from which a fluid is discharged (here, processing liquid and gas) toward the front surface peripheral area 911 of the substrate 9 held on the spin base 21. The discharge head 51 is attached to a tip portion of a horizontally extending arm 52. A base end portion of the arm 52 is coupled to a nozzle base 53. The nozzle base 53 is placed in a posture that makes the axis line of the nozzle base 53 extend in the vertical direction. The base end portion of the arm 52 is coupled to the upper end of the nozzle base 53.

The nozzle base 53 is provided with a drive unit 54 to drive the discharge head 51. The drive unit 54 is composed for example of a rotation drive part (such as a servomotor) to rotate the nozzle base 53 about the axis line of the nozzle base 53, and an up-and-down drive part (such as a stepping motor) to expand and contract the nozzle base 53 along the axis line of the nozzle base 53. In response to rotation of the nozzle base 53 by the drive unit 54, the discharge head 51 moves along an arcuate orbit in a horizontal plane. In response to expansion or contraction of the nozzle base 53 by the drive unit 54, the discharge head 51 moves in a direction where the discharge head 51 gets closer to or farther from the substrate 9.

In response to drive by the drive unit 54, the discharge head 51 moves between a processing position and a retreat position. The processing position of the discharge head 51 mentioned herein is a position (position of FIG. 4) above the substrate 9 held on the spin base 21 that makes the discharge head 51 face the front surface peripheral area 911 while placing the discharge head 51 close to the front surface peripheral area 911 in a noncontact manner. While the discharge head 51 is placed in the processing position, at least part of the discharge head 51 is housed in a cut 605 formed in an inner circumferential wall 601 of the guard member 60 described later. The retreat position of the discharge head 51 is a position (position of FIG. 3) that does not interfere with the transport path for the substrate 9 which is outside the top edge portion 301 of the cup 31 as viewed from above, for example. The drive unit 54 is electrically connected to the controller 130 and operates under control by the controller 130. Specifically, the position of the discharge head 51 is controlled by the controller 130.

The discharge head 51 is connected to a fluid supplier 55 that is a pipe system to supply a fluid (more specifically, processing liquid and gas) to the discharge head 51. More specifically, the fluid supplier 55 is formed by combining for example an acidic chemical liquid source 551a, an alkaline chemical liquid source 551b, a rinse liquid source 551c, a nitrogen gas source 551d, multiple pipes 552a, 552b, 552c and 552d, and multiple open-close valves 553a, 553b, 553c and 553d.

The acidic chemical liquid source 551a is a source to supply an acidic chemical liquid. As an example, the acidic chemical liquid source 551a mentioned herein can selectively supply diluted hydrofluoric acid (hereinafter called "DHF") and hydrochloric acid-hydrogen peroxide-water (chemical liquid hereinafter called "SC-2" containing hydrochloric acid (HCl), hydrogen peroxide ($H_2O_2$), and pure water (DIW: deionized water) mixed in a prescribed ratio). The acidic chemical liquid source 551a is connected to the discharge head 51 (more specifically, to a "first chemical liquid nozzle 50a" described later) through a pipe 552a in which an open-close valve 553a is interposed. Accordingly, opening the open-close valve 553a discharges an acidic chemical liquid (DHF or SC-2) from the first chemical liquid nozzle 50a supplied from the acidic chemical liquid source 551a. The acidic chemical liquid source 551a does not always supply DHF and SC-2 selectively. As an example, the acidic chemical liquid source 551a may supply at least one of DHF, SC-2, BDHF (buffered hydrofluoric acid), HF (hydrofluoric acid), hydrochloric acid, sulfuric acid, nitric acid, phosphoric acid, acetic acid, oxalic acid, and mixed solutions thereof, for example.

The alkaline chemical liquid source 551b is a source to supply an alkaline chemical liquid. As an example, the alkaline chemical liquid source 551b mentioned herein can supply ammonia-hydrogen peroxide-water (chemical liquid hereinafter called "SC-1" containing ammonium hydroxide ($NH_4OH$), hydrogen peroxide ($H_2O_2$), and pure water mixed in a prescribed ratio). The alkaline chemical liquid source 551b is connected to the discharge head 51 (more specifically, to a "second chemical liquid nozzle 50b" described later) through a pipe 552b in which an open-close valve 553b is interposed. Accordingly, opening the open-close valve 553b discharges an alkaline chemical liquid (SC-1) from the second chemical liquid nozzle 50b supplied from the alkaline chemical liquid source 551b. It is preferable that SC-1 to be supplied from the alkaline chemical liquid source 551b be controlled in temperature to fall in a range of from 60° C. to 80° C., for example. The alkaline chemical liquid source 551b may supply a chemical liquid (such as ammonia aqueous solution) other than SC-1.

The rinse liquid source 551c is a source to supply a rinse liquid. The rinse liquid source 551c mentioned herein supplies for example pure water (carbonated water) as a rinse liquid containing dissolved carbon dioxide ($CO_2$). The rinse liquid source 551c is connected to the discharge head 51 (more specifically, to a "rinse liquid nozzle 50c" described later) through a pipe 552c in which an open-close valve 553c is interposed. Accordingly, opening the open-close valve 553c discharges a rinse liquid from the rinse liquid nozzle 50c supplied from the rinse liquid source 551c. A rinse liquid to be used can be pure water, warm water, ozone water, magnetic water, regenerated water (hydrogen water), various organic solvents, ionized water, IPA (isopropyl alcohol) and functional water, for example.

The nitrogen gas source 551d is a source to supply gas (nitrogen ($N_2$) gas is supplied here, for example). The nitrogen gas source 551d is connected to the discharge head 51 (more specifically, to a "gas nozzle 50d" described later) through a pipe 552d in which an open-close valve 553d is interposed. Accordingly, opening the open-close valve 553d discharges nitrogen gas from the gas nozzle 50d supplied from the nitrogen gas source 551d. The nitrogen gas source 551d may supply gas other than nitrogen gas (such as inert gases of various types other than nitrogen gas or dry air).

When a processing liquid (acidic chemical liquid (DHF or SC-2), alkaline chemical liquid (SC-1), or rinse liquid) is supplied from the fluid supplier 55 to the discharge head 51 placed in the processing position, the processing liquid is discharged from the discharge head 51 toward the front surface peripheral area 911 of the substrate 9 held on the spin base 21. If gas is supplied from the fluid supplier 55 to the discharge head 51 placed in the processing position, the gas is discharged from the discharge head 51 toward the front surface peripheral area 911 of the substrate 9 held on the spin base 21. The open-close valves 553a, 553b, 553c and 553d of the fluid supplier 55 are each electrically connected to the controller 130 and are opened and closed under control by the controller 130. Specifically, a mode of discharge of a fluid from the discharge head 51 (more specifically, type of fluid to be discharged, timing of starting discharge, timing of finishing the discharge, and discharge flow rate, for example) is controlled by the controller 130.

<ii. Discharge Head 51 for Peripheral Area>

Figure 6:
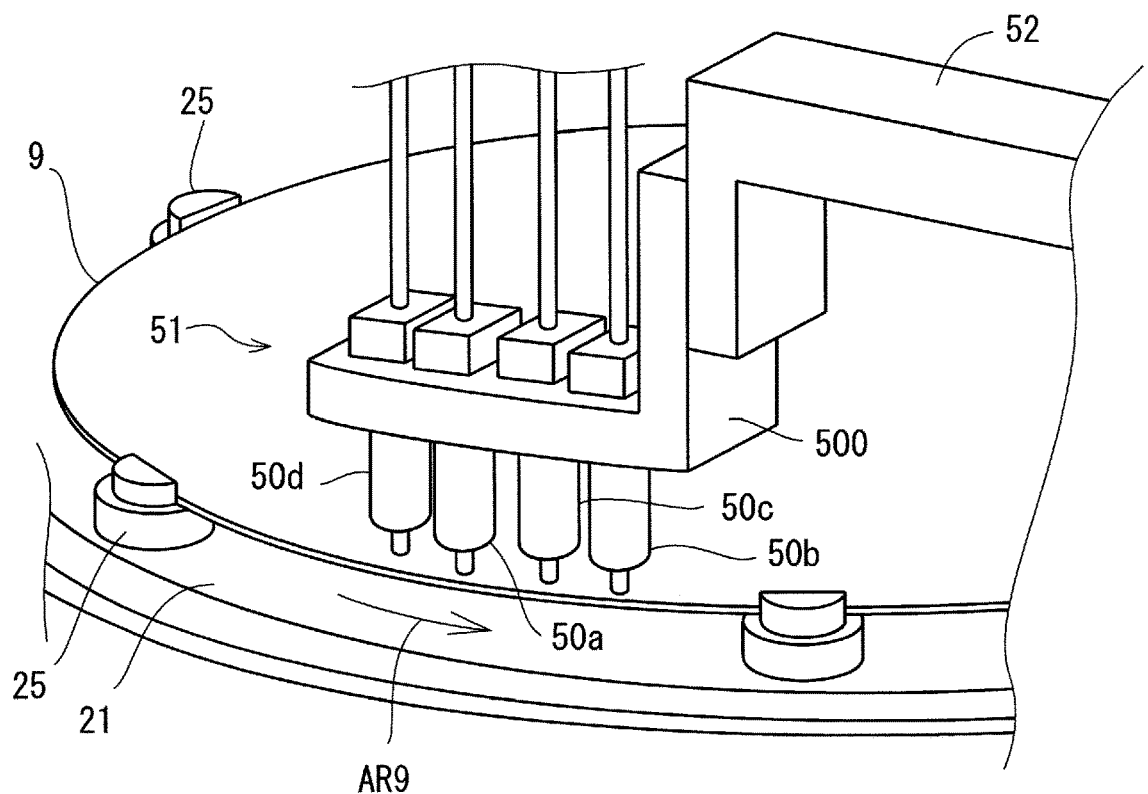
FIG. 6 is a perspective view of a discharge head for peripheral area.

The discharge head 51 is described in more detail by referring to FIG. 6. FIG. 6 is a perspective view of the discharge head 51. For the convenience of description, the guard member 60 and the cup 31 are omitted from FIG. 6.

The discharge head 51 includes the multiple (here, four) nozzles 50a to 50d, and a support part 500 that supports the nozzles 50a to 50d integrally.

The nozzles 50a to 50d in a group of the discharge head 51 include one or more (here, three) nozzles (hereinafter also called "processing liquid nozzles") 50a, 50b and 50c from which processing liquids are discharged toward the front surface peripheral area 911, and the nozzle (hereinafter also called "gas nozzle") 50d from which gas (here, nitrogen gas) is discharged toward the front surface peripheral area 911. In particular, the processing liquid nozzles 50a, 50b and 50c of the discharge head 51 include two nozzles (hereinafter also called "chemical liquid nozzles") 50a and 50b from which chemical liquids are discharged, and the nozzle (hereinafter also called a "rinse liquid nozzle") 50c from which a rinse liquid is discharged. More particularly, the chemical liquid nozzles 50a and 50b of the discharge head 51 include the nozzle (hereinafter also called a "first chemical liquid nozzle") 50a from which an acidic chemical liquid is discharged, and the nozzle (hereinafter also called a "second chemical liquid nozzle") 50b from which an alkaline chemical liquid is discharged.

The support part 500 that supports the nozzles 50a to 50d in a group integrally is fixed to the aforementioned arm 52. The support part 500 is a member curving in a arcuate pattern extending along the front surface peripheral area 911 as viewed from above. The nozzles 50a to 50d in a group are arranged in a direction where the support part 500 curving in an arcuate pattern extends. Accordingly, while the discharge head 51 is placed in the processing position, the nozzles 50a to 50d in a group are aligned along the front surface peripheral area 911 of the substrate 9. The gas nozzle 50d, the first chemical liquid nozzle 50a, the rinse liquid nozzle 50c, and the second chemical liquid nozzle 50b are arranged in a rotative direction AR9 of the substrate 9 in the order named as viewed from an upstream side of the rotative direction AR9.

Specifically, in the discharge head 51, the gas nozzle 50d is placed upstream of the rotative direction AR9 of the substrate 9 relative to the processing liquid nozzles 50a, 50b and 50c. Thus, in the substrate 9 to be rotated, each position within the front surface peripheral area 911 of the substrate 9 first passes through a place below the gas nozzle 50d and then passes through places below the processing liquid nozzles 50a, 50b and 50c. In this structure, before being supplied with a new processing liquid from the processing liquid nozzle 50a, 50b or 50c, each position within the front surface peripheral area 911 of the rotated substrate 9 can be supplied with gas from the gas nozzle 50d (specifically, gas can be sprayed onto this position).

According to a surface condition of the substrate 9, for example, a processing liquid having been supplied from the processing liquid nozzle 50a, 50b or 50c before one rotation of the substrate 9 and not having been shaken off during this rotation may adhere to each position within the front surface peripheral area 911 having reached a place below the discharge head 51. In this case, such an old processing liquid can be removed with gas discharged from the gas nozzle 50d and then new processing liquids can be supplied from the processing liquid nozzles 50a, 50b and 50c. This structure makes the occurrence of a situation unlikely where a processing liquid newly supplied to each position within the front surface peripheral area 911 collides with an old processing liquid to bounce. This suppresses entry of a processing liquid into the device region 90. Further, this structure allows the substrate 9 to be always acted on by a fresh processing liquid, thereby enhancing processing efficiency. It is assumed that a new processing liquid is supplied further to a place where an old chemical liquid remains unremoved. In this case, the processing liquid might temporarily remain in large amount in this place. In contrast, the structure of removing an old chemical liquid with gas and then supplying a new processing liquid makes the occurrence of a situation unlikely where a processing liquid temporarily remains in large amount in each position within the front surface peripheral area 911. This can stabilize the dimension of a region to be acted on by a processing liquid. As an example, this can stabilize the dimension of a region to be acted on by a chemical liquid for etching, specifically a width between the end face 93 and a place inside the substrate 9 to be removed by etching (hereinafter simply called an "etching width"), so that the etching width can be controlled with a higher degree of accuracy.

From a different viewpoint, in the discharge head 51, the processing liquid nozzles 50a, 50b and 50c are placed downstream of the rotative direction AR9 of the substrate 9 relative to the gas nozzle 50d. Thus, in the substrate 9 to be rotated, each position within the front surface peripheral area 911 of the substrate 9 passes through places below the processing liquid nozzles 50a, 50b and 50c and then reaches a place below the gas nozzle 50d after the substrate 9 is rotated substantially one turn. This structure makes at least some of the processing liquids supplied from the processing liquid nozzles 50a, 50b and 50c to each position within the front surface peripheral area 911 stay on the front surface peripheral area 911 while the substrate 9 is rotated substantially one turn. Thus, each position within the front surface peripheral area 911 can be acted on satisfactorily by a processing liquid.

In the discharge head 51, the rinse liquid nozzle 50c from which a rinse liquid is discharged is placed between the first chemical liquid nozzle 50a from which an acidic chemical liquid is discharged and the second chemical liquid nozzle 50b from which an alkaline chemical liquid is discharged. This structure can suppress the occurrence of a situation where an atmosphere generated during discharge of a chemical liquid from one of the chemical liquid nozzles reacts with a chemical liquid remaining inside of the other chemical liquid nozzle, for example. As a more specific example, this structure can suppress the occurrence of a situation where an atmosphere generated during discharge of an acidic chemical liquid from the first chemical liquid nozzle 50a reacts with an alkaline chemical liquid remaining inside of the second chemical liquid nozzle 50b, or an atmosphere generated during discharge of an alkaline chemical liquid from the second chemical liquid nozzle 50b reacts with an acidic chemical liquid remaining inside of the first chemical liquid nozzle 50a.

<iii. Nozzle 50>

Figure 7:
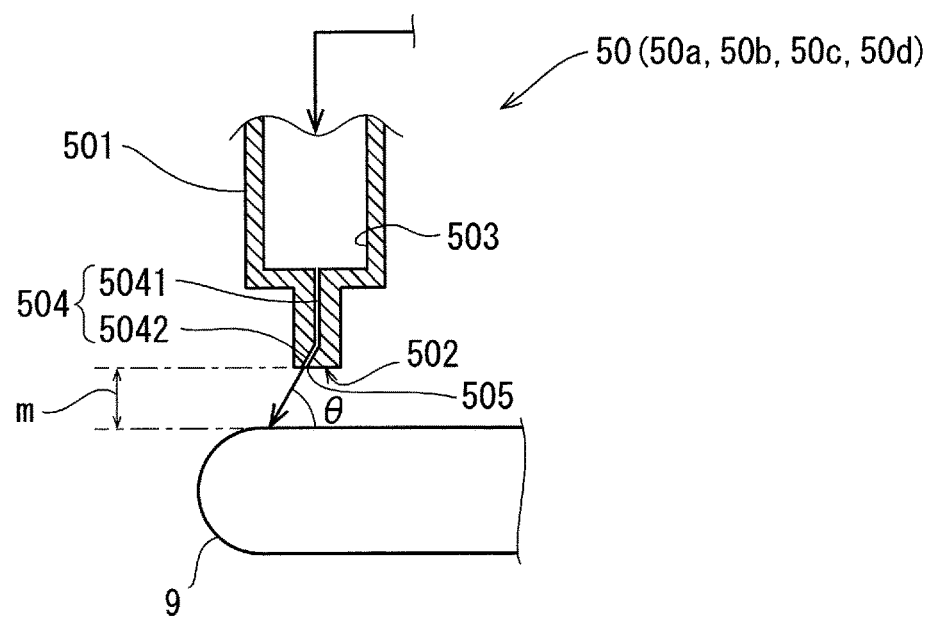
FIG. 7 is a side sectional view schematically showing the structure of the tip and its vicinity of a nozzle.

The following describes the structure of each of the nozzles 50a to 50d in a group of the discharge head 51 by referring to FIG. 7. The nozzles 50a to 50d in a group have substantially the same structure. In the below, where the nozzles 50a to 50d are not to be distinguished from each other, they may also be called a "nozzle 50" simply. FIG. 7 is a side sectional view schematically showing the structure of the tip and its vicinity of the nozzle 50.

The nozzle 50 includes a nozzle body 501 having an outer shape of an elongated bar with a narrowed lower end. The nozzle body 501 has an axis direction extending in the vertical direction. The nozzle body 501 is supported by the support part 500 such that a lower surface (hereinafter also called a "discharge surface") 502 of the nozzle body 501 is placed in a horizontal posture. Thus, while the discharge head 51 is in the processing position, the discharge surface 502 in a posture parallel to the front surface 91 of the substrate 9 held on the spin base 21 is placed to be close to the front surface peripheral area 911 in a noncontact manner. A distance m determined in this condition between the discharge surface 502 and the front surface peripheral area 911 is sufficiently small (distance m is about 1 mm, for example).

An introduction flow path 503 and a discharge flow path 504 communicating with the lower end of the introduction flow path 503 are formed inside the nozzle body 501. The upper end of the introduction flow path 503 is connected to one of the aforementioned pipes 552a, 552b, 552c and 552d. The lower end of the discharge flow path 504 communicates with an open discharge port 505 formed in the discharge surface 502. As an example, the discharge port 505 is a circular through hole having a diameter for example of 0.6 mm that is smaller than the minute width d extending from the end face 93 of the substrate 9 shown in FIG. 2. Thus, a fluid supplied from a pipe is first held in the introduction flow path 503. Then, the fluid flows into the discharge flow path 504 to be discharged from the discharge port 505.

The discharge flow path 504 is bent in the middle. More specifically, the discharge flow path 504 has a vertical flow path section 5041 and a tilted flow path section 5042 extending continuously from the vertical flow path section 5041. The vertical flow path section 5041 extends parallel to the axis direction of the nozzle body 501 to communicate with the tilted flow path section 5042 at a lower end of the vertical flow path section 5041. The tilted flow path section 5042 extends obliquely downward such that it gets farther in a lower position from an inner side of the substrate 9 (on the part of the center of the substrate 9) toward an outer side of the substrate 9 (on the part of the end face 93) to communicate with the discharge port 505 at a lower end of the tilted flow path section 5042.

In the nozzle 50, a fluid passes through the obliquely extending tilted flow path section 5042 and is then discharged from the discharge port 505. Thus, a fluid discharged from the nozzle 50 toward the front surface peripheral area 911 of the substrate 9 can be caused to flow toward the outside of the substrate 9 in the front surface peripheral area 911. This can suppress flow of a processing liquid into the device region 90 having been discharged from the nozzle 50 toward the front surface peripheral area 911, for example. This can also stabilize the dimension of a region to be acted on by this processing liquid (as an example, stabilize the dimension of a region to be acted on by a chemical liquid for etching, specifically an etching width), so that this dimension can be controlled with a higher degree of accuracy. Further, while gas is discharged from the nozzle 50 toward the front surface peripheral area 911, a gas flow traveling toward an outer side of the substrate 9 can be formed in the front surface peripheral area 911, for example. This gas flow can blow away a processing liquid or mist of the processing liquid on the front surface peripheral area 911 to the outer side of the substrate 9.

In particular, in the nozzle 50, the nozzle body 501 itself is not in a tilted posture while supported by the support part 500 but the tilted flow path section 5042 forming part of the discharge flow path 504 inside the nozzle body 501 is tilted. It is assumed that a flow path extending straight along the axis direction of a nozzle body is formed inside the nozzle body and the nozzle body itself is in a tilted posture to tilt a discharge surface relative to a horizontal plane. This might easily generate an accumulation of liquid near the lowest end of the discharge surface and this accumulation might drop onto the substrate 9 (dripping). Such dripping of a processing liquid is caused in a position on an inner side (on the part of the center of the substrate 9) relative to a position where the processing liquid is to be supplied originally, so that this processing liquid is hard to remove even with gas discharged from the gas nozzle 50d. In contrast, in the first preferred embodiment, not the nozzle body 501 but part of the discharge flow path 504 formed inside the nozzle body 501 is tilted. This structure can place the discharge surface 502 in a horizontal posture, making the aforementioned dripping of a processing liquid unlikely.

To control the width of a region to be acted on by a processing liquid (such as an etching width to be acted on by a chemical liquid for etching) with a higher degree of accuracy, it is preferable that an angle (angle of tilt) θ formed between a direction where the tilted flow path section 5042 extends and a horizontal plane be 45 degrees or more, more preferably, 60 degrees or more.

<iv. Target Discharge Position>

Figure 8:
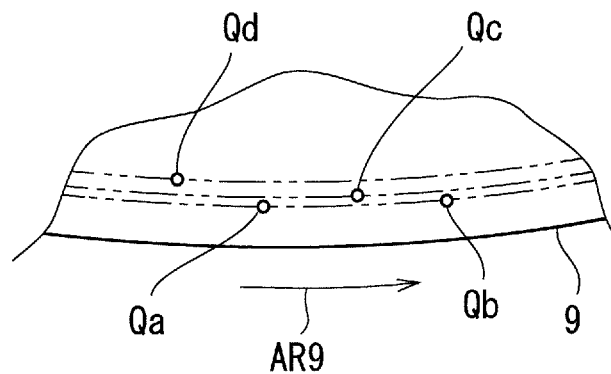
FIG. 8 schematically shows examples of target discharge positions of nozzles in a group of the discharge head for peripheral area.
Figure 9:
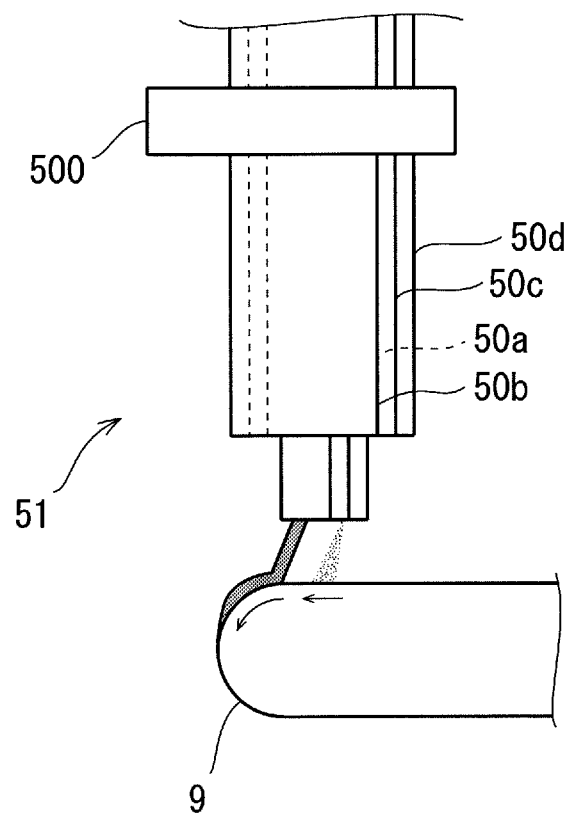
FIGS. 9 and 10 each show the discharge head for peripheral area as viewed from a downstream side of a rotative direction of a substrate.
Figure 10:
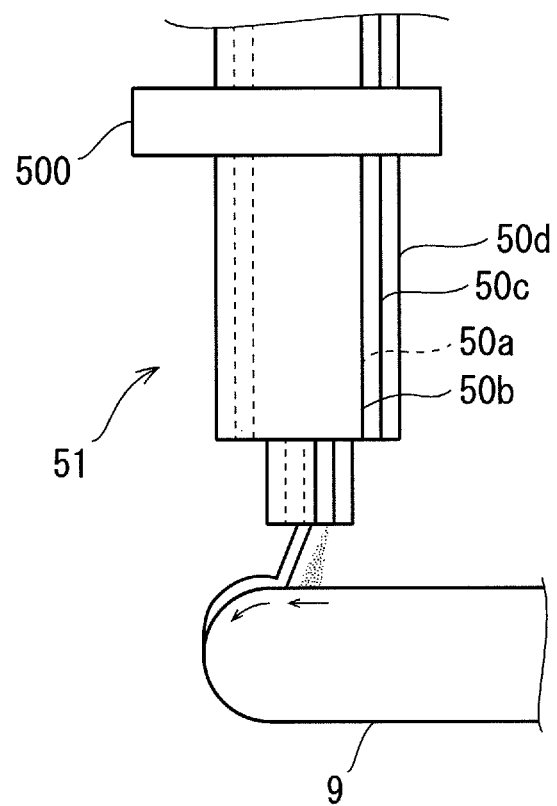

A position on the substrate 9 where a fluid discharged from each of the nozzles 50a to 50d in a group of the discharge head 51 is to reach is called a "target discharge position" of this nozzle. The following describes target discharge positions Qa to Qd of the nozzles 50a to 50d in a group respectively by referring to FIGS. 8 to 10. FIG. 8 schematically shows examples of target discharge positions of the nozzles 50a to 50d. FIGS. 9 and 10 show the discharge head 51 as viewed from a downstream side of the rotative direction AR9 of the substrate 9. FIG. 9 shows a condition where a chemical liquid and gas are discharged from the discharge head 51. FIG. 10 show a condition where a rinse liquid and gas are discharged from the discharge head 51.

The respective target discharge positions Qa to Qd of the nozzles 50a to 50d in a group of the discharge head 51 are shifted from each other in the radial direction of the substrate 9. Specifically, the target discharge position Qd of the gas nozzle 50d is on an inner side of the radial direction of the substrate 9 (on the part of the center) relative to the respective target discharge positions Qa, Qb and Qc of the processing liquid nozzles 50a, 50b and 50c. The target discharge position Qc of the rinse liquid nozzle 50c is on an inner side of the radial direction of the substrate 9 relative to the respective target discharge positions Qa and Qb of the chemical liquid nozzles 50a and 50b. The target discharge position Qa of the first chemical liquid nozzle 50a and the target discharge position Qb of the second chemical liquid nozzle 50b are the same in the radial direction. "Positions being the same in the radial direction" means positions spaced by the same distance from the end face 93 of the substrate 9 (specifically, positions spaced by the same distance from the center of the substrate 9). Here, the target discharge position Qa of the first chemical liquid nozzle 50a and the target discharge position Qb of the second chemical liquid nozzle 50b are spaced by the same distance from the end face 93 of the substrate 9.

By way of example, the target discharge position Qa of the first chemical liquid nozzle 50a and the target discharge position Qb of the second chemical liquid nozzle 50b are both separated inward from the end face 93 of the substrate 9 by 1.0 mm. The target discharge position Qd of the gas nozzle 50d is spaced inward in the substrate 9 from the respective target discharge positions Qa and Qb of the chemical liquid nozzles 50a and 50b by 0.5 mm. The target discharge position Qc of the rinse liquid nozzle 50c is separated from the end face 93 of the substrate 9 by a distance of from 1.0 to 0.5 mm.

All the nozzles 50a to 50d are supported by the support part 500 while being placed in their positions shifted from each other in the radial direction of the substrate 9 such that fluids discharged from the nozzles 50a to 50d can reach their respective target discharge positions Qa, Qb, Qc and Qd. Specifically, the gas nozzle 50d is supported by the support part 500 while being placed on an inner side of the radial direction of the substrate 9 relative to the processing liquid nozzles 50a, 50b and 50c. The rinse liquid nozzle 50c is supported by the support part 500 while being placed on an inner side of the radial direction of the substrate 9 relative to the chemical liquid nozzles 50a and 50b. The first and second chemical liquid nozzles 50a and 50b are supported by the support part 500 while being placed in the same position in the radial direction. The nozzles 50a to 50d are placed in their positions shifted from each other by an amount that is determined based on the aforementioned angle of the tilted flow path section 5042 in a manner that allows fluids to reach the corresponding target discharge positions Qa, Qb, Qc and Qd.

In the discharge head 51, the target discharge position Qd of the gas nozzle 50d is on an inner side of the radial direction of the substrate 9 relative to the respective target discharge positions Qa, Qb and Qc of the processing liquid nozzles 50a, 50b and 50c. Accordingly, in the front surface peripheral area 911 of the substrate 9, gas is supplied to a position inside a position where a processing liquid is discharged. In this structure, a processing liquid supplied to the front surface peripheral area 911 can be blown away from an inner side toward an outer side of the substrate 9 with gas. This can suppress entry of the processing liquid on the front surface peripheral area 911 into the device region 90. This can further stabilize the dimension of a region to be acted on by the processing liquid (such as the dimension of a region to be acted on by a chemical liquid for etching, specifically an etching width), so that this dimension can be controlled with a higher degree of accuracy.

In the discharge head 51, the target discharge position Qc of the rinse liquid nozzle 50c is on an inner side of the radial direction of the substrate 9 relative to the respective target discharge positions Qa and Qb of the chemical liquid nozzles 50a and 50b respectively. Accordingly, in the front surface peripheral area 911 of the substrate 9, a rinse liquid is supplied to a position closer to the inside than a position where a chemical liquid is discharged. In this structure, the chemical liquid supplied to the front surface peripheral area 911 can be washed away from an inner side toward an outer side of the substrate 9 with the rinse liquid. This can sufficiently suppress entry of the chemical liquid into the device region 90 and at the same time, can wash out the chemical liquid satisfactorily without generating a residue of the chemical liquid.

In the discharge head 51, the respective target discharge positions Qa and Qb of the first and second chemical liquid nozzles 50a and 50b are the same in the radial direction of the substrate 9. Accordingly, in the front surface peripheral area 911 of the substrate 9, an alkaline chemical liquid can be discharged to a position where an acidic chemical liquid is discharged. This structure allows both of the chemical liquids to act on the same region accurately.

<Liquid Bounce Suppressing Unit 6>

By referring back to FIGS. 3 to 5, in the substrate processing apparatus 1, while a processing liquid is discharged from the discharge head 51 toward the front surface peripheral area 911 of the substrate 9 held on the spin base 21, part of the processing liquid supplied onto the front surface peripheral area 911 may be splashed from the substrate 9 and part of the splashed processing liquid may adhere to the substrate 9 again after bouncing off a member placed outside, for example. The liquid bounce suppressing unit 6 is a member intended to suppress re-adhesion of a processing liquid to the substrate 9 after the processing liquid is splashed from the substrate 9.

<i. Guard Member 60>

Figure 11:
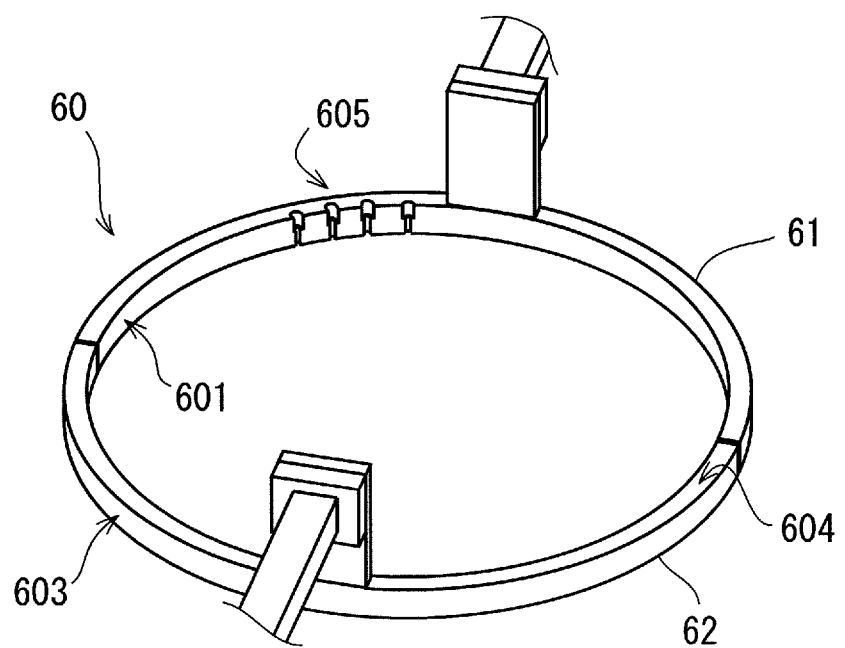
FIG. 11 is a perspective view of a guard member.
Figure 12:
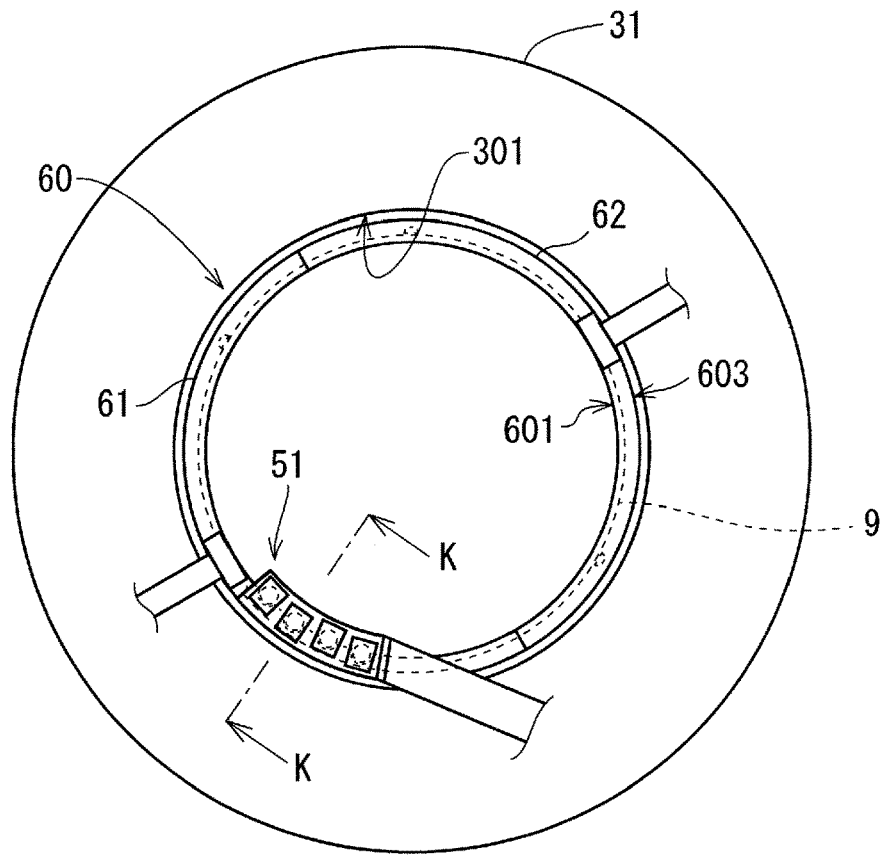
FIG. 12 is a plan view taken from above showing a condition where a cup, the guard member, and the discharge head for peripheral area are placed in their respective processing positions.
Figure 13:
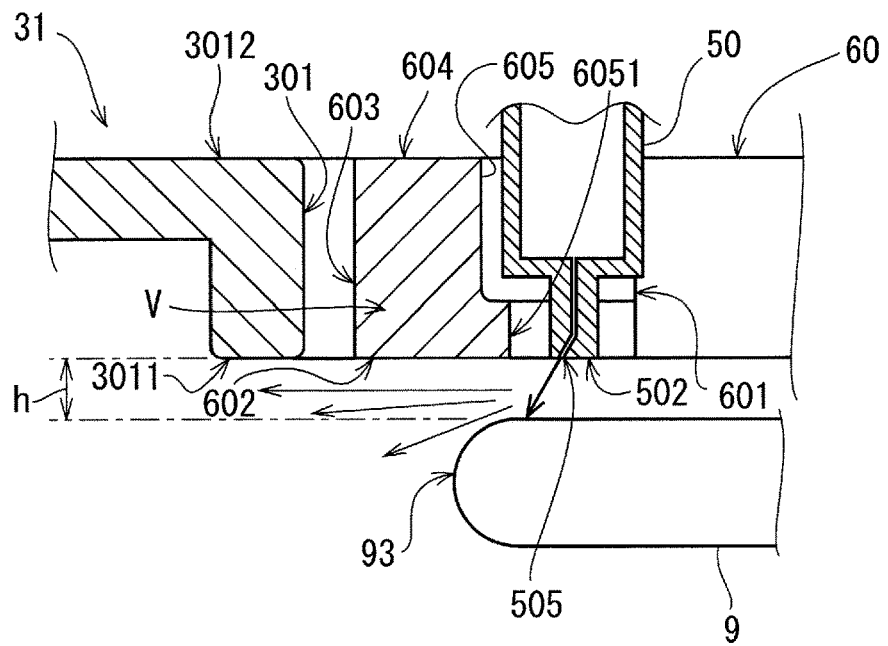
FIG. 13 is a side sectional view taken in a direction indicated by arrows K of FIG. 12.

The liquid bounce suppressing unit 6 includes the guard member 60. The guard member 60 is described in detail by referring to FIGS. 11 to 13 as well as FIGS. 3 to 5. FIG. 11 is a perspective view of the guard member 60. FIG. 12 is a plan view taken from above showing a condition where the cup 31, the guard member 60, and the discharge head 51 are placed in their respective processing positions. FIG. 13 is a side sectional view taken in a direction indicated by arrows K of FIG. 12.

The guard member 60 is a ring-shaped member extending along the entire circumference of the front surface peripheral area 911 of the substrate 9. While the substrate 9 held on the spin base 21 is being processed, the guard member 60 as viewed from above is placed concentrically with the substrate 9 and in a position (processing position) close to the front surface peripheral area 911 of the substrate 9 in a noncontact manner. It is preferable that a cross section of the guard member 60 taken in a direction perpendicular to the circumferential direction of the guard member 60 be rectangular and more preferably, square.

The guard member 60 has an inner diameter slightly smaller than the outer diameter of the substrate 9. Accordingly, if the guard member 60 in the processing position is viewed from above, the inner circumferential wall 601 of the guard member 60 is on an inner side (on the part of the center of the substrate 9) relative to the end face 93 of the substrate 9. At least an inner circumferential portion of a lower surface 602 of the guard member 60 is placed to face the front surface peripheral area 911 of the substrate 9 held on the spin base 21. Specifically, the inner circumferential wall 601 of the guard member 60 is on an inner side (on the part of the center of the substrate 9) relative to the end face 93 of the substrate 9 and the lower surface 602 of the guard member 60 partially faces the front surface peripheral area 911 of the substrate 9 while being in a position close to the front surface peripheral area 911. A distance h determined in this condition between the lower surface 602 of the guard member 60 and the front surface 91 of the substrate 9 held on the spin base 21 is in a range of from 1 to 1.5 mm, for example.

The guard member 60 has an outer diameter larger than the outer diameter of the substrate 9 and slightly smaller than the inner diameter of the top edge portion 301 of the cup 31. Accordingly, if the guard member 60 in the processing position is viewed from above, an outer circumferential wall 603 of the guard member 60 is outside the end face 93 of the substrate 9 and extends along the entire circumference of the top edge portion 301 of the cup 31 while placed in a position close to the top edge portion 301 in a noncontact manner. Specifically, the cup 31 placed in the processing position surrounds the substrate 9 on the spin base 21 and the guard member 60 together.

The aforementioned discharge head 51 in the processing position is placed on the same side as the inner circumferential wall 601 of the guard member 60 (specifically, on a side opposite the cup 31 with respect to the guard member 60). In this condition, the nozzle 50 of the discharge head 51 is placed on a side opposite the cup 31 with respect to the guard member 60. The inner circumferential wall 601 of the guard member 60 is given the cut 605 where at least part of the discharge head 51 is housed. While the discharge head 51 is in the processing position, at least part of the discharge head 51 (more specifically, at least part of the nozzle 50 of the discharge head 51, for example) is housed in the cut 605. Thus, the discharge head 51 is placed in the processing position above the front surface peripheral area 911 without interfering with the guard member 60. It is preferable that a wall surface part 6051 of the cut 605 extending continuously from the lower surface 602 be flush with the end face 93 of the substrate 9 or on an inner side (on the part of the center of the substrate 9) relative to the end face 93 as viewed from above.

While the guard member 60, the discharge head 51, and the cup 31 are placed in their respective processing positions, it is preferable that the lower surface 602 of the guard member 60 be in the same height as the discharge surface 502 of the nozzle 50 of the discharge head 51 or below the discharge surface 502. The wall surface part 6051 can be in the lowest possible position that does not interfere with a path for a fluid to be discharged from the nozzle 50. It is preferable that the lower surface 602 of the guard member 60 be in the same height as a lower surface 3011 of the top edge portion 301 of the cup 31 or below the lower surface 3011. In the first preferred embodiment, the lower surface 602 of the guard member 60, the discharge surface 502 of the discharge head 51, and the lower surface 3011 of the top edge portion 301 of the cup 31 are placed in the same height. Specifically, the three surfaces 602, 502 and 3011 are placed in the same horizontal plane.

While the guard member 60 and the cup 31 are placed in their respective processing positions, it is preferable that an upper surface 604 of the guard member 60 be in the same height as an upper surface 3012 of the top edge portion 301 of the cup 31.

<ii. Reason why Re-Adhesion of Processing Liquid is Suppressed>

While a processing liquid is discharged from the discharge head 51 toward the front surface peripheral area 911, placement of the guard member 60 in the processing position can suppress re-adhesion of the processing liquid to the substrate 9 after the processing liquid is splashed from the substrate 9. The following describes the reason for this suppression.

The top edge portion 301 of the cup 31 has an inner diameter larger than the outer diameter of the spin base 21 such that the cup 31 can move to the retreat position below the upper surface of the spin base 21. The outer diameter of the spin base 21 is larger than the outer diameter of the substrate 9, so that ring-shaped clearance space is formed between the end face 93 of the substrate 9 held on the spin base 21 and the top edge portion 301 of the cup 31 as viewed from above. Thus, clearance space V is further formed between the discharge head 51 placed in the processing position facing the front surface peripheral area 911 of the substrate 9 and the top edge portion 301 of the cup 31. The clearance space V might be space to permit floating of mist of a processing liquid splashed from the substrate 9, for example. However, the clearance space V is filled at least partially with part of the guard member 60. This structure reduces space that might permit floating for example of mist of a processing liquid splashed from the substrate 9 by space filled with the guard member 60. This reduction of the space reduces the amount of floating of the processing liquid near the substrate 9. This reduces the probability of re-adhesion for example of mist of the processing liquid to the substrate 9. Specifically, this can suppress re-adhesion of part of the processing liquid to the substrate 9 after the processing liquid is splashed from the substrate 9.

In particular, at least part of the lower surface 602 of the guard member 60 is placed to face the front surface peripheral area 911. Thus, a processing liquid splashed from the substrate 9 is guided along the lower surface 602 of the guard member 60 into the cup 31. This can sufficiently suppress re-adhesion of the splashed processing liquid to the substrate 9.

In particular, the lower surface 602 of the guard member 60 is placed in the same height as the discharge surface 502 of the nozzle 50 of the discharge head 51 or below the discharge surface 502. The present inventors confirmed that this particularly effectively acts to suppress re-adhesion of a processing liquid to the substrate 9 (particularly, device region 90) after the processing liquid is splashed from the substrate 9.

The present inventors also confirmed that placing the lower surface 602 of the guard member 60 in the same height as the lower surface 3011 of the top edge portion 301 of the cup 31 or below the lower surface 3011 also particularly effectively acts to suppress re-adhesion of a processing liquid to the substrate 9 (particularly, device region 90) after the processing liquid is splashed from the substrate 9.

The guard member 60 is a ring-shaped member extending along the entire circumference of the front surface peripheral area 911 of the substrate 9. This can suppress re-adhesion of a processing liquid to the substrate 9 throughout the circumferential direction of the substrate 9 after the processing liquid is splashed from the substrate 9.

<iii. Semicircular Members 61 and 62>

The guard member 60 is formed by making abutting contact between multiple arcuate members (here, semicircular members 61 and 62 in a pair) as separate members at respective end faces thereof in their circumferential directions. Specifically, the semicircular members 61 and 62 in a pair are semicircular members of the same diameter.

The semicircular members 61 and 62 are placed such that their chord directions are pointed inward and their end faces in their circumferential directions face each other. The guard member 60 may be formed by making abutting contact between three or more arcuate members at respective end faces thereof in their circumferential directions. Each of the semicircular members 61 and 62 in a pair is provided with a semicircular member drive unit 63 to drive each of the semicircular members 61 and 62. The semicircular member drive unit 63 includes an up-and-down drive part 631 (such as a stepping motor) to move each of the semicircular members 61 and 62 connected to the semicircular member drive unit 63 up and down along a vertical axis, and an advance-and-retreat drive part 632 to move each of the semicircular members 61 and 62 connected to the semicircular member drive unit 63 in a horizontal plane in a direction where this semicircular member 61 or 62 gets closer to or farther from the other of the semicircular members 61 and 62.

While the substrate 9 is not held on the spin base 21, both the semicircular members 61 and 62 are placed in positions (retreat positions) outside a transport path for the substrate 9 while being spaced from each other. More specifically, the retreat position of each of the semicircular members 61 and 62 is below the upper surface of the spin base 21 (specifically, a position that places the upper surface 604 of each of the semicircular members 61 and 62 below the upper surface of the spin base 21) and outside the top edge portion 301 of the cup 31 as viewed from above (position shown in FIG. 3).

When the substrate 9 is held on the spin base 21, the up-and-down drive part 631 moves each of the semicircular members 61 and 62 in the retreat position to a position slightly above the upper surface of the spin base 21. Then, the advance-and-retreat drive part 632 moves each of the semicircular members 61 and 62 in a horizontal plane in a direction where this semicircular member 61 or 62 gets closer to the other of the semicircular members 61 and 62, thereby making abutting contact between the semicircular members 61 and 62 at the respective end faces thereof in their circumferential directions. As a result, the ring-shaped guard member 60 is placed in the processing position.

<iv. Cleaning Process>

As described above, while the substrate 9 is not held on the spin base 21, the semicircular members 61 and 62 and the cup 31 are placed in their retreat positions. As described above, while the semicircular members 61 and 62 and the cup 31 are placed in their retreat positions, they are all placed below the upper surface of the spin base 21 and the semicircular members 61 and 62 are placed in positions above the cup 31 and close to the upper surface of the cup 31 in a noncontact manner.

In the substrate processing apparatus 1, while the substrate 9 is not held on the spin base 21, the spin base 21 is cleaned regularly (each time substrates 9 of a given number are processed, for example) or irregularly (in response to an order from an operator, for example).

During the cleaning process on the spin base 21, the spin base 21 is rotated while a cleaning liquid is supplied from a cleaning nozzle (not shown in the drawings) onto the center and its vicinity of the upper surface of the spin base 21 on which the substrate 9 is not held. Then, the cleaning liquid is caused to spread throughout the upper surface of the spin base 21 by centrifugal force generated as a result of rotation of the spin base 21, thereby cleaning the upper surface of the spin base 21 entirely. This cleaning liquid is eventually blown off from a peripheral area of the spin base 21 to the outside of the spin base 21. While the spin base 21 is cleaned, the semicircular members 61 and 62 and the cup 31 are all placed in their retreat positions below the upper surface of the spin base 21. Thus, the cleaning liquid blown off from the peripheral area of the spin base 21 to the outside of the spin base 21 reaches the cup 31 and the semicircular members 61 and 62 above the cup 31. This cleans the cup 31 and the semicircular members 61 and 62. Specifically, during the cleaning process on the spin base 21, the cup 31 and the semicircular members 61 and 62 are cleaned together as well as the spin base 21.

<Heat Processing Unit 7>

By referring back to FIGS. 3 to 5, the heat processing unit 7 supplies steam (water vapor) and particularly preferably, superheated steam (superheated water vapor) to the back surface 92 of the substrate 9 held on the spin base 21 to heat the substrate 9.

The heat processing unit 7 includes a steam nozzle 71 from which steam is discharged toward the back surface 92 of the substrate 9 held on the spin base 21. The steam nozzle 71 is arranged on the spin base 21. The steam nozzle 71 has multiple steam discharge ports (not shown in the drawings) formed in the upper surface thereof. At least one of these steam discharge ports is formed in a position where steam is supplied selectively to the back surface peripheral area 921 of the substrate 9 held on the spin base 21. Preferably, this steam discharge port is formed in a position facing the back surface peripheral area 921. Steam of a larger amount can be discharged from this steam discharge port than steam discharged from the other steam discharge port. In this structure, steam from the steam nozzle 71 can be discharged intensively particularly onto the back surface peripheral area 921 of the back surface 92 of the substrate 9.

The steam nozzle 71 is connected to a steam supplier 72 that is a pipe system to supply steam to the steam nozzle 71. As an example, the specific structure of the steam supplier 72 includes a steam source 721 as a source for steam that is connected to the steam nozzle 71 through a pipe 722 in which an open-close valve 723 is interposed. In this structure, opening the open-close valve 723 discharges steam from the steam nozzle 71 supplied from the steam source 721.

It is preferable that steam to be discharged from the steam nozzle 71 be superheated steam (superheated water vapor) heated (superheated) to a sufficiently high temperature (such as one in a range of from 100° C. to 130° C., for example). This can be achieved for example by forming the steam source 721 by using a source to supply steam (water vapor) generated by heating pure water and the like, a pipe connected to the source, and a heater interposed in a path of the pipe (all of these parts are not shown in the drawings). In this case, in consideration of temperature drop of steam from the source to occur for example while the steam passes through the pipe, it is preferable that the heater heat (superheat) the steam supplied from the source to a temperature of from about 140° C. to about 160° C., for example. Even if the substrate 9 draws heat of part of steam (superheated steam) supplied to the substrate 9 to cool the steam so the steam condenses into droplets on the substrate 9, these droplets are blown off from the end face 93 of the substrate 9 to the outside of the substrate 9 by centrifugal force generated as a result of rotation of the substrate 9. This prevents attachment of the droplets to the device region 90.

When steam is supplied from the steam supplier 72 to the steam nozzle 71, the steam is discharged from the steam nozzle 71 toward the back surface 92 of the substrate 9 held on the spin base 21, thereby heating the substrate 9. As described above, in the first preferred embodiment, steam from the steam nozzle 71 can be discharged intensively onto the back surface peripheral area 921. Thus, the back surface peripheral area 921 can be heated particularly intensively. The open-close valve 723 of the steam supplier 72 is electrically connected to the controller 130 and is opened and closed under control by the controller 130. Specifically, a mode of discharge of steam from the steam nozzle 71 (more specifically, timing of starting discharge, timing of finishing the discharge, and discharge flow rate, for example) is controlled by the controller 130.

<Back Surface Processing Unit 8>

The back surface processing unit 8 is to process the back surface 92 of the substrate 9 held on the spin base 21. More specifically, the back surface processing unit 8 is to supply a processing liquid to the back surface 92 of the substrate 9 held on the spin base 21.

The back surface processing unit 8 includes a supply pipe 81 placed to pass through a hollow portion of the rotary shaft part 22 of the spin chuck 2. The tip of the supply pipe 81 has an opening located at the upper surface of the spin base 21. This opening forms a back surface side discharge port 82.

The supply pipe 81 is connected to a processing liquid supplier 83 that is a pipe system to supply a processing liquid to the supply pipe 81. The processing liquid supplier 83 is more specifically formed by combining an SC-1 source 831$a$, a DHF source 831$b$, an SC-2 source 831$c$, a rinse liquid source 831$d$, multiple pipes 832$a$, 832$b$, 832$c$ and 832$d$, and multiple open-close valves 833$a$, 833$b$, 833$c$ and 833$d$.

The SC-1 source 831$a$ is a source to supply SC-1. The SC-1 source 831$a$ is connected to the supply pipe 81 through the pipe 832$a$ in which the open-close valve 833$a$ is interposed. Accordingly, opening the open-close valve 833$a$ discharges SC-1 from the back surface side discharge port 82 supplied from the SC-1 source 831$a$.

The DHF source 831$b$ is a source to supply DHF. The DHF source 831$b$ is connected to the supply pipe 81 through the pipe 832$b$ in which the open-close valve 833$b$ is interposed. Accordingly, opening the open-close valve 833$b$ discharges DHF from the back surface side discharge port 82 supplied from the DHF source 831$b$.

The SC-2 source 831$c$ is a source to supply SC-2. The SC-2 source 831$c$ is connected to the supply pipe 81 through the pipe 832$c$ in which the open-close valve 833$c$ is interposed. Accordingly, opening the open-close valve 833$c$ discharges SC-2 from the back surface side discharge port 82 supplied from the SC-2 source 831$c$.

The rinse liquid source 831$d$ is a source to supply a rinse liquid. The rinse liquid source 831$d$ mentioned herein supplies for example pure water (carbonated water) as a rinse liquid containing dissolved carbon dioxide ($CO_2$). The rinse liquid source 831$d$ is connected to the supply pipe 81 through the pipe 832$d$ in which the open-close valve 833$d$ is interposed. Accordingly, opening the open-close valve 833$d$ discharges a rinse liquid from the back surface side discharge port 82 supplied from the rinse liquid source 831$d$. A rinse liquid to be used can be pure water, warm water, ozone water, magnetic water, regenerated water (hydrogen water), various organic solvents, ionized water, IPA (isopropyl alcohol) and functional water, for example.

If a processing liquid (SC-1, DHF, SC-2, or rinse liquid) is supplied from the processing liquid supplier 83 to the supply pipe 81, the processing liquid is discharged from the back surface side discharge port 82 toward the center and its vicinity of the back surface 92 of the substrate 9 held on the spin base 21. The open-close valves 833a, 833b, 833c and 833d of the processing liquid supplier 83 are each electrically connected to the controller 130 and are opened and closed under control by the controller 130. Specifically, a mode of discharge of a processing liquid from the back surface side discharge port 82 (more specifically, type of processing liquid to be discharged, timing of starting discharge, timing of finishing the discharge, and discharge flow rate, for example) is controlled by the controller 130.

<4. Operation of Substrate Processing Apparatus 1>

The following describes the operation of the substrate processing apparatus 1. The substrate processing apparatus 1 performs a series of processes described below under control by the controller 130. The processes described below are merely examples of processes that can be performed by the substrate processing apparatus 1.

In the substrate processing apparatus 1, preparatory process (step S1), front surface peripheral process (step S2), processing surface switching process (step S3), back surface process (step S4), and drying process (step S5) are performed in the order named on one substrate 9, for example (FIG. 14). Each of the processes is described in detail below.

<4-1. Preparatory Process>

Figure 15:
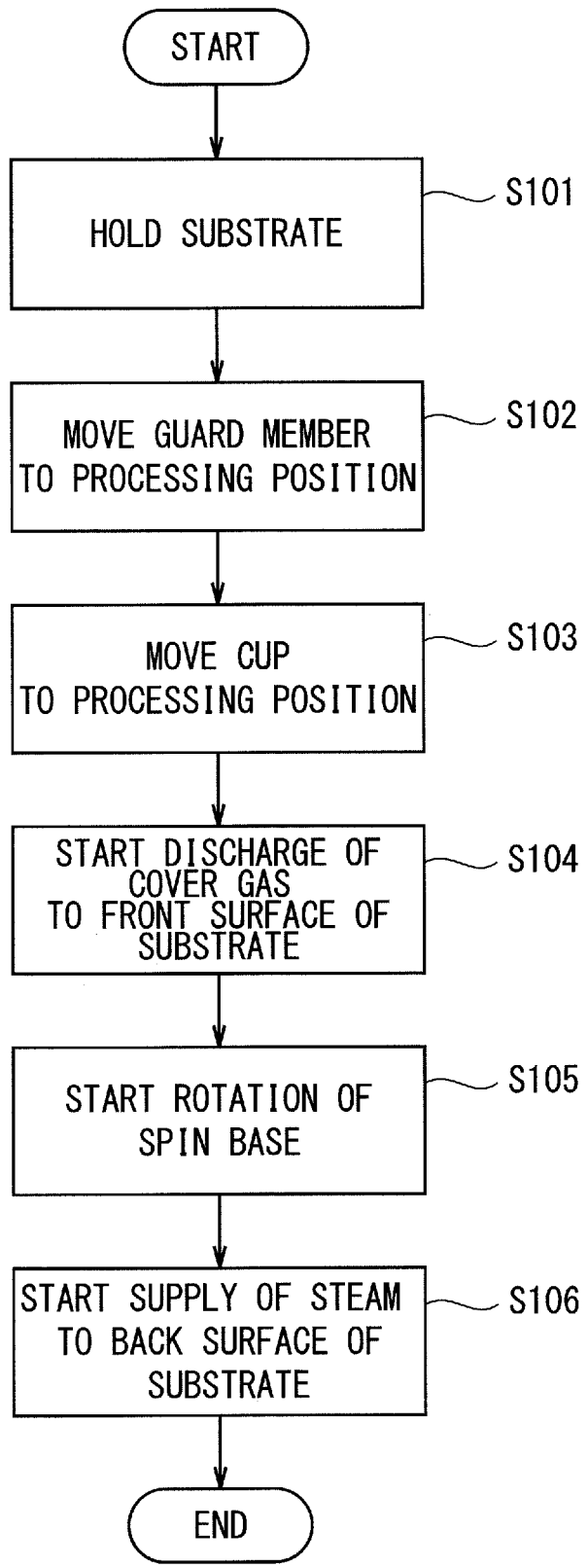
FIG. 15 shows a flow of preparatory process.
Figure 16:
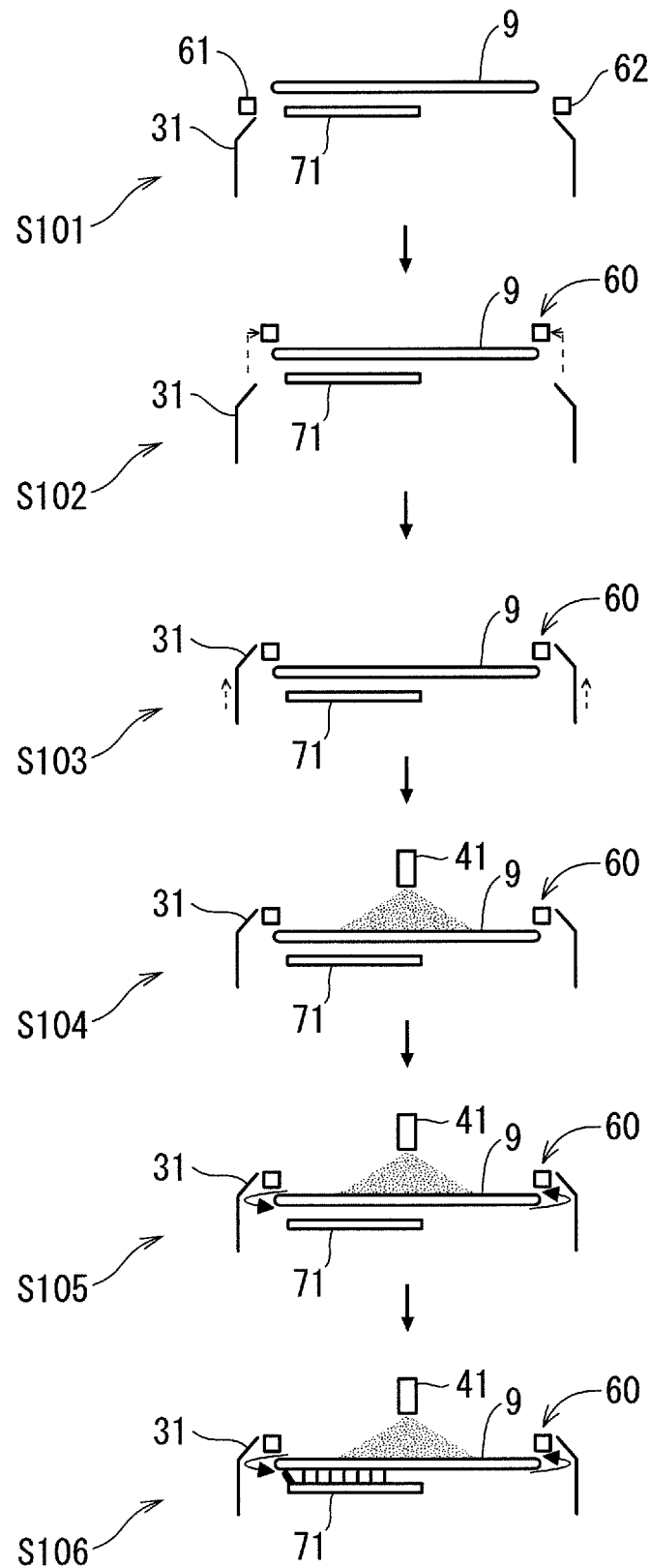
FIG. 16 explains the preparatory process.

The preparatory process (step S1) is described below by referring to FIGS. 15 and 16. FIG. 15 shows a flow of the preparatory process. FIG. 16 explains the preparatory process. In FIG. 16, some of the elements of the substrate processing apparatus 1 performing each step of the preparatory process are schematically shown.

While the semicircular members 61 and 62, the cup 31, the discharge head 51, and the cover gas nozzle 41 are placed in their respective retreat positions, the transport robot CR places the substrate 9 on the spin base 21 with the front surface 91 of the substrate 9 pointed upward. The substrate 9 placed on the spin base 21 is held by the group of the holding members 25 (step S101). This places the substrate 9 on the spin base 21 in a substantially horizontal posture.

After the substrate 9 is held on the spin base 21, the guard member 60 is moved to the processing position (step S102). More specifically, the up-and-down drive part 631 of the semicircular member drive unit 63 moves each of the semicircular members 61 and 62 in its retreat positions to a position slightly above the upper surface of the spin base 21. Then, the advance-and-retreat drive part 632 of the semicircular member drive unit 63 moves each of the semicircular members 61 and 62 in a horizontal plane in a direction where this semicircular member 61 or 62 gets closer to the other of the semicircular members 61 and 62, thereby making abutting contact between the semicircular members 61 and 62 at the respective end faces thereof in their circumferential directions. As a result, the ring-shaped guard member 60 is placed in the processing position. The guard member 60 in the processing position is kept standstill without being rotated after rotation of the spin base 21 is started.

When the guard member 60 is placed in the processing position, the cup 31 in the retreat position is then moved up to be placed in the processing position (step S103). This places the cup 31 such that the cup 31 surrounds the substrate 9 held on the spin base 21 and the guard member 60 together.

When the cup 31 is placed in the processing position, the cover gas nozzle 41 is then moved from the retreat position to the processing position. Then, discharge of cover gas is started from the cover gas nozzle 41 in the processing position toward the center and its vicinity of the front surface 91 of the substrate 9 (step S104). Supply of the cover gas to the center and its vicinity of the front surface 91 of the substrate 9 started in this step continues until process on this substrate 9 is finished. Continuously supplying the cover gas to the center and its vicinity of the front surface 91 of the substrate 9 prevents exposure of the device region 90 for example to an atmosphere of a processing liquid supplied to the front surface peripheral area 911 and the like while the substrate 9 is being processed. Specifically, the device region 90 continues to be protected from an atmosphere of a processing liquid supplied to the front surface peripheral area 911, for example.

Here, discharge of the cover gas from the cover gas nozzle 41 is started after the cup 31 is placed in the processing position. It is assumed that discharge of the cover gas from the cover gas nozzle 41 is started before the cup 31 is moved up to the processing position. In this case, a gas flow generated near the front surface peripheral area 911 of the substrate 9 is disturbed to roll up, so that particles or the like might adhere to the substrate 9. Such a situation can be prevented by the structure of starting discharge of the cover gas after the cup 31 is placed in the processing position.

Next, rotation of the spin base 21 is started. This starts rotation of the substrate 9 in a horizontal posture held on the spin base 21 (step S105). At this time, the frequency of rotation of the spin base 21 (specifically, the frequency of rotation of the substrate 9) is 600 rpm, for example. This frequency of rotation is determined appropriately such that a processing liquid supplied to the front surface peripheral area 911 will not go into the device region 90 or will not move toward the end face 93 (specifically, such that the processing liquid will be held stably in a region to be processed inside the front surface peripheral area 911) during the front surface peripheral process.

Next, steam is discharged from the steam nozzle 71 toward the back surface 92 of the rotated substrate 9 (pre-steaming) (step S106). After elapse of a certain time (such as five seconds) from start of discharge of the steam, discharge of the steam from the steam nozzle 71 is stopped. This pre-steaming heats the substrate 9. Most of the chemical liquids used for processing the substrate 9 react in an accelerated manner at a higher temperature. From this viewpoint, heating the substrate 9 in advance by this pre-streaming accelerates reaction between a chemical liquid and the substrate 9 during chemical liquid process. This shortens a time of the chemical liquid process and reduces the usage of a chemical liquid.

<4-2. Front Surface Peripheral Process>

Figure 18:
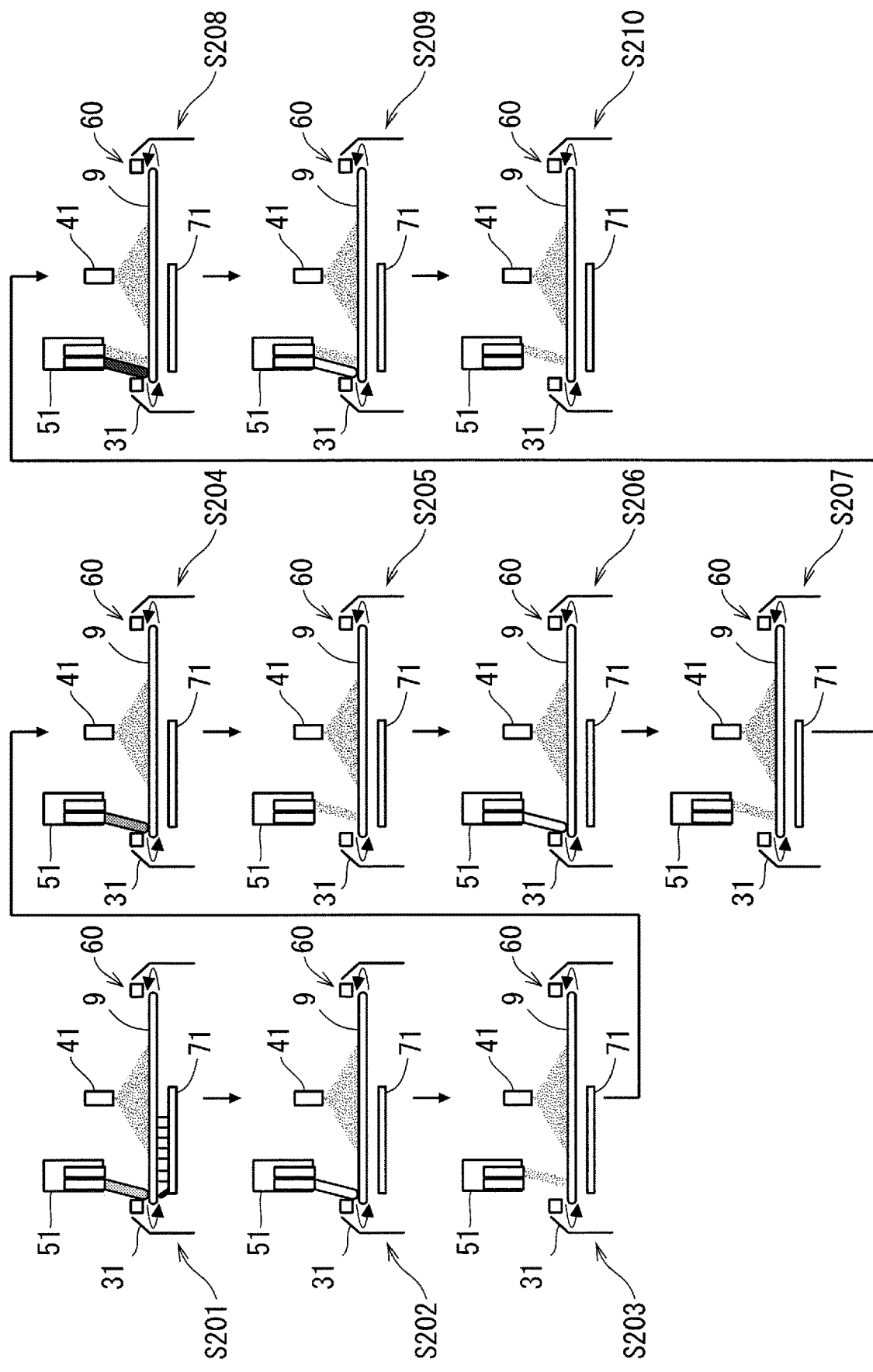
FIG. 18 explains the front surface peripheral process.

When the preparatory process (step S1) is finished, the front surface peripheral process (step S2) is performed thereafter. The front surface peripheral process is described below by referring to FIGS. 17 and 18. FIG. 17 shows a flow of the front surface peripheral process. FIG. 18 explains the front surface peripheral process. In FIG. 18, some of the elements of the substrate processing apparatus 1 performing each step of the front surface peripheral process are schematically shown.

While the front surface peripheral process described below is being performed, the substrate 9 continues to be rotated at a given frequency (such as 600 rpm). As described above, supply of the cover gas from the cover gas nozzle 41 toward the center and its vicinity of the front surface 91 of the substrate 9 continues during the front surface peripheral process. This protects the device region 90 from an atmosphere of a processing liquid supplied to the front surface peripheral area 911, for example.

<Alkaline Process (SC-1)>
<i. Chemical Liquid Process>

First, the front surface peripheral area 911 of the substrate 9 is subjected to chemical liquid process with SC-1 (step S201). More specifically, the discharge head 51 is first moved from the retreat position to the processing position. Then, SC-1 is discharged from the second chemical liquid nozzle 50b of the discharge head 51 in the processing position toward the front surface peripheral area 911 of the rotated substrate 9. At this time, SC-1 is discharged at a rate of from 20 to 50 mL/min, for example. After elapse of a certain time (such as 20 seconds) from start of discharge of SC-1, discharge of SC-1 from the discharge head 51 is stopped.

This chemical liquid process removes a thin film formed on the front surface peripheral area 911 of the substrate 9 (etching process). During this chemical liquid process, steam is discharged from the steam nozzle 71 toward the back surface 92 of the substrate 9. During this process, the steam is discharged at a rate of from 500 to 2000 mL/min, for example. The temperature of the discharged steam is from 110° C. to 130° C., for example. For the reason that SC-1 reacts in an accelerated manner at a higher temperature, supplying the steam to the substrate 9 to heat the substrate 9 being subjected to the chemical liquid process with SC-1 accelerates reaction between the front surface peripheral area 911 of the substrate 9 and SC-1 (specifically, increases an etching rate) (what is called heat assist). This shortens a time of the chemical liquid process with SC-1 and reduces the usage of SC-1. In particular, intensively heating the back surface peripheral area 921 of the substrate 9 during this process can effectively accelerate reaction between the front surface peripheral area 911 and SC-1.

<ii. Rinsing Process>

Next, rinsing process is performed (step S202). More specifically, a rinse liquid is discharged from the rinse liquid nozzle 50c of the discharge head 51 in the processing position toward the front surface peripheral area 911 of the rotated substrate 9. After elapse of a certain time (such as five seconds) from start of discharge of the rinse liquid, discharge of the rinse liquid from the discharge head 51 is stopped. This rinsing process washes out the processing liquid (here, SC-1) adhering to the front surface peripheral area 911.

<iii. Liquid Shake-Off Process>

Next, liquid shake-off process is performed (step S203). The liquid shake-off process is performed to move a processing liquid remaining on the front surface peripheral area 911 (here, the rinse liquid remaining on the front surface peripheral area 911 for not having been shaken off from the substrate 9 in the rinsing process in step S202) toward the end face 93 of the substrate 9 and to shake off the remaining processing liquid from the end face 93 to the outside of the substrate 9. The processing liquid moved toward the end face 93 is held in a non-flat surface area including the end face 93 and its neighboring area. The processing liquid held in the non-flat surface area is unlikely to be separated, so that it is shaken off collectively to the outside of the substrate 9. Specifically, the processing liquid remaining on the front surface peripheral area 911 is moved toward the end face 93 of the substrate 9 and then shaken off to the outside of the substrate 9. This can remove much of the remaining processing liquid from the substrate 9 without causing substantially no residue of the liquid on the front surface peripheral area 911.

The following describes examples of the particulars of the liquid shake-off process. First, the substrate 9 is rotated for a given time (liquid moving step) (step S2031) while discharge of a fluid (processing liquid and gas) from the discharge head 51 toward the front surface peripheral area 911 is stopped. This moves the processing liquid remaining on the front surface peripheral area 911 in a direction toward the end face 93 of the substrate 9 in response to centrifugal force generated as a result of the rotation of the substrate 9, so that the processing liquid is held in the non-flat surface area including the end face 93 and its neighboring area. Next, gas is discharged from the gas nozzle 50d of the discharge head 51 in the processing position toward the front surface peripheral area 911 of the rotated substrate 9 (blow-away step) (step S2032). At this time, the gas is discharged at a rate of 14 L/min, for example. This shakes off the processing liquid held in the non-flat surface area collectively to the outside of the substrate 9 in response to the wind pressure of the gas and centrifugal force generated as a result of the rotation of the substrate 9. After elapse of a certain time (such as 15 seconds) from start of discharge of the gas from the discharge head 51, discharge of the gas from the discharge head 51 is stopped.

This liquid shake-off process shakes off much of the processing liquid remaining on the front surface peripheral area 911 (specifically, the rinse liquid remaining on the front surface peripheral area 911 for not having been shaken off from the substrate 9 in the rinsing process in step S202).

<First Acidic Process (SC-2)>
<i. Chemical Liquid Process>

Next, the front surface peripheral area 911 of the substrate 9 is subjected to chemical liquid process with SC-2 (step S204). More specifically, SC-2 is discharged from the first chemical liquid nozzle 50a of the discharge head 51 in the processing position toward the front surface peripheral area 911 of the rotated substrate 9. After elapse of a certain time (such as 20 seconds) from start of discharge of SC-2, discharge of SC-2 from the discharge head 51 is stopped.

This chemical liquid process removes a metallic composition (such as Mo or Co) and the like adhering to the front surface peripheral area 911 of the substrate 9 (cleaning process). This chemical liquid process is performed after the liquid shake-off process (step S203). Accordingly, SC-2 is discharged toward the front surface peripheral area 911 on which substantially no rinse liquid remains. It is assumed that this chemical liquid process is performed without the presence of the liquid shake-off process in step S203. In this case, SC-2 is discharged toward the front surface peripheral area 911 on which the rinse liquid remains. Hence, the discharged SC-2 might collide with the remaining rinse liquid to bounce into the device region 90. However, in this chemical liquid process, substantially no rinse liquid remains on the front surface peripheral area 911 as a result of the presence of the liquid shake-off process, making entry of a processing liquid into the device region 90 unlikely due to the aforementioned collision between processing liquids. It is assumed that the liquid shake-off process in step S203 is absent. In this case, the rinse liquid remaining on the front surface peripheral area 911 and the supplied SC-2 might mix with each other. Meanwhile, the presence of the liquid shake-off process makes occurrence of such a situation unlikely. This allows SC-2 of a desired concentration to act appropriately on the front surface peripheral area 911. This can also prevent contamination between the rinse liquid having been used for washing out SC-1 as an alkaline chemical liquid and SC-2 as an acidic chemical liquid.

<ii. Liquid Shake-Off Process>

Next, liquid shake-off process is performed (step S205). A specific flow of this liquid shake-off process is the same as that of step S203. Specifically, the substrate 9 is rotated for a given time (liquid moving step) while discharge of a fluid toward the front surface peripheral area 911 is stopped. Next, gas is discharged from the gas nozzle 50*d* of the discharge head 51 in the processing position toward the front surface peripheral area 911 of the rotated substrate 9 (blow-away step). After elapse of a certain time (such as 15 seconds) from start of discharge of the gas from the discharge head 51, discharge of the gas from the discharge head 51 is stopped.

This liquid shake-off process shakes off much of the processing liquid remaining on the front surface peripheral area 911 (specifically, SC-2 remaining on the front surface peripheral area 911 for not having been shaken off from the substrate 9 in the cleaning process in step S204). Impurities such as the metallic composition removed from the substrate 9 by the cleaning process are left in SC-2 remaining on the front surface peripheral area 911 for not having been shaken off from the substrate 9 in the cleaning process in step S204. Meanwhile, the liquid shake-off process performed after the cleaning process shakes off these impurities at an early stage from the substrate 9. This reduces the risk of re-adhesion of the impurities to the substrate 9 after the impurities are removed from the substrate 9 during the chemical liquid process with SC-2.

<iii. Rinsing Process>

Next, rinsing process is performed (step S206). A specific flow of this rinsing process is the same as that of step S202. Specifically, a rinse liquid is discharged from the rinse liquid nozzle 50*c* of the discharge head 51 in the processing position toward the front surface peripheral area 911 of the rotated substrate 9. After elapse of a certain time (such as five seconds) from start of discharge of the rinse liquid, discharge of the rinse liquid from the discharge head 51 is stopped.

This rinsing process washes out the processing liquid (here, SC-2) adhering to the front surface peripheral area 911. This rinsing process is performed after the liquid shake-off process (step S205). Accordingly, substantially no SC-2 remains on the front surface peripheral area 911. This shortens a time of the rinsing process, compared to the case where the liquid shake-off process is absent. In this rinsing process, the rinse liquid is discharged toward the front surface peripheral area 911 on which substantially no SC-2 remains, making entry of a processing liquid into the device region 90 unlikely due to collision between processing liquids.

<iv. Liquid Shake-Off Process>

Next, liquid shake-off process is performed (step S207). A specific flow of this liquid shake-off process is the same as that of step S203. Specifically, the substrate 9 is rotated for a given time (liquid moving step) while discharge of a fluid toward the front surface peripheral area 911 is stopped. Next, gas is discharged from the gas nozzle 50*d* of the discharge head 51 in the processing position toward the front surface peripheral area 911 of the rotated substrate 9 (blow-away step). After elapse of a certain time (such as 15 seconds) from start of discharge of the gas from the discharge head 51, discharge of the gas from the discharge head 51 is stopped.

This liquid shake-off process shakes off much of the processing liquid remaining on the front surface peripheral area 911 (specifically, the rinse liquid remaining on the front surface peripheral area 911 for not having been shaken off from the substrate 9 in the rinsing process in step S206).

<Second Acidic Process (DHF)>

<i. Chemical Liquid Process>

Next, the front surface peripheral area 911 of the substrate 9 is subjected to chemical liquid process with DHF (step S208). More specifically, DHF is discharged from the first chemical liquid nozzle 50*a* of the discharge head 51 in the processing position toward the front surface peripheral area 911 of the rotated substrate 9. At this time, DHF is discharged at a rate of from 20 to 50 mL/min, for example. After elapse of a certain time (such as 10 seconds) from start of discharge of DHF, discharge of DHF from the discharge head 51 is stopped.

This chemical liquid process removes a thin film formed on the front surface peripheral area 911 of the substrate 9 (etching process). This chemical liquid process is performed after the liquid shake-off process (step S207). Accordingly, DHF is discharged toward the front surface peripheral area 911 on which substantially no rinse liquid remains, making entry of a processing liquid into the device region 90 unlikely due to collision between processing liquids. Additionally, DHF and the rinse liquid will not mix with each other on the front surface peripheral area 911. This allows DHF of a desired concentration to act appropriately on the front surface peripheral area 911.

During this chemical liquid process, gas is discharged from the gas nozzle 50*d* of the discharge head 51 toward the front surface peripheral area 911. At this time, the gas is discharged at a rate of 14 L/min, for example. Specifically, in each position within the front surface peripheral area 911, old DHF (having been supplied from the first chemical liquid nozzle 50*a* before one rotation of the substrate 9 and not having been shaken off during this rotation) is removed with the gas discharged from the gas nozzle 50*d*. Then, new DHF is supplied to this position from the first chemical liquid nozzle 50*a*. As described above, this structure can suppress entry of a processing liquid into the device region 90 due to collision between an old processing liquid not having been shaken off during one rotation of the substrate 9 and a newly supplied processing liquid. This structure further allows the substrate 9 to be always acted on by fresh DHF, thereby enhancing processing efficiency. This structure also prevents a situation where DHF temporarily remains in large amount in each position within the front surface peripheral area 911. This can stabilize an etching width, so that the etching width can be controlled with a higher degree of accuracy. Supplying DHF makes the front surface peripheral area 911 water repellent, so that an old processing liquid held on the front surface peripheral area 911 may become thick partially. If a new processing liquid is supplied in this condition, the processing liquid may be repelled to bounce easily. In response, an old processing liquid is blown away toward an outer side of the substrate 9 with the gas discharged from the gas nozzle 50*d*. This sufficiently suppresses entry of droplets of this old processing liquid or the like into the device region 90.

<ii. Rinsing Process>

Next, rinsing process is performed (step S209). A specific flow of this rinsing process is the same as that of step S202. Specifically, a rinse liquid is discharged from the rinse liquid nozzle 50*c* of the discharge head 51 in the processing position toward the front surface peripheral area 911 of the rotated substrate 9. After elapse of a certain time (such as five seconds) from start of discharge of the rinse liquid, discharge of the rinse liquid from the discharge head 51 is stopped.

This rinsing process washes out the processing liquid (here, DHF) adhering to the front surface peripheral area 911. During this rinsing process, gas is discharged from the gas nozzle 50d of the discharge head 51 toward the front surface peripheral area 911 of the substrate 9. At this time, the gas is discharged at a rate of 14 L/min, for example. Specifically, in each position within the front surface peripheral area 911, an old rinse liquid (having been supplied from the rinse liquid nozzle 50c before one rotation of the substrate 9 and not having been shaken off during this rotation) is removed with the gas discharged from the gas nozzle 50d. Then, a new rinse liquid is supplied to this position from the rinse liquid nozzle 50c. As described above, this structure can suppress entry of a processing liquid into the device region 90 due to collision between an old processing liquid not having been shaken off during one rotation of the substrate 9 and a newly supplied processing liquid. This structure removes an old rinse liquid containing DHF readily from the front surface peripheral area 911 and allows the substrate 9 to be acted on by a new rinse liquid not containing DHF, thereby enhancing efficiency of the rinsing process. In this structure, as described above, droplets of a processing liquid or the like repelled by the front surface peripheral area 911 are blown off toward an outer side of the substrate 9 with a flow of the gas discharged from the gas nozzle 50d, so that entry of these droplets or the like into the device region 90 is suppressed sufficiently.

<iii. Liquid Shake-Off Process>

Next, liquid shake-off process is performed (step S210). A specific flow of this liquid shake-off process is the same as that of step S203. Specifically, the substrate 9 is rotated for a given time (liquid moving step) while discharge of a fluid toward the front surface peripheral area 911 is stopped. Next, gas is discharged from the gas nozzle 50d of the discharge head 51 in the processing position toward the front surface peripheral area 911 of the rotated substrate 9 (blow-away step). After elapse of a certain time (such as five seconds) from start of discharge of the gas from the discharge head 51, discharge of the gas from the discharge head 51 is stopped.

This liquid shake-off process shakes off much of the processing liquid remaining on the front surface peripheral area 911 (specifically, the rinse liquid remaining on the front surface peripheral area 911 for not having been shaken off from the substrate 9 in the rinsing process in step S209).

<4-3. Processing Surface Switching Process>

When the front surface peripheral process (step S2) is finished, the processing surface switching process (step S3) is performed thereafter. In the processing surface switching process, in preparation for the back surface process (step S4), the rotation speed of the spin base 21 (specifically, the rotation speed of the substrate 9) is reduced (lowered) (see FIGS. 19 and 20). Specifically, the rotation speed of the spin base 21 is changed from the speed applied during the front surface peripheral process to a rotation speed lower than this speed (low rotation speed). More specifically, the frequency of rotation of the spin base 21 is changed from 600 rpm applied during the front surface peripheral process to a sufficiently lower frequency of rotation (such as 20 rpm).

As described above, during the processing surface switching process, supply of the cover gas continues from the cover gas nozzle 41 toward the center and its vicinity of the front surface 91 of the substrate 9.

<4-4. Back Surface Process>

Figure 19:
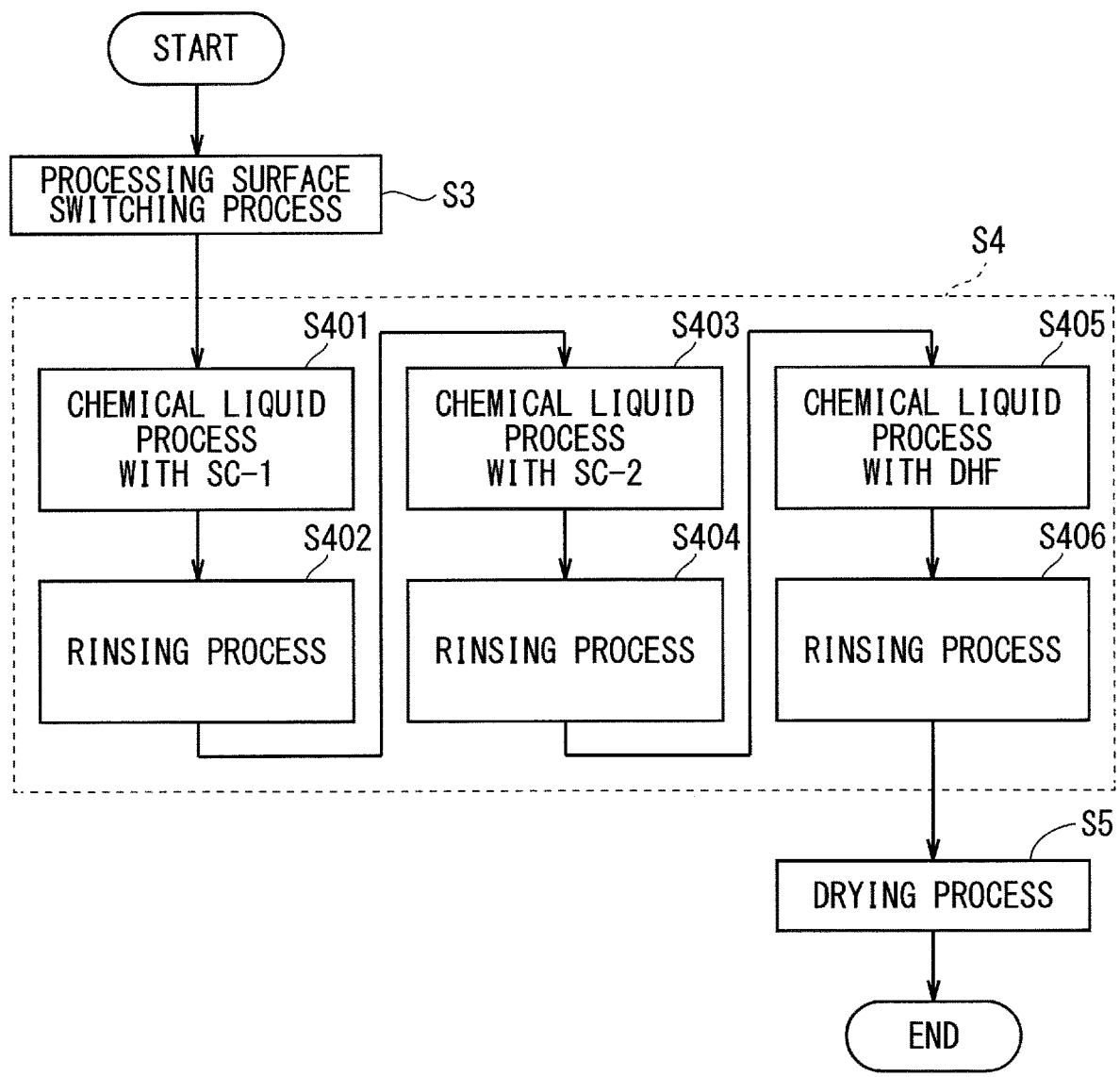
FIG. 19 shows a flow of process including back surface process.
Figure 20:
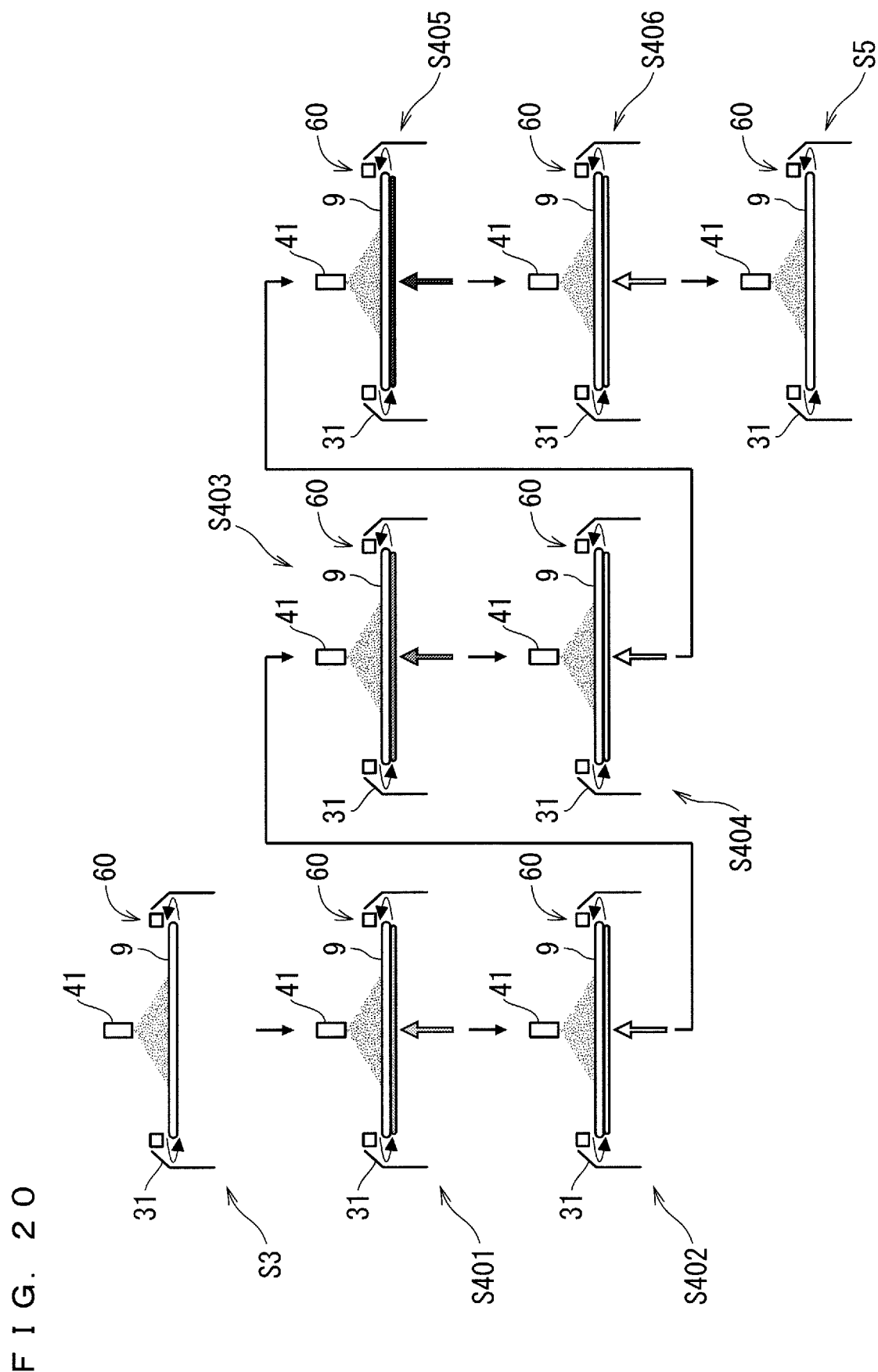
FIG. 20 explains the process including the back surface process.

When the processing surface switching process (step S3) is finished, the back surface process (step S4) is performed thereafter. The back surface process is described below by referring to FIGS. 19 and 20. FIG. 19 shows a flow of the back surface process. FIG. 20 explains the back surface process. In FIG. 20, some of the elements of the substrate processing apparatus 1 performing each step of the back surface process are schematically shown.

As described above, supply of the cover gas continues from the cover gas nozzle 41 toward the center and its vicinity of the front surface 91 of the substrate 9 during the back surface process. This protects the device region 90 from an atmosphere of a processing liquid supplied to the back surface 92, for example.

Before a processing liquid is supplied to the back surface 92, the rotation speed of the spin base 21 is reduced to 20 rpm applied as a low frequency of rotation. The "low rotation speed" mentioned herein is a speed that makes a processing liquid supplied to the back surface 92 of the substrate 9 spread throughout the back surface 92 and prevents the processing liquid from going into the front surface 91 of the substrate 9 while the substrate 9 is rotated at this rotation speed. This "low rotation speed" more specifically corresponds to a frequency of rotation of 20 rpm or less, for example.

First, the back surface 92 of the substrate 9 is subjected to chemical liquid process with SC-1 (step S401). More specifically, SC-1 is discharged from the back surface side discharge port 82 toward the center and its vicinity of the back surface 92 of the substrate 9 rotated at the low speed. At this time, SC-1 is discharged at a rate of from 500 to 2000 mL/min, for example. Centrifugal force generated as a result of rotation of the substrate 9 makes SC-1 supplied to the center and its vicinity of the back surface 92 spread throughout the back surface 92, so that the chemical liquid process with SC-1 proceeds on the back surface 92 of the substrate 9. This chemical liquid process with SC-1 removes a thin film formed on the back surface 92 of the substrate 9 (etching process). After elapse of a certain time (such as 20 seconds) from start of discharge of SC-1, discharge of SC-1 from the back surface side discharge port 82 is stopped.

Next, rinsing process is performed (step S402). More specifically, while the substrate 9 continues to be rotated at the low speed, a rinse liquid is discharged from the back surface side discharge port 82 toward the center and its vicinity of the back surface 92 of the substrate 9. Centrifugal force generated as a result of rotation of the substrate 9 makes the rinse liquid supplied to the center and its vicinity of the back surface 92 spread throughout the back surface 92, thereby washing out the processing liquid (here, SC-1) adhering to the back surface 92. After elapse of a certain time (such as 20 seconds) from start of discharge of the rinse liquid, discharge of the rinse liquid from the back surface side discharge port 82 is stopped.

Next, the back surface 92 of the substrate 9 is subjected to chemical liquid process with SC-2 (step S403). More specifically, while the substrate 9 continues to be rotated at the low speed, SC-2 is discharged from the back surface side discharge port 82 toward the center and its vicinity of the back surface 92 of the substrate 9. Centrifugal force generated as a result of rotation of the substrate 9 makes SC-2 supplied to the center and its vicinity of the back surface 92 spread throughout the back surface 92, so that the chemical liquid process with SC-2 proceeds on the back surface 92. This chemical liquid process with SC-2 removes a metallic composition (such as Mo or Co) and the like adhering to the back surface 92 of the substrate 9 (cleaning process). After elapse of a certain time (such as 20 seconds) from start of discharge of SC-2, discharge of SC-2 from the back surface side discharge port 82 is stopped.

Next, rinsing process is performed (step S404). A specific flow of this rinsing process is the same as that of step S402. Specifically, while the substrate 9 continues to be rotated at the low speed, a rinse liquid is discharged from the back surface side discharge port 82 toward the center and its vicinity of the back surface 92 of the substrate 9. Centrifugal force generated as a result of rotation of the substrate 9 makes the rinse liquid supplied to the center and its vicinity of the back surface 92 spread throughout the back surface 92, thereby washing out the processing liquid (here, SC-2) adhering to the back surface 92. After elapse of a certain time (such as 20 seconds) from start of discharge of the rinse liquid, discharge of the rinse liquid from the back surface side discharge port 82 is stopped.

Next, the back surface 92 of the substrate 9 is subjected to chemical liquid process with DHF (step S405). More specifically, while the substrate 9 continues to be rotated at the low speed, DHF is discharged from the back surface side discharge port 82 toward the center and its vicinity of the back surface 92 of the substrate 9. At this time, DHF is discharged at a rate of from 500 to 2000 mL/min, for example. Centrifugal force generated as a result of rotation of the substrate 9 makes DHF supplied to the center and its vicinity of the back surface 92 spread throughout the back surface 92, so that the chemical liquid process with DHF proceeds on the back surface 92. This chemical liquid process with DHF removes a thin film formed on the back surface 92 of the substrate 9 (etching process). After elapse of a certain time (such as 10 seconds) from start of discharge of DHF, discharge of DHF from the back surface side discharge port 82 is stopped.

Next, rinsing process is performed (step S406). A specific flow of this rinsing process is the same as that of step S402. Specifically, while the substrate 9 continues to be rotated at the low speed, a rinse liquid is discharged from the back surface side discharge port 82 toward the center and its vicinity of the back surface 92 of the substrate 9. Centrifugal force generated as a result of rotation of the substrate 9 makes the rinse liquid supplied to the center and its vicinity of the back surface 92 spread throughout the back surface 92, thereby washing out the processing liquid (here, DHF) adhering to the back surface 92. After elapse of a certain time (such as 22.5 seconds) from start of discharge of the rinse liquid, discharge of the rinse liquid from the back surface side discharge port 82 is stopped. Then, the back surface process is completed.

<4-5. Drying Process>

When the back surface process (step S4) is finished, the drying process (step S5) is performed thereafter. In the drying process, while discharge of a processing liquid toward the substrate 9 is stopped, the rotation speed of the spin base 21 (specifically, the rotation speed of the substrate 9) is increased from the low rotation speed applied during the back surface process to a relatively high rotation speed for drying (see FIGS. 19 and 20). This shakes off the rinse liquid gradually adhering to the back surface 92 of the substrate 9 to eventually dry the substrate 9. As described above, supply of the cover gas from the cover gas nozzle 41 toward the center and its vicinity of the front surface 91 of the substrate 9 continues during the drying process. This protects the device region 90 from an atmosphere of a processing liquid, for example.

After elapse of a certain time from start of rotation of the substrate 9 at the speed for drying, rotation of the spin base 21 is stopped. Then, discharge of the gas from the cover gas nozzle 41 is stopped and the cover gas nozzle 41 is moved to the retreat position. Further, the discharge head 51, the cup 31, and the semicircular members 61 and 62 are moved to their respective retreat positions. Then, the group of the holding members 25 releases the substrate 9 and the transport robot CR takes the substrate 9 out of the substrate processing apparatus 1. Then, the series of processes on the substrate 9 is completed.

<5. First Effect>

There has conventionally been a substrate processing apparatus that supplies a processing liquid to a rotated substrate to process the substrate with the liquid (see Japanese Patent Application Laid-Open Nos. 11-260780 (1999), 9-260277 (1997), 2006-060252, 2011-238967 and 8-1064 (1996), for example).

In the substrate processing apparatus that supplies a processing liquid to a rotated substrate to process the substrate with the liquid, part of the processing liquid supplied onto the substrate may be splashed from the substrate and part of the splashed processing liquid may adhere to the substrate again after bouncing off a member placed outside (such as a cup to receive the processing liquid splashed from the substrate). This might become a cause for contamination of the substrate.

As an example, while a processing liquid is supplied to an area of the substrate (front surface peripheral area) outside a region (device region) where a device pattern is to be formed, part of the processing liquid supplied to the front surface peripheral area may be splashed from the front surface peripheral area and part of the splashed processing liquid may adhere to the device region. This might become a cause for yield reduction due to a failure in the device pattern.

Accordingly, a technique that can suppress re-adhesion of part of a processing liquid splashed from a substrate has been desired.

In the first preferred embodiment, the clearance space V between the nozzle 50 of the discharge head 51 and the cup 31 is filled at least partially with part of the guard member 60. This structure reduces space that might permit floating for example of mist of a processing liquid splashed from the substrate 9 by space filled with the guard member 60. This reduction of the space reduces the probability of re-adhesion for example of mist of the processing liquid to the substrate 9. Specifically, this can suppress re-adhesion of part of the processing liquid to the substrate 9 after the processing liquid is splashed from the substrate 9.

In the first preferred embodiment, at least part of the lower surface 602 of the guard member 60 is placed to face the front surface peripheral area 911 of the substrate 9 held on the spin base 21. Thus, in this structure, a processing liquid splashed from the substrate 9 is guided along the lower surface 602 of the guard member 60 into the cup 31. This can sufficiently suppress re-adhesion of the splashed processing liquid to the substrate 9.

In the first preferred embodiment, the lower surface 602 of the guard member 60 is placed in the same height as or below the discharge surface 502 for a processing liquid of the nozzle 50. This structure can particularly effectively suppress re-adhesion of a processing liquid to the substrate 9 after the processing liquid is splashed from the substrate 9.

In the first preferred embodiment, the lower surface 602 of the guard member 60 is placed in the same height as or below the lower surface 3011 of the top edge portion 301 of the cup 31. This structure can particularly effectively suppress re-adhesion of a processing liquid to the substrate 9 after the processing liquid is splashed from the substrate 9.

In the first preferred embodiment, the guard member 60 is a ring-shaped member extending along the entire circumference of the front surface peripheral area 911 of the substrate 9. This structure can suppress re-adhesion of a processing liquid to the substrate 9 throughout the circumferential direction of the substrate 9 after the processing liquid is splashed from the substrate 9.

In the first preferred embodiment, the guard member 60 is formed by making abutting contact between the semicircular members 61 and 62 in a pair as separate members at respective end faces thereof in their circumferential directions. While the substrate 9 is not held on the spin base 21, the semicircular members 61 and 62 in a pair are spaced from each other and are placed in their retreat positions outside a transport path for the substrate 9. In this structure, the guard member 60 can retreat easily to the outside of the transport path for the substrate 9.

In the first preferred embodiment, while the substrate 9 is not held on the spin base 21, the cup 31 and the semicircular members 61 and 62 are placed in their retreat positions below the upper surface of the spin base 21. In this structure, by rotating the spin base 21 on which the substrate 9 is not held while supplying a cleaning liquid to the spin base 21, the spin base 21, the cup 31, and both the semicircular members 61 and 62 can be cleaned together.

In the first preferred embodiment, at least part of the nozzle 50 of the discharge head 51 is housed in the cut 605 of the guard member 60. This structure can place the nozzle 50 above the front surface peripheral area 911 of the substrate 9 while preventing interference between the guard member 60 and the nozzle 50.

<6. Second Effect>

Not many device patterns (circuit patterns) are formed to reach a place as near as an end face of a substrate. In many cases, a device pattern is formed on a surface region spaced inward a given width from an end face of a substrate.

However, in a film formation step performed to form a device pattern, a film may be formed on a back surface of a substrate or may be formed to reach a place of a front surface of the substrate outside a region (device region) where the device pattern is to be formed. The film formed on the back surface or on a front surface peripheral area is not only being unnecessary but it might also become a cause for various troubles. As an example, the film formed on the back surface or on the front surface peripheral area might come unstuck during a process step. This may bring about the danger for example of yield reduction or a trouble in a substrate processing apparatus.

This may be handled by the process of removing a film by etching formed on a back surface and a front surface peripheral area of a substrate. As an example, Japanese Patent Application Laid-Open No. 2004-006672 describes an apparatus to etch a back surface and a front surface peripheral area of a substrate by supplying a processing liquid to the back surface of the substrate rotated in a horizontal posture and making the processing liquid go into the front surface peripheral area of the substrate. Relevant techniques are described for example in Japanese Patent Application Laid-Open Nos. 2008-300454, 2009-070946, 2006-210580, 2006-229057, 2003-264168 and 2001-060576.

The technique described in Japanese Patent Application Laid-Open 2004-006672 can process a back surface and a front surface peripheral area of a substrate simultaneously. This advantageously achieves a high throughput. This in turn makes it very difficult to control the amount of a processing liquid to go into the front surface peripheral area, so that processing the front surface peripheral area properly might become infeasible.

Accordingly, a technique that can properly process both a front surface peripheral area and a back surface and simultaneously while suppressing reduction of a throughput has been desired.

In the first preferred embodiment, while the substrate 9 stays on the spin base 21, the front surface peripheral area 911 of this substrate 9 and the back surface 92 of this substrate 9 are processed continuously. This can process both the front surface peripheral area 911 and the back surface 92 of the substrate 9 while suppressing reduction of a throughput. Meanwhile, in the first preferred embodiment, a processing liquid is discharged toward each of the front surface peripheral area 911 of the substrate 9 and the back surface 92 of the substrate 9. This can stably control the amount of the processing liquid held on each of the front surface peripheral area 911 and the back surface 92. Additionally, in the first preferred embodiment, a processing liquid is supplied toward the back surface 92 after a processing liquid is supplied to the front surface peripheral area 911. Thus, if the processing liquid supplied to the front surface peripheral area 911 is splashed from the substrate 9 and then adheres to the back surface 92, the processing liquid adhering to the back surface 92 can be washed away with the processing liquid supplied to the back surface 92 of the substrate 9 thereafter. In this way, the first preferred embodiment can process both the front surface peripheral area 911 and the back surface 92 properly. As a result, in the first preferred embodiment, the front surface peripheral area 911 and the back surface 92 can be processed properly while reduction of a throughput is suppressed.

In the first preferred embodiment, the rotation speed of the substrate 9 is reduced before a processing liquid is discharged toward the back surface 92. Specifically, the substrate 9 is rotated at a relatively high speed while a processing liquid is supplied to the front surface peripheral area 911 and is rotated at a relatively low speed while the processing liquid is supplied to the back surface 92. This structure can suppress entry of the processing liquid supplied to the front surface peripheral area 911 into the device region 90. This structure can also suppress entry of the processing liquid supplied to the back surface 92 into the device region 90 to be caused if this processing liquid goes into the front surface 91 of the substrate 9.

In the first preferred embodiment, the clearance space V between the discharge head 51 and the cup 31 is filled at least partially with part of the guard member 60. This structure reduces space that might permit floating for example of mist of a processing liquid splashed from the substrate 9 by space filled with the guard member 60. This reduction of the space reduces the probability of re-adhesion for example of mist of the processing liquid to the substrate 9. Specifically, this can suppress re-adhesion of part of the processing liquid to the substrate 9 after the processing liquid is splashed from the substrate 9.

<7. Modifications of Liquid Bounce Suppressing Unit 6>

<7-1. Liquid Bounce Suppressing Unit 6a According to First Modification>

Figure 21:
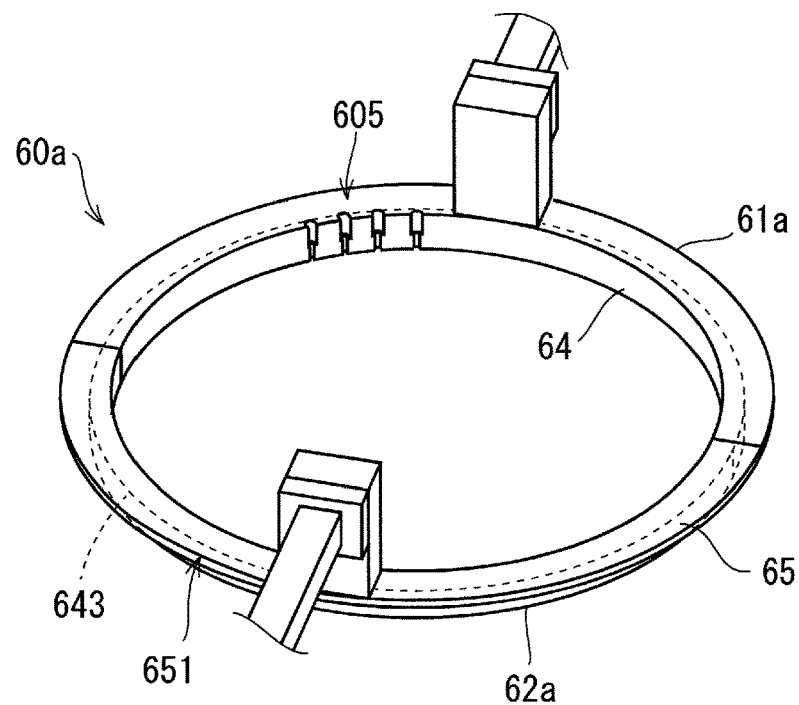
FIG. 21 is a perspective view of a guard member according to a first modification.
Figure 22:
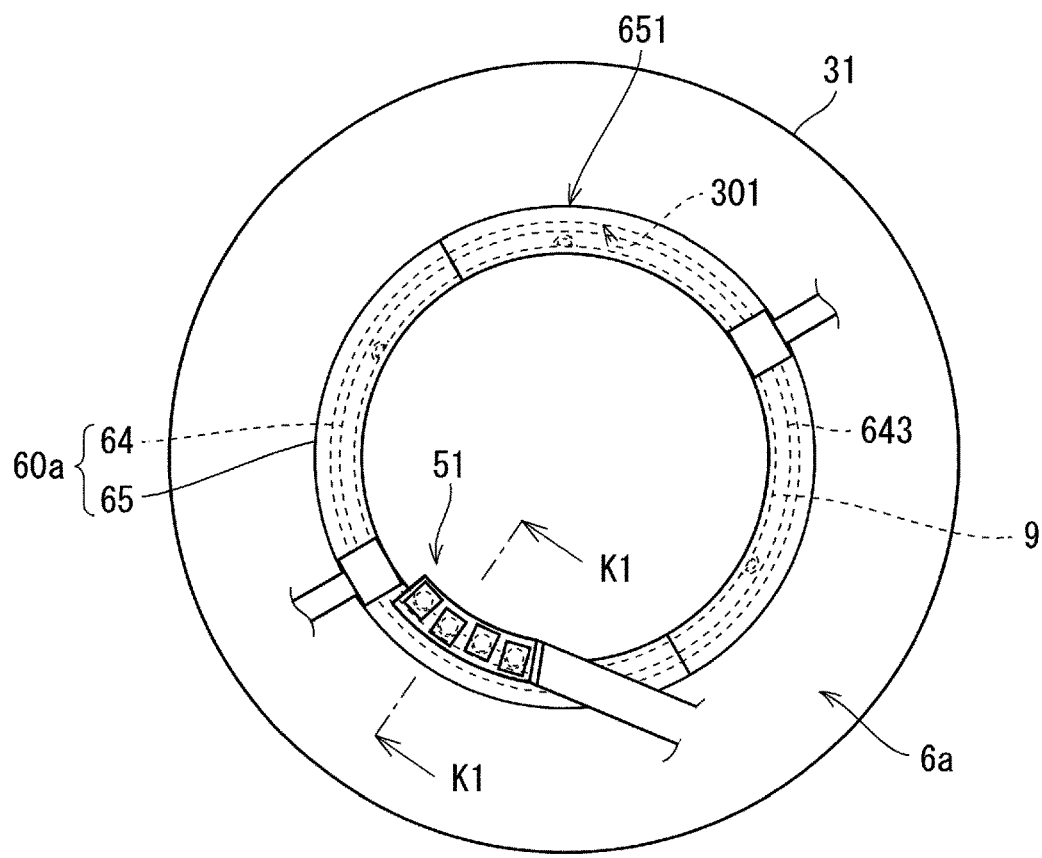
FIG. 22 is a plan view taken from above showing a condition where the cup, the guard member according to the first modification, and the discharge head for peripheral area are placed in their respective processing positions.
Figure 23:
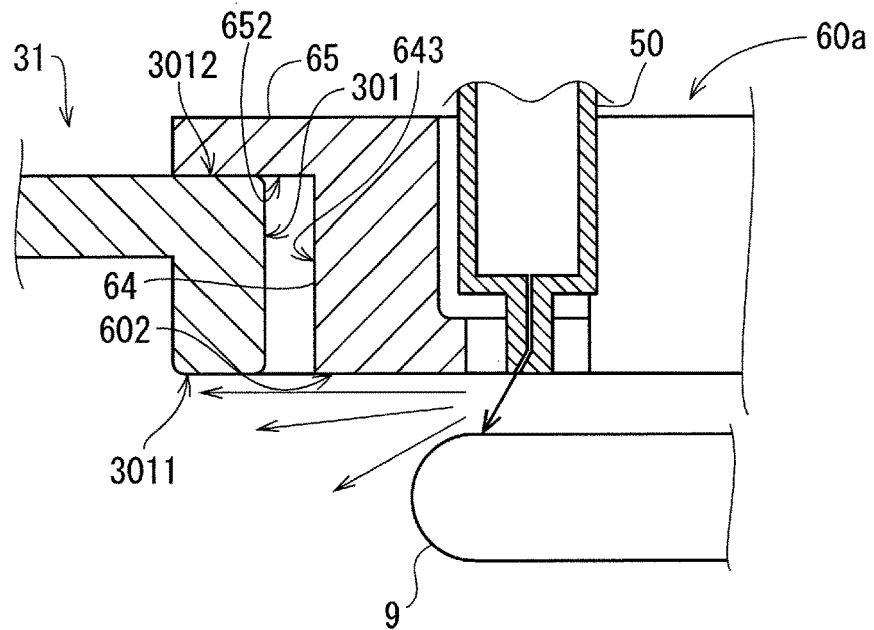
FIG. 23 is a side sectional view taken in a direction indicated by arrows K1 of FIG. 22.

A liquid bounce suppressing unit 6a according to a first modification differs in the structure of a guard member from the liquid bounce suppressing unit 6 of the first preferred embodiment and does not differ from the liquid bounce suppressing unit 6 in the other structures. A guard member 60a of the liquid bounce suppressing unit 6a is described in detail by referring to FIGS. 21 to 23. FIG. 21 is a perspective view of the guard member 60a. FIG. 22 is a plan view taken from above showing a condition where the cup 31, the guard member 60a, and the discharge head 51 are placed in their respective processing positions. FIG. 23 is a side sectional view taken in a direction indicated by arrows K1 of FIG. 22. In the following description, structures same as those of the first preferred embodiment are identified by the same signs and will not be described repeatedly.

The guard member 60a has a body 64 as a ring-shaped member extending along the entire circumference of the front surface peripheral area 911 of the substrate 9, and a canopy 65 projecting from an outer circumferential wall 643 of the body 64. Like the guard member 60 of the first preferred embodiment, the guard member 60a is formed by making abutting contact between multiple arcuate members (in the example of the drawings, semicircular members 61a and 62a in a pair) as separate members at respective end faces thereof in their circumferential directions.

The body 64 is formed of the same member as the guard member 60 of the first preferred embodiment.

The canopy 65 is a flat plate ring-shaped member having an inner diameter same as the inner diameter of the body 64 and an outer diameter larger than the outer diameter of the body 64. At least an inner circumferential portion of a lower surface 652 of the canopy 65 is attached to the upper surface of the body 64, thereby forming the canopy 65 and the body 64 integrally.

The outer diameter of the canopy 65 is larger than the inner diameter of the top edge portion 301 of the cup 31. Accordingly, if the guard member 60a in a processing position is viewed from above, an outer circumferential edge 651 of the canopy 65 projecting from the outer circumferential wall 643 (that is outside the end face 93 of the substrate 9 and extends along the entire circumference of the top edge portion 301 of the cup 31 while being close to the top edge portion 301 in a noncontact manner) of the body 64 extends along the entire circumference of the top edge portion 301 of the cup 31 in a position outside the top edge portion 301.

While the guard member 60a is in the processing position, part of the lower surface 652 of the canopy 65 projecting outward from the body 64 is in abutting contact with the upper surface 3012 of the top edge portion 301 of the cup 31 (cup 31 in the processing position) throughout the circumference of the canopy 65. Specifically, the lower surface 652 of the canopy 65 and the upper surface 3012 of the cup 31 are in abutting contact without a gap therebetween. Accordingly, a gap between the body 64 and the top edge portion 301 of the cup 31 (gap of a ring shape as viewed from above) is covered (preferably, blocked) with the canopy 65.

In the guard member 60a according to the first modification, the canopy 65 covers the gap between the top edge portion 301 of the cup 31 and the outer circumferential wall 643 of the body 64. This structure makes the canopy 65 block a route of a processing liquid to be splashed into the substrate 9 after flowing upward in this gap. This can sufficiently suppress re-adhesion of a processing liquid to the substrate 9 after the processing liquid is splashed from the substrate 9.

<7-2. Liquid Bounce Suppressing Unit 6b According to Second Modification>

Figure 24:
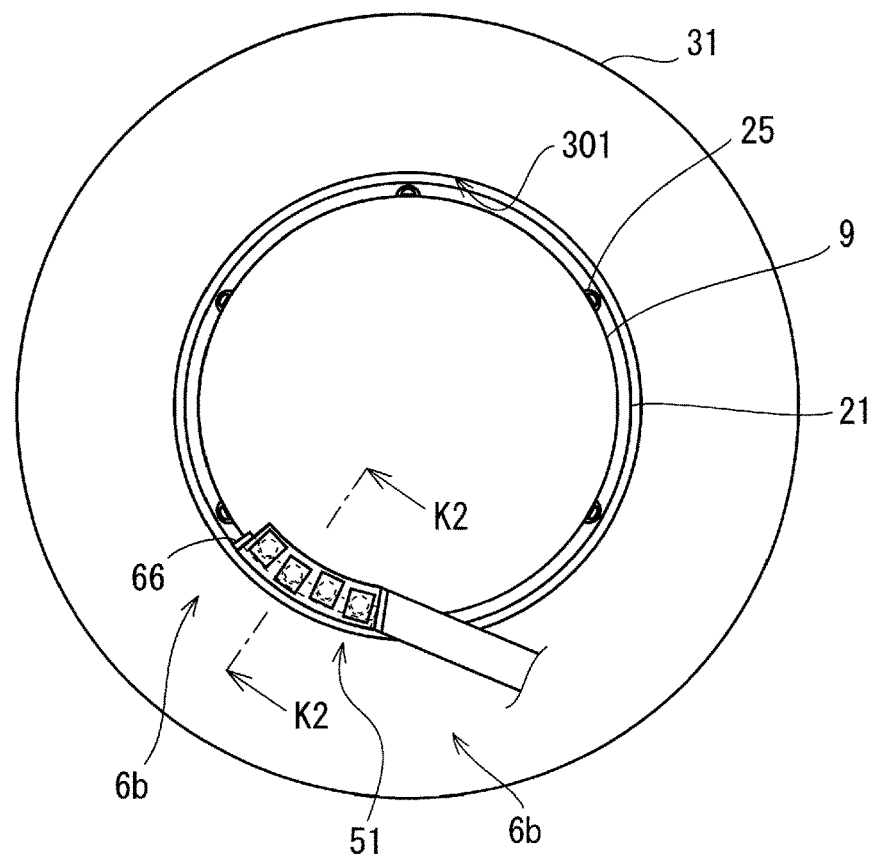
FIG. 24 is a plan view taken from above showing a condition where the cup, a liquid bounce suppressing unit according to a second modification, and the discharge head for peripheral area are placed in their respective processing positions.
Figure 25:
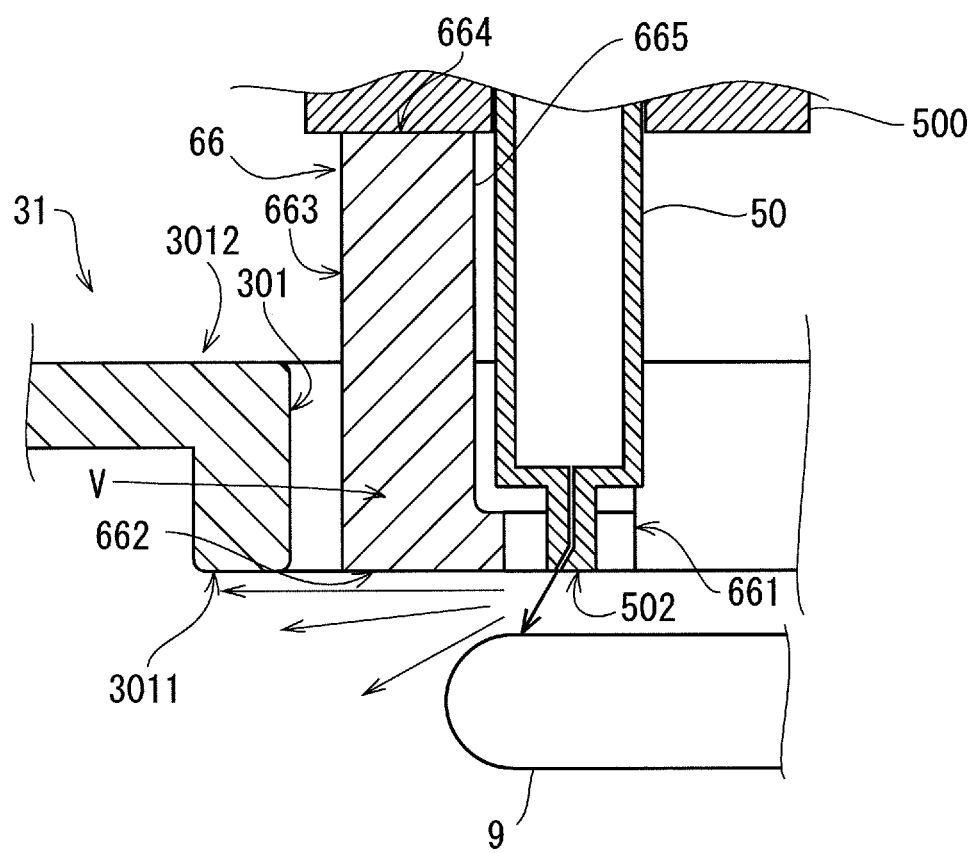
FIG. 25 is a side sectional view taken in a direction indicated by arrows K2 of FIG. 24.

The following describes a liquid bounce suppressing unit 6b according to a second modification by referring to FIGS. 24 and 25. FIG. 24 is a plan view taken from above showing a condition where the cup 31, the liquid bounce suppressing unit 6b, and the discharge head 51 are placed in their respective processing positions. FIG. 25 is a side sectional view taken in a direction indicated by arrows K2 of FIG. 24. In the following description, structures same as those of the first preferred embodiment are identified by the same signs and will not be described repeatedly.

The liquid bounce suppressing unit 6b includes an arcuate member 66 curving in an arcuate form extending along part of the front surface peripheral area 911 of the substrate 9. The arcuate member 66 is formed by cutting the guard member 60 according to the first preferred embodiment (or guard member 60a according to the first modification) in the middle of the circumferential direction into an arcuate pattern. It is preferable that the length of the arcuate member 66 in the circumferential direction be substantially the same as or slightly longer than the length of the discharge head 51 (length in a direction where the nozzles 50 are arranged).

The arcuate member 66 is fixed to the discharge head 51. More specifically, the arcuate member 66 is fixed to the discharge head 51 for example by attaching an upper surface 664 of the arcuate member 66 to the lower surface of the support part 500 of the discharge head 51. An inner circumferential wall 661 of the arcuate member 66 is given a cut 665 where at least part of the discharge head 51 is housed. While the discharge head 51 is in the processing position, at least part of the discharge head 51 is housed in the cut 665. It is preferable that a lower surface 662 of the arcuate member 66 be in the same height as or below the discharge surface 502 of the discharge head 51.

The arcuate member 66 is fixed to the discharge head 51. Accordingly, when the discharge head 51 is placed in the processing position, the arcuate member 66 fixed to the discharge head 51 is placed in a position (processing position) close to the front surface peripheral area 911 of the substrate 9 in a noncontact manner held on the spin base 21.

If the arcuate member 66 in the processing position is viewed from above, an outer circumferential wall 663 of the arcuate member 66 is outside the end face 93 of the substrate 9 and extends along the top edge portion 301 of the cup 31 while placed in a position close to the top edge portion 301 in a noncontact manner. If the arcuate member 66 in the processing position is viewed from above, the inner circumferential wall 661 of the arcuate member 66 is inside the end face 93 of the substrate 9 while at least an inner circumferential portion of the lower surface 662 of the arcuate member 66 is placed to face the front surface peripheral area 911 of the substrate 9 held on the spin base 21. A distance determined in this condition between the lower surface 662 of the arcuate member 66 and the front surface 91 of the substrate 9 held on the spin base 21 is in a range of from 1 to 1.5 mm, for example. In this condition, it is preferable that the lower surface 662 be in the same height as or below the lower surface 3011 of the top edge portion 301 of the cup 31 in the processing position.

In the second modification, while the discharge head 51 is placed in the processing position, clearance space V between the discharge head 51 and the top edge portion 301 of the cup 31 is filled at least partially with the arcuate member 66. This structure reduces space that might permit floating for example of mist of a processing liquid splashed from the substrate 9 by space filled with the arcuate member 66. This reduction of the space reduces the amount of floating of the processing liquid near the substrate 9. This reduces the probability of re-adhesion for example of mist of the processing liquid to the substrate 9. Specifically, this can suppress re-adhesion of part of the processing liquid to the substrate 9 after the processing liquid is splashed from the substrate 9.

In particular, at least part of the lower surface 662 of the arcuate member 66 is placed to face the front surface peripheral area 911. Thus, a processing liquid splashed from the substrate 9 is guided along the lower surface 662 of the arcuate member 66 into the cup 31. This can sufficiently suppress re-adhesion of the splashed processing liquid to the substrate 9.

In particular, the lower surface 662 of the arcuate member 66 is placed in the same height as or below the discharge surface 502 of the discharge head 51. The present inventors confirmed that this particularly effectively acts to suppress re-adhesion of a processing liquid to the substrate 9 (particularly, device region 90) after the processing liquid is splashed from the substrate 9. The present inventors also confirmed that placing the lower surface 662 of the arcuate member 66 in the same height as or below the lower surface 3011 of the top edge portion 301 of the cup 31 also particularly effectively acts to suppress re-adhesion of a processing liquid to the substrate 9 (particularly, device region 90) after the processing liquid is splashed from the substrate 9.

In the second modification, the arcuate member 66 is fixed to the discharge head 51, so that the arcuate member 66 can be moved together with the discharge head 51. This eliminates the need for separately providing a drive mechanism to move the arcuate member 66 and a drive mechanism to move the discharge head 51, thereby simplifying the structure of the apparatus.

Second Preferred Embodiment

<1. Structure of Substrate Processing Apparatus 1>

Figure 26:
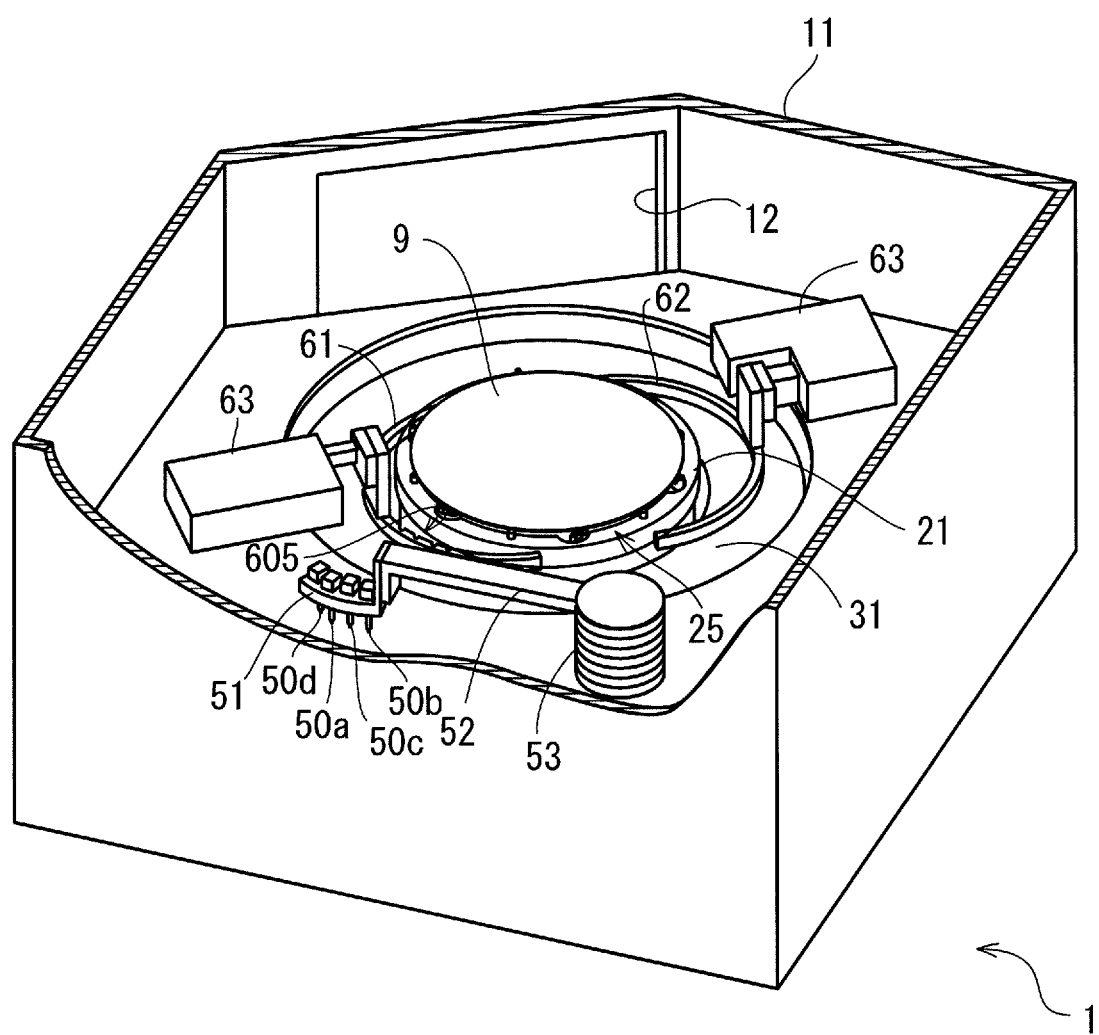
Figure 28:
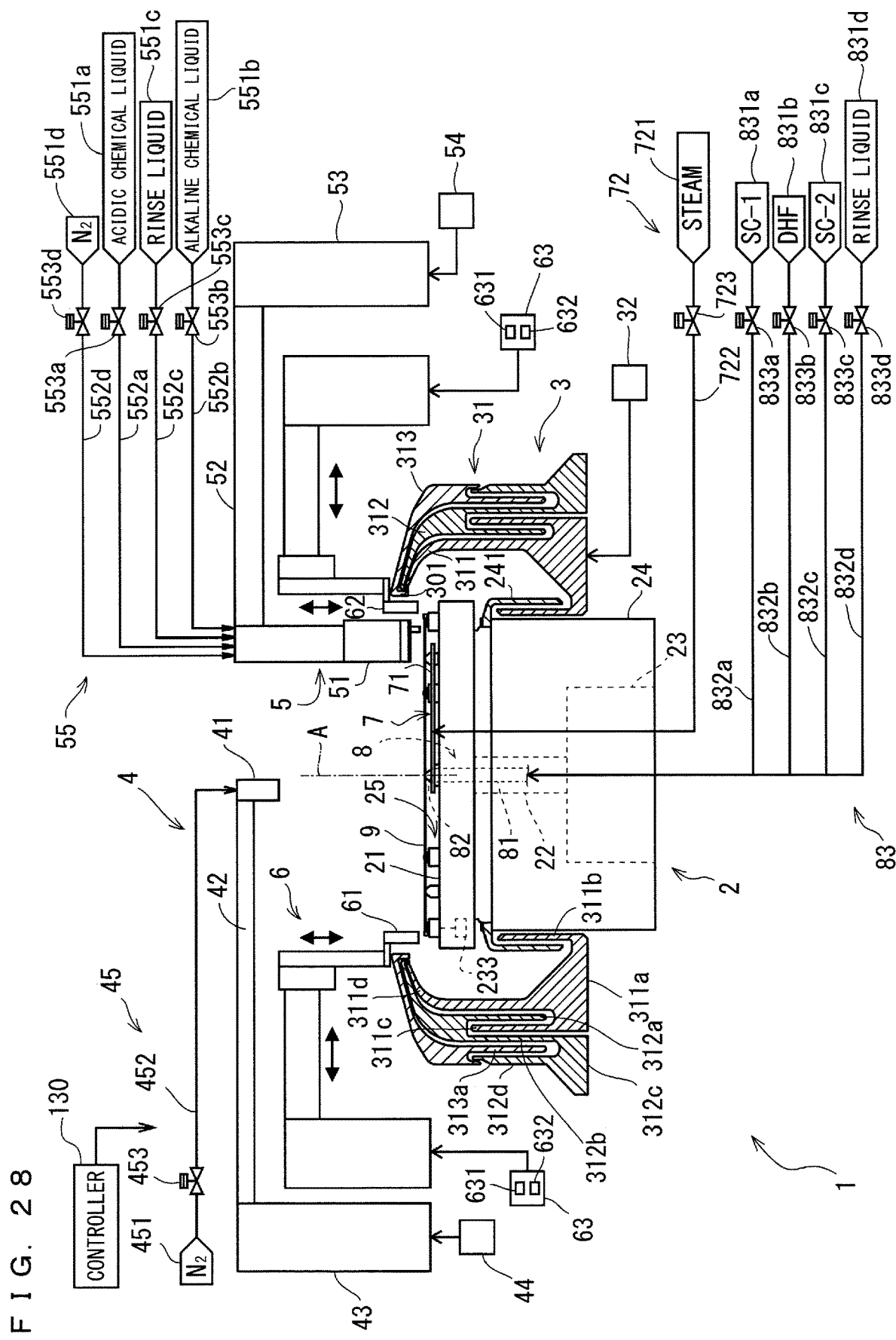
FIG. 28 is a schematic view describing the structure of the substrate processing apparatus.

The following describes the structure of a substrate processing apparatus 1 of a second preferred embodiment by referring to FIGS. 26 to 28. FIG. 26 is a diagrammatic perspective view of the substrate processing apparatus 1 showing a condition where semicircular members 61 and 62 forming a guard member 60, a cup 31, and a discharge head 51 for peripheral area are placed in their respective retreat positions. FIG. 27 is also a diagrammatic perspective view of the substrate processing apparatus 1 showing a condition where the guard member 60, the cup 31, and the discharge head 51 are placed in their respective processing positions. FIG. 28 is a schematic view describing the structure of the substrate processing apparatus 1. The substrate processing apparatus 1 is installed for example on the aforementioned substrate processing system 100. The substrate processing apparatus 1 is to process the aforementioned substrate 9, for example.

In the following description, a "processing liquid" includes a "chemical liquid" used in chemical liquid process, and a "rinse liquid" used in rinsing process performed to wash out the chemical liquid.

The substrate processing apparatus 1 includes a spin chuck 2, an anti-splash unit 3, a front surface protecting unit 4, a peripheral processing unit 5, a liquid bounce suppressing unit 6, a heat processing unit 7, and a lower surface processing unit 8. Each of these units 2 to 8 is electrically connected to a controller 130 and operates in response to an order from the controller 130. The respective structures of the anti-splash unit 3, the front surface protecting unit 4, the peripheral processing unit 5, the liquid bounce suppressing unit 6, and the heat processing unit 7 are the same as those of the first preferred embodiment. The lower surface processing unit 8 is an element to process the lower surface of the substrate 9 held on the spin base 21 by a holding unit 25 by discharging a processing liquid toward this lower surface.

The specific structure of the lower surface processing unit 8 is the same for example as that of the back surface processing unit 8 described in the first preferred embodiment. The substrate 9 described herein is to be held on the spin base 21 by the holding unit 25 described later with a front surface 91 of the substrate 9 pointed upward. In the second preferred embodiment, the substrate 9 on the spin base 21 is not always required to be in a posture with the front surface 91 pointed upward but it may also be in a posture with a back surface 92 thereof pointed upward.

<Spin Chuck 2>

The spin chuck 2 is a substrate holder to hold the substrate 9 in a substantially horizontal posture while pointing the front surface 91 of the substrate 9 upward, for example. The spin chuck 2 rotates the substrate 9 about a vertical rotary axis A passing through the center of the front surface 91 of the substrate 9.

The spin chuck 2 includes a spin base 21 that is a circular plate member slightly larger than the substrate 9. A rotary shaft part 22 is coupled to a lower surface central area of the spin base 21. The rotary shaft part 22 is placed in a posture that makes the shaft line of the rotary shaft part 22 extend in the vertical direction. The rotary shaft part 22 is connected to a rotary drive part (such as a motor) 23 to rotate the rotary shaft part 22 about the shaft line of the rotary shaft part 22. The rotary shaft part 22 and the rotary drive part 23 are housed in a tubular casing 24. The spin chuck 2 further includes the holding unit 25 to hold the substrate 9 in a horizontal posture in a position slightly spaced from the upper surface of the spin base 21. The holding unit 25 is described in detail later.

In this structure, the rotary drive part 23 rotates the rotary shaft part 22 while the holding unit 25 holds the substrate 9 above the spin base 21. This rotates the spin base 21 about a shaft center extending in the vertical direction, thereby rotating the substrate 9 held on the spin base 21 about the vertical rotary axis A passing through the center of the plane of the substrate 9.

The holding unit 25 and the rotary drive part 23 are electrically connected to the controller 130 and operate under control by the controller 130. Specifically, the controller 130 controls timing of holding the substrate 9 onto the spin base 21, timing of releasing the substrate 9 from the spin base 21, and a mode of rotation of the spin base 21 (more specifically, timing of starting rotation, timing of finishing the rotation, and the frequency of rotation (specifically, a rotation speed), for example).

<2. Holding Unit 25>

<2-1. Overall Structure>

Figure 29:
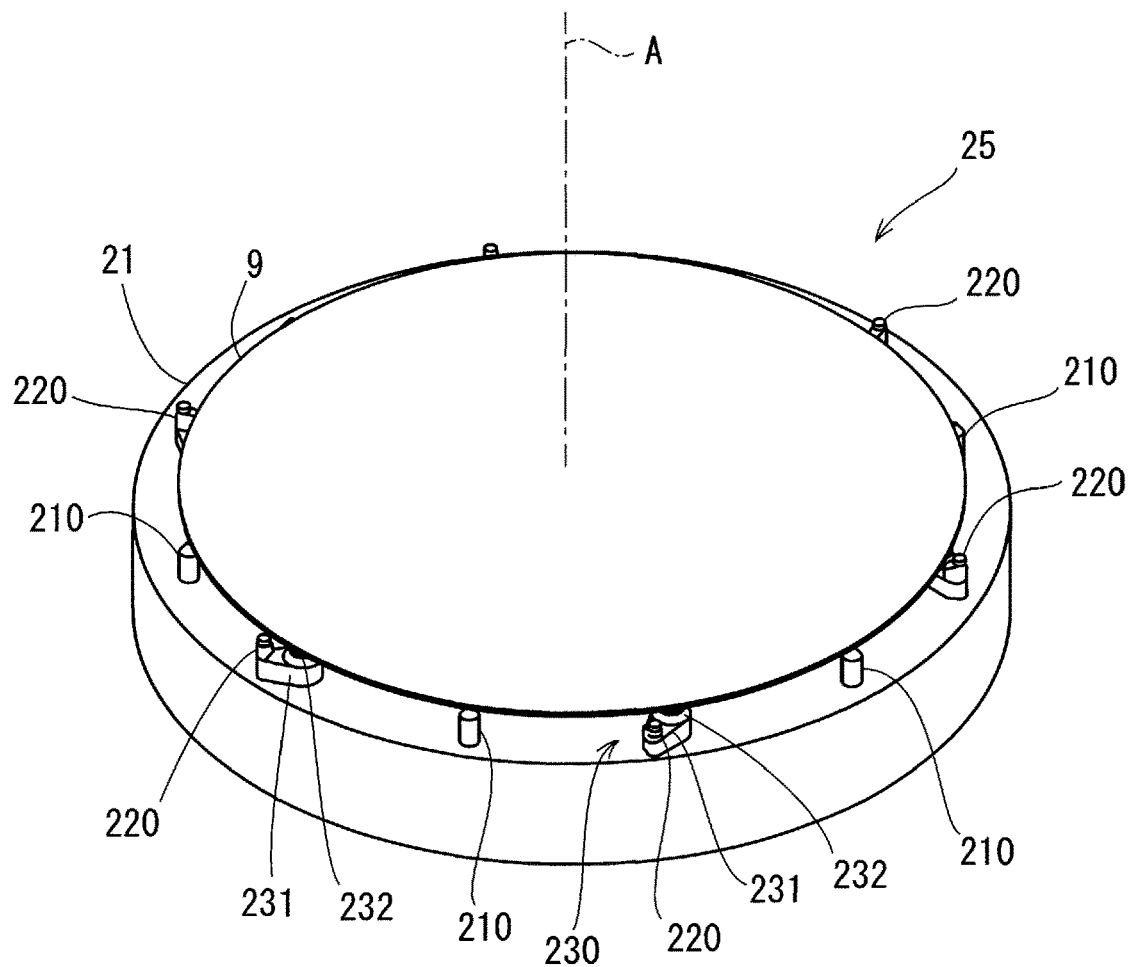
FIG. 29 is a perspective view of a spin base as viewed from obliquely above.

The following describes the overall structure of the holding unit 25 by referring for example to FIG. 29. FIG. 29 is a perspective view of the spin base 21 as viewed from obliquely above.

The holding unit 25 includes multiple (six, for example) first abutting members 210 spaced from each other by a given distance (by the same distance, for example) in a peripheral area and its vicinity of the upper surface of the spin base 21. As viewed from above, the first abutting members 210 are arranged on a circumference extending substantially along the periphery of the substrate 9.

The holding unit 25 includes multiple (six, for example) second abutting members 220 spaced from each other by a given distance (by the same distance, for example) in the peripheral area and its vicinity of the upper surface of the spin base 21. As viewed from above, the second abutting members 220 are also arranged on a circumference extending substantially along the periphery of the substrate 9. The second abutting members 220 and the first abutting members 210 are spaced from each other and arranged alternately in the circumferential direction of the spin base 21. As an example, as viewed from the rotary axis A of the spin base 21, each of the second abutting members 220 is placed in a position that is almost the midway between the first abutting members 210 on opposite sides of this second abutting member 220.

The holding unit 25 further includes a switching part 230 to make a switch between a first holding condition where the first abutting members 210 hold the substrate 9 and a second holding condition where the second abutting members 220 hold the substrate 9.

The following describes each of the elements 210, 220 and 230 of the holding unit 25 in detail.

<2-2. First Abutting Member 210>

Figure 30:
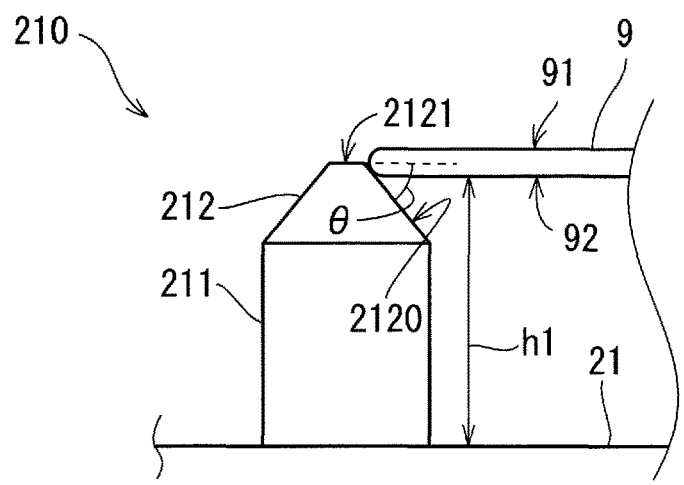
FIG. 30 shows a first abutting member as viewed from its lateral side.

The first abutting member 210 is described by referring to FIGS. 29 and 30. FIG. 30 shows the first abutting member 210 as viewed from its lateral side.

All the first abutting members 210 have the same structure. Each of the first abutting members 210 has a body part 211 standing upright on the upper surface of the spin base 21, and an end part 212 continuously extending from the upper side of the body part 211. The body part 211 has the shape for example of a vertically extending circular column with a lower end fixed to the spin base 21. The end part 212 has a shape formed by cutting off an upper portion of a circular cone parallel to its bottom surface. An upper end surface 2121 of the end part 212 is a horizontal surface. A side surface 2120 (hereinafter also called a "tilted side surface") of the end part 212 is tilted relative to a horizontal plane. It is preferable that the tilted side surface 2120 of the end part 212 be at an angle θ of 45 degrees or more relative to the horizontal plane.

It is preferable that a surface of the first abutting member 210 be hydrophobic. This can be achieved for example by using a hydrophobic resin (such as PTFE (polytetrafluoroethylene)) for forming the first abutting member 210 itself or by processing the surface of the first abutting member 210 to make this surface hydrophobic.

Each of the first abutting members 210 abuts on the substrate 9 from a position obliquely below this substrate 9. More specifically, each of the first abutting members 210 abuts on a lower edge area of the substrate 9 (non-flat surface area connecting the lower surface (in the example of the drawings, back surface 92) and an end face 93 of the substrate 9) at its tilted side surface 2120. Specifically, the first abutting member 210 abuts on the substrate 9 only from a position obliquely below this substrate 9 and does not abut on the substrate 9 from a position lateral to the substrate 9. While each of the first abutting members 210 abuts on the substrate 9, the upper surface (in the example of the drawings, front surface 91) of this substrate 9 is in a position above the upper end surface 2121 of the first abutting member 210.

If all the first abutting members 210 abut on the substrate 9 from respective positions obliquely below this substrate 9, the position of the substrate 9 is determined in a horizontal plane while the substrate 9 is held in a substantially horizontal posture in a position spaced from the upper surface of the spin base 21 (specifically, in a position spaced by a given distance h1 from the upper surface of the spin base 21) (condition shown in FIGS. 29, 32 and 33). The upper surface of the substrate 9 held by the first abutting members 210 is in a position above the upper end (more specifically, upper end surface 2121) of each of the first abutting members 210. The distance h1 is greater than the thickness of the hand 121 of the transport robot CR. A condition where the first abutting members 210 hold the substrate 9 is also hereinafter called a "first holding condition."

As described above, in the first holding condition, the upper surface of the substrate 9 is in a position above the end surface 2121 of each of the first abutting members 210. In this structure, a processing liquid supplied to the lower surface of the substrate 9 finds difficulty in going into the upper surface of the substrate 9 through the first abutting member 210 in back surface process described later.

In the first holding condition, each of the first abutting members 210 abuts on the substrate 9 at its tilted side surface 2120. This structure makes liquid gathering in clearance space between the lower surface of the substrate 9 and the tilted side surface 2120 drop downward easily through the tilted side surface 2120. Specifically, an accumulation of liquid is unlikely to be formed in this clearance space. This can suppress the occurrence of a situation where an accumulation of liquid is formed in this clearance space and this accumulation goes into the upper surface of the substrate 9. A processing liquid supplied to the lower surface of the substrate 9 drops downward through the tilted side surface 2120. This flow of a processing liquid (flow of a processing liquid that guides a processing liquid downward supplied to the lower surface of the substrate 9) can remove a processing liquid supplied to the lower surface of the substrate 9 readily from the substrate 9 without making the processing liquid go into the upper surface of the substrate 9.

In particular, if the angle θ formed between the tilted side surface 2120 and a horizontal plane is 45 degrees or more, liquid gathering in the clearance space between the lower surface of the substrate 9 and the tilted side surface 2120 drops downward readily through the tilted side surface 2120. This can sufficiently suppress the occurrence of a situation where an accumulation of liquid is formed in this clearance space and this accumulation goes into the upper surface of the substrate 9. This can also remove a processing liquid supplied to the lower surface of the substrate 9 particularly readily from the substrate 9 without making the processing liquid go into the upper surface of the substrate 9. Additionally, if the angle θ formed between the tilted side surface 2120 and a horizontal plane is 45 degrees or more, a contact area between the substrate 9 and the tilted side surface 2120 becomes small. This also suppresses going of a processing liquid into the upper surface of the substrate 9 to be caused by the capillary action.

In particular, if the surface of the first abutting member 210 is hydrophobic, a processing liquid finds difficulty in adhering to the first abutting member 210 while an accumulation of liquid is unlikely to be formed in the clearance space between the lower surface of the substrate 9 and the first abutting member 210 (as a more specific example, tilted side surface 2120). This can suppress the occurrence of a situation where an accumulation of liquid is formed in this clearance space and this accumulation goes into the upper surface of the substrate 9.

<2-3. Second Abutting Member 220>

Figure 31:
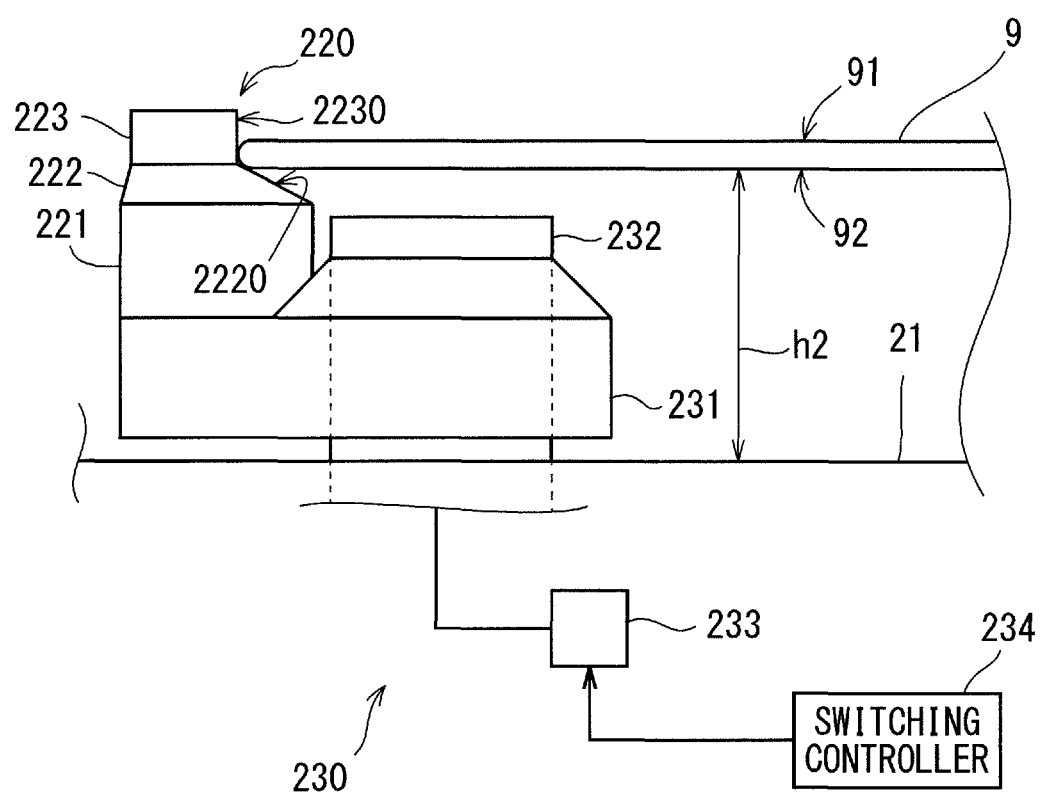
FIG. 31 shows a second abutting member as viewed from its lateral side.

The second abutting member 220 is described by referring to FIGS. 29 and 31. FIG. 31 shows the second abutting member 220 as viewed from its lateral side.

All the second abutting members 220 have the same structure. Each of the second abutting members 220 has a body part 221 standing upright on the upper surface of a base 231 (described later) provided on the spin base 21, a lower abutting part 222 continuously extending from the upper side of the body part 221, and a lateral abutting part 223 continuously extending from the upper side of the lower abutting part 222. The body part 221 is a columnar part with a lower end fixed to the base 231. The lower abutting part 222 has the shape for example of an ellipse as viewed from above. The longitudinal direction of the lower abutting part 222 is substantially the same as a direction toward the rotary axis A of the spin base 21 (see FIG. 32). A side surface of the lower abutting part 222 is a surface (tilted surface) 2220 tilted in a direction where it gets farther in a higher position from the rotary axis A. The lateral abutting part 223 has the shape for example of a circular column extending in the vertical direction while extending continuously from the upper edge of the tilted surface 2220 in a place near an end portion of the lower abutting part 222 on a side away from the rotary axis A as viewed from above. Specifically, the second abutting member 220 has the tilted surface 2220 tilted relative to a horizontal plane, and a vertical side surface 2230 vertically extending continuously from the upper end of the tilted surface 2220.

Each of the second abutting members 220 abuts on the substrate 9 from a position lateral to the substrate 9 and a position obliquely below this substrate 9. More specifically, each of the second abutting members 220 abuts on a lower edge area of the substrate 9 at its tilted surface 2220 and abuts on the end face 93 of the substrate 9 at its vertical side surface 2230. While each of the second abutting members 220 abuts on the substrate 9, the upper surface (in the example of the drawings, front surface 91) of this substrate 9 is in a position below the upper end of the second abutting member 220.

Figure 34:
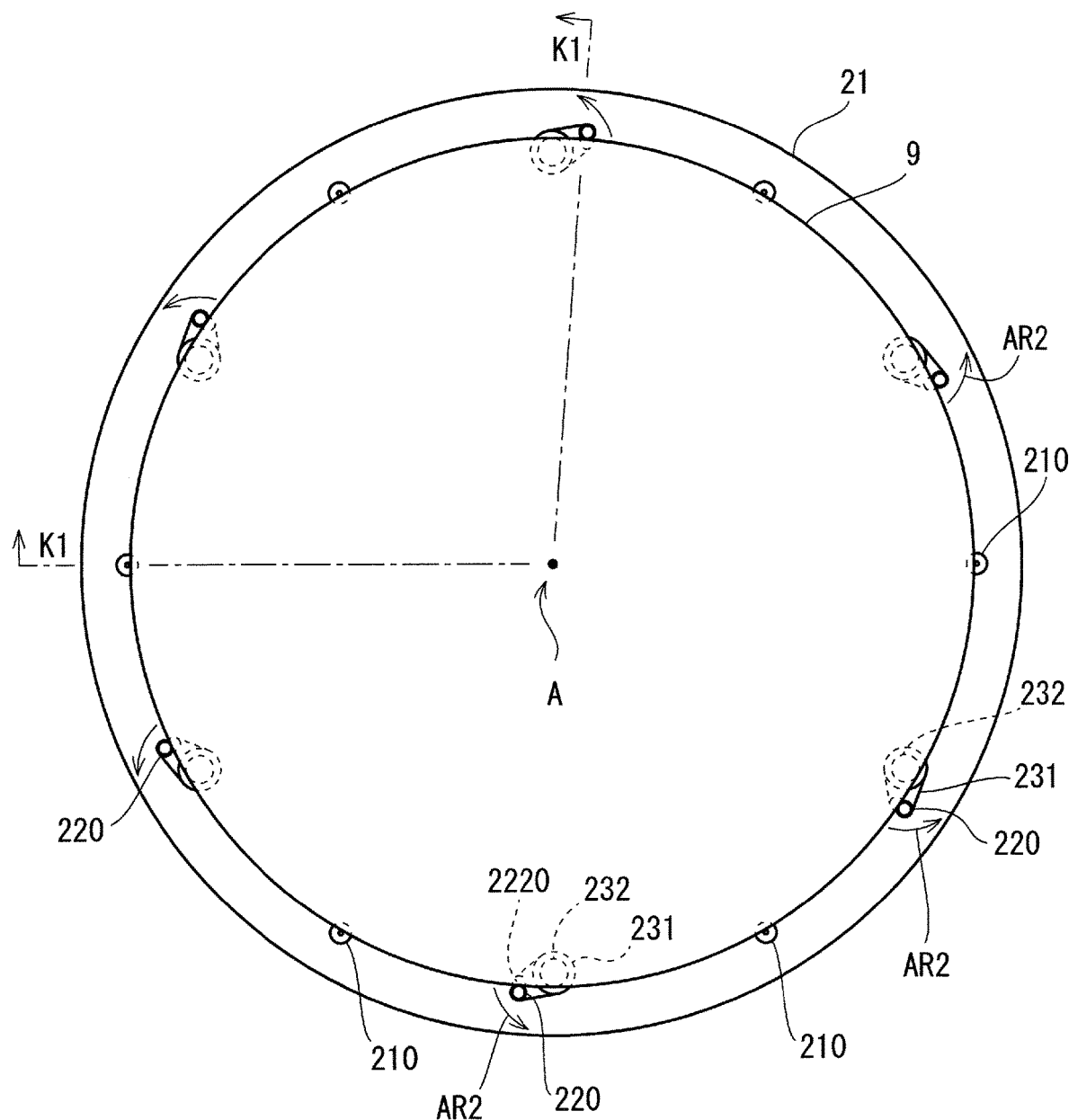
FIG. 34 is a plan view showing a second holding condition.
Figure 35:
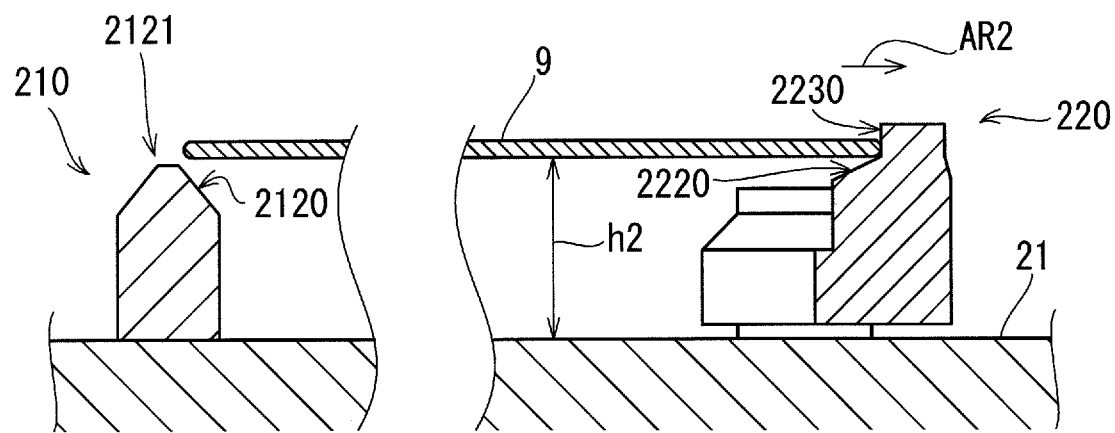
FIG. 35 is a side sectional view taken in a direction indicated by arrows K1 of FIG. 34.

If all the second abutting members 220 abut on the substrate 9 from respective positions lateral to and obliquely below this substrate 9, the position of the substrate 9 is determined in a horizontal plane while the substrate 9 is held in a substantially horizontal posture in a position spaced from the upper surface of the spin base 21 (specifically, in a position spaced by a given distance h2 from the upper surface of the spin base 21) (condition shown in FIGS. 34 and 35). As clearly described later, the distance h2 is longer than the distance h1 between the substrate 9 held by the first abutting members 210 and the spin base 21. A condition where the second abutting members 220 hold the substrate 9 is also hereinafter called a "second holding condition."

As described above, in the second holding condition, the vertical side surface 2230 of each of the second abutting members 220 abuts on the end face 93 of the substrate 9. Specifically, the second abutting members 220 grip the substrate 9 while holding the substrate 9 from the end face 93. Even if the substrate 9 is rotated at a relatively high speed, this structure makes position shift of the substrate 9 unlikely in a horizontal plane.

<2-4. Switching Part 230>

<i. Structure>

As described above, the switching part 230 makes a switch between the first holding condition where the first abutting members 210 hold the substrate 9 and the second holding condition where the second abutting members 220 hold the substrate 9. The structure of the switching part 230 is described below by referring to FIGS. 29 and 31.

The switching part 230 has the base 231 that supports each of the second abutting members 220, a rotary shaft part 232 that supports each of the bases 231 above the spin base 21 such that the base 231 can rotate about the rotary shaft part 232, a drive part 233 to rotate the rotary shaft parts 232 together, and a switching controller 234 to control the drive part 233. The switching controller 234 is realized for example by the controller 130.

The rotary shaft part 232 is provided to penetrate through an upper plate of the spin base 21 vertically. The rotary shaft part 232 supports the base 231 at the upper end thereof (specifically, above the upper surface of the spin base 21) such that the base 231 can rotate about the rotary shaft part 232. The rotary shaft part 232 is coupled to the drive part 233 at the lower end thereof (specifically, below the upper plate of the spin base 21). The rotary shaft part 232 is coupled to the base 231 decentered from the second abutting member 220 as viewed from above. In this structure, in response to rotation of the rotary shaft part 232 by the drive part 233 under control by the switching controller 234, the base 231 rotates about the rotary shaft part 232 to move the second abutting member 220 in a direction where the second abutting member 220 gets closer to or farther from the rotary axis A of the spin base 21 (in a direction where the second abutting member 220 gets closer to or farther from the end face 93 of the substrate 9 on the spin base 21). This direction of the movement of the second abutting member 220 is substantially the same as the longitudinal direction of the tilted surface 2220 (direction connecting the upper edge and the lower edge of the tilted surface 2220).

<ii. Mode of Switching>

The switching part 230 moves each of the second abutting members 220 in the direction where the second abutting member 220 gets closer to or farther from the periphery of the substrate 9 on the spin base 21, thereby making a switch between the first and second holding conditions. A mode of this switching is described next by referring to FIGS. 32 to 35. FIG. 32 is a plan view showing the first holding condition. FIG. 33 is a side sectional view taken in a direction indicated by arrows K1 of FIG. 32. FIG. 34 is a plan view showing the second holding condition. FIG. 35 is a side sectional view taken in a direction indicated by arrows K1 of FIG. 34.

a. Switch from First Holding Condition to Second Holding Condition

In the first holding condition where the first abutting members 210 support the substrate 9 (condition shown in FIGS. 32 and 33), the switching controller 234 controls the drive part 233 to rotate the rotary shaft parts 232 together in a direction (first direction AR1) where the second abutting members 220 get closer to the end face 93 of the substrate 9. Then, each of the first abutting members 210 moves away from the substrate 9 and each of the second abutting members 220 abuts on the substrate 9 to make a switch to the second holding condition where the second abutting members 220 support the substrate 9 (condition shown in FIGS. 34 and 35). Specifically, the first holding condition is switched to the second holding condition.

A mode of a switch from the first holding condition to the second holding condition is described in detail. When the rotary shaft parts 232 are rotated together in the first direction AR1 in a condition where the substrate 9 is held by the first abutting members 210 (condition shown in FIGS. 32 and 33), each of the second abutting members 220 gets closer to the substrate 9 and then forms abutting contact from a position obliquely below the substrate 9 with the lower edge area of the substrate 9 at the lower edge and its vicinity of its tilted surface 2220. When the rotary shaft parts 232 are rotated further, a position of each tilted surface 2220 where the second abutting member 220 abuts on the substrate 9 moves toward the upper edge of the tilted surface 2220. This moves up the substrate 9 while maintaining the substrate 9 in a horizontal posture. As a result, the substrate 9 is separated from each of the first abutting members 210. When the position of each tilted surface 2220 where the second abutting member 220 abuts on the substrate 9 reaches the upper edge of the tilted surface 2220 and the end face 93 of the substrate 9 then abuts on the vertical side surface 2230 of each of the second abutting members 220, rotation of the rotary shaft parts 232 is stopped. This makes a switch to the second holding condition where the second abutting members 220 hold the substrate 9 (condition shown in FIGS. 34 and 35).

As clearly seen from the foregoing description, in the second holding condition, the first abutting members 210 are separated from the substrate 9. In this structure, a processing liquid supplied to the lower surface of the substrate 9 finds difficulty in going into the upper surface of the substrate 9 through the first abutting members 210.

It is preferable that the height of the first abutting member 210 (specifically, a distance between the upper surface of the spin base 21 and the upper end surface 2121 of the first abutting member 210) be smaller than the distance h2 between the substrate 9 held by the second abutting members 220 and the spin base 21. In this structure, the substrate 9 held by the second abutting members 220 and each of the first abutting members 210 are separated enough, thereby sufficiently suppressing going of a processing liquid supplied to the lower surface of the substrate 9 into the upper surface of the substrate 9 through the first abutting member 210.

b. Switch from Second Holding Condition to First Holding Condition

In the second holding condition where the second abutting members 220 support the substrate 9 (condition shown in FIGS. 34 and 35), the switching controller 234 controls the drive part 233 to rotate the rotary shaft parts 232 together in a direction (second direction AR2) where the second abutting members 220 get farther from the end face 93 of the substrate 9. Then, each of the second abutting members 220 is separated from the substrate 9 and each of the first abutting members 210 abuts on the substrate 9 to make a switch to the first holding condition where the first abutting members 210 support the substrate 9 (condition shown in FIGS. 32 and 33). Specifically, the second holding condition is switched to the first holding condition.

A mode of a switch from the second holding condition to the first holding condition is described in detail. When the rotary shaft parts 232 are rotated together in the second direction AR2 opposite the first direction AR1 in a condition where the second abutting members 220 support the substrate 9 (condition shown in FIGS. 34 and 35), the vertical side surface 2230 of each of the second abutting members 220 is separated from the end face 93 of the substrate 9. When the rotary shaft parts 232 are rotated further, a position on each tilted surface 2220 where the second abutting member 220 abuts on the substrate 9 moves toward the lower edge of the tilted surface 2220. This moves down the substrate 9 while maintaining the substrate 9 in a horizontal posture. When the substrate 9 reaches a horizontal position spaced by the given distance h1 from the upper surface of the spin base 21, the tilted side surface 2120 of each of the first abutting members 210 abuts on the lower edge area of the substrate 9 from a position obliquely below the substrate 9. As a result, the substrate 9 is transferred from the second abutting members 220 to the first abutting members 210. When the rotary shaft parts 232 are rotated further, the tilted surface 2220 of each of the second abutting members 220 is completely separated from the substrate 9. When each of the second abutting members 220 is separated well from the substrate 9, rotation of the rotary shaft parts 232 is stopped.

Figure 32:
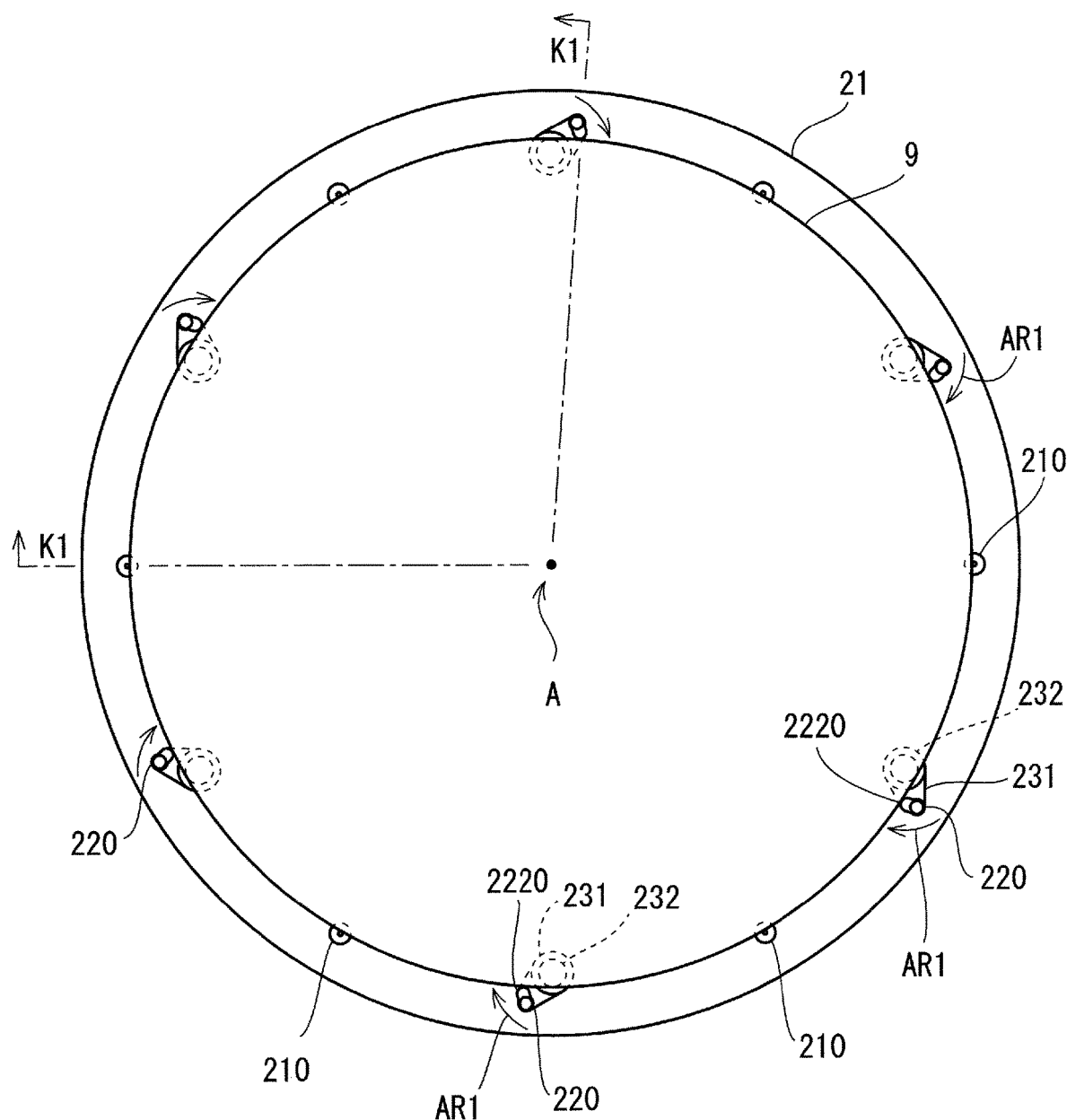
FIG. 32 is a plan view showing a first holding condition.
Figure 33:
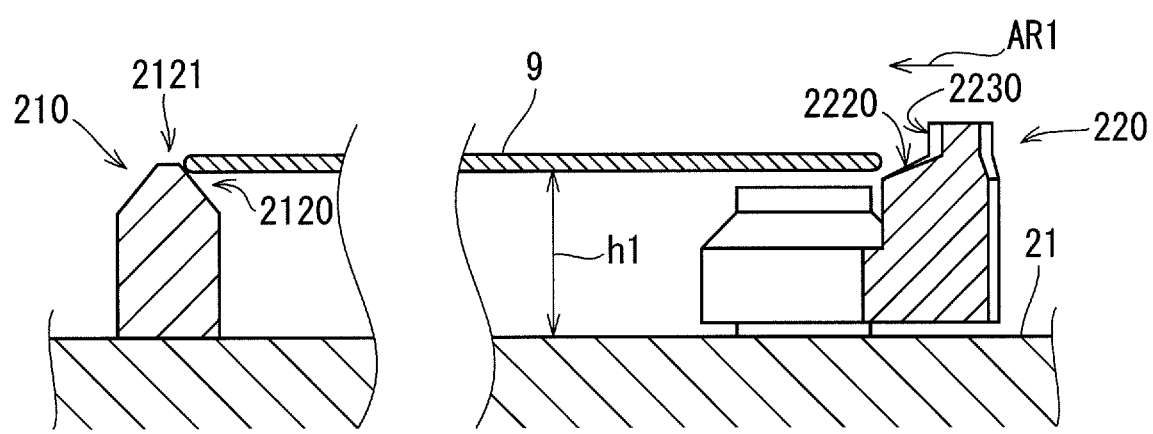
FIG. 33 is a side sectional view taken in a direction indicated by arrows K1 of FIG. 32.

This makes a switch to the first holding condition where the first abutting members 210 hold the substrate 9 (condition shown in FIGS. 32 and 33).

As clearly seen from the foregoing description, in the first holding condition, the second abutting members 220 are separated from the substrate 9. In this structure, a processing liquid supplied to the lower surface of the substrate 9 finds difficulty in going into the upper surface of the substrate 9 easily through the second abutting members 220. As described above, the upper surface of the substrate 9 is in a position above the upper end of the first abutting member 210. Thus, a processing liquid supplied to the lower surface of the substrate 9 still finds difficulty in going into the upper surface of the substrate 9 easily through the first abutting members 210. Specifically, in the first holding condition, going of a processing liquid into the upper surface of the substrate 9 is suppressed sufficiently.

<iii. Timing of Switching>

As described above, in the second preferred embodiment, the switching part 230 makes a switch between the first and second holding conditions by moving the second abutting member 220 in a direction where the second abutting member 220 gets closer to or farther from the periphery of the substrate 9 on the spin base 21. The switching part 230 (more specifically, switching controller 234) makes the first abutting members 210 hold the substrate 9 while the substrate 9 is rotated at a speed lower than a given threshold T, and makes the second abutting members 220 hold the substrate 9 while the substrate 9 is rotated at the threshold T or at a speed higher than the threshold T.

As an example, if the rotation speed of the substrate 9 held by the first abutting members 210 is increased to the threshold T or to a speed higher than the threshold T while a series of processes is being performed on the substrate 9, the switching part 230 makes a switch from the first holding condition to the second holding condition.

As another example, if the rotation speed of the substrate 9 held by the second abutting members 220 is reduced to a speed lower than the predetermined threshold T while a series of processes is being performed on the substrate 9, the switching part 230 makes a switch from the second holding condition to the first holding condition, where necessary.

It is preferable that a holding condition be switched (from the first holding condition to the second holding condition and from the second holding condition to the first holding condition) while the substrate 9 is rotated at a speed lower than the threshold T or while the substrate 9 is not rotated. It is also preferable that a holding condition be switched while the amount of a processing liquid adhering to the substrate 9 is relatively small (while the processing liquid is shaken off substantially completely from the substrate 9).

In this way, in the second preferred embodiment, the substrate 9 rotated at a speed lower than the threshold T is held by the first abutting members 210, whereas the substrate 9 rotated at the threshold T or a speed higher than the threshold T is held by the second abutting members 220. Specifically, the first abutting members 210 are holders (holders for low speed) to hold the substrate 9 rotated at a relatively low speed, whereas the second abutting members 220 are holders (holders for high speed) to hold the substrate 9 rotated at a relatively high speed.

With a lower rotation speed of the substrate 9, a processing liquid supplied to the lower surface of the substrate 9 becomes less likely to be blown away by centrifugal force so the processing liquid may go into the upper surface of the substrate 9 easily. Meanwhile, the substrate 9 is placed in the first holding condition where it is held by the first abutting members 210 while the substrate 9 is rotated at a relatively low speed. This suppresses going of a processing liquid supplied to the lower surface of the substrate 9 into the upper surface of the substrate 9. A low rotation speed of the substrate 9 makes the occurrence of a situation unlikely where the position of the substrate 9 is shifted in a horizontal plane. Thus, as long as the substrate 9 is rotated at a relatively low speed, the substrate 9 can be maintained in a certain position in a horizontal plane while the substrate 9 is placed in the first holding condition (specifically, while the substrate 9 is not gripped and is not held from the end face 93).

With a higher rotation speed of the substrate 9, the position of the substrate 9 may be shifted more easily in a horizontal plane. Meanwhile, the substrate 9 is placed in the second holding condition where it is held by the second abutting members 220 while the substrate 9 is rotated at a relatively high speed. This prevents the position shift of the substrate 9 in a horizontal plane. With a higher rotation speed of the substrate 9, a processing liquid supplied to the lower surface of the substrate 9 is blown away more easily by centrifugal force so the processing liquid finds difficulty in going into the upper surface of the substrate 9. Thus, as long as the substrate 9 is rotated at a relatively high speed, going of a processing liquid supplied to the lower surface of the substrate 9 through the second abutting member 220 into the front surface 91 becomes unlikely while the substrate 9 is placed in the second holding condition (specifically, while the second abutting member 220 abuts on the end face 93 of the substrate 9).

A specific value of the threshold T can be determined arbitrarily for example by an operator through the controller 130. In a specific example of timing of switching described below, the threshold T is determined to be 100 rpm, for example.

<3. Operation of Substrate Processing Apparatus 1>

The following describes the operation of the substrate processing apparatus 1. The substrate processing apparatus 1 performs a series of processes described below under control by the controller 130. The processes described below are merely examples of processes that can be performed by the substrate processing apparatus 1.

In the substrate processing apparatus 1, preparatory process (step S1), front surface peripheral process (step S2), processing surface switching process (step S3), back surface process (step S4), and drying process (step S5) are performed in the order named on one substrate 9, for example (FIG. 14). Each of the processes is described in detail below.

<3-1. Preparatory Process>

Figure 36:
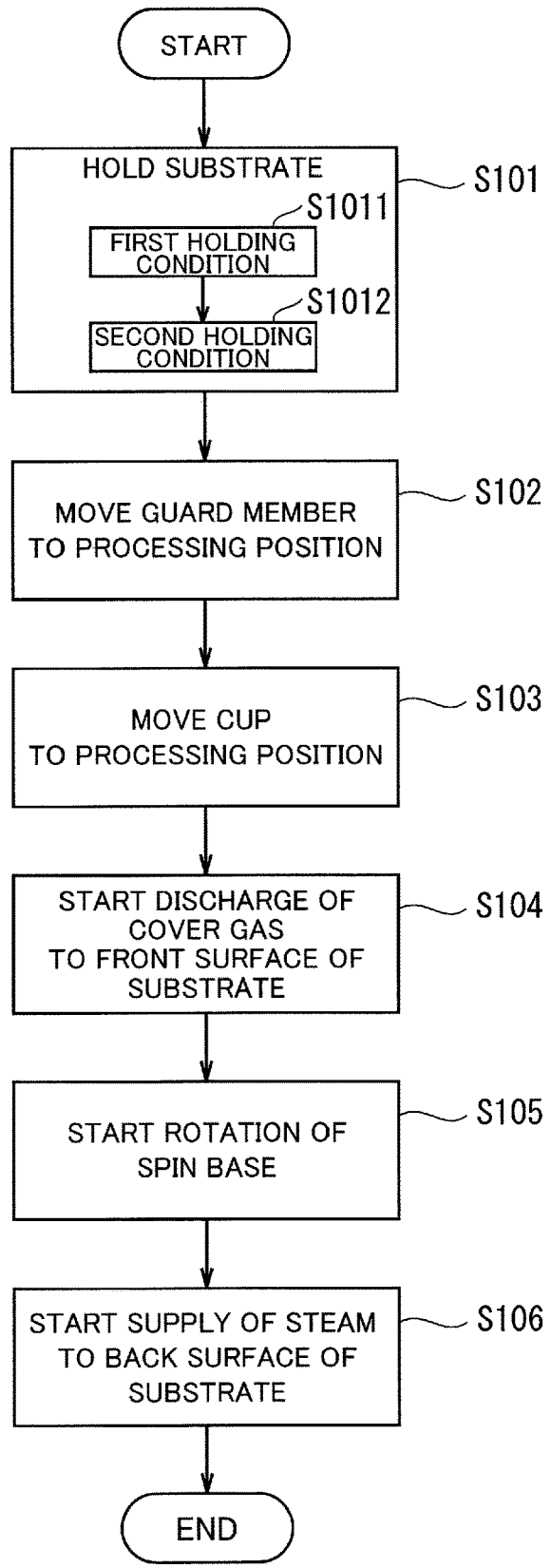
FIG. 36 shows a flow of preparatory process.

The preparatory process (step S1) is described below by referring to FIGS. 36 and 16. FIG. 36 shows a flow of the preparatory process. FIG. 16 explains the preparatory process. In FIG. 16, some of the elements of the substrate processing apparatus 1 performing each step of the preparatory process are schematically shown.

While the semicircular members 61 and 62, the cup 31, the discharge head 51, and the cover gas nozzle 41 are placed in their respective retreat positions, the transport robot CR places the substrate 9 on the spin base 21 and the holding unit 25 holds this substrate 9 on the spin base 21 (step S101).

The particulars of step S101 are as follows. First, the transport robot CR places the substrate 9 on the spin base 21 with the front surface 91 of the substrate 9 pointed upward. At this time, the second abutting members 220 are placed in positions away from the periphery of the substrate 9. The substrate 9 placed onto the spin base 21 by the transport robot CR is first held by the first abutting members 210 (step S1011).

When the substrate 9 is held by the first abutting members 210, the switching part 230 then makes a switch from the first holding condition to the second holding condition. As a result, the substrate 9 is held by the second abutting members 220 (step S1012). This corrects a position shift or inclination of the posture of the substrate 9 on the spin base 21. Even if the substrate 9 placed on the spin base 21 and held by the first abutting members 210 is in a position shifted from a desired position in a horizontal plane or slightly tilted from a horizontal posture, once making the second abutting members 220 hold the substrate 9 places the substrate 9 accurately in the desired position and places the substrate 9 in a horizontal posture.

Then, where necessary, the switching part 230 makes a switch from the second holding condition to the first holding condition. More specifically, if the rotation speed of the substrate 9 to be applied in process performed first after rotation of the substrate 9 is started is lower than the threshold T, the switching part 230 makes a switch from the second holding condition to the first holding condition at this stage. In the second preferred embodiment, the rotation speed of the substrate 9 to be applied in process (step S106) performed first after rotation of the substrate 9 is started is the threshold T or a speed higher than the threshold T. Accordingly, in the second preferred embodiment, the switching part 230 does not make a switch from the second holding condition to the first holding condition at this stage. Specifically, the second holding condition continues where the substrate 9 is held by the second abutting members 220.

After the substrate 9 is held on the spin base 21, the guard member 60 is moved to the processing position (step S102). More specifically, the up-and-down drive part 631 of the semicircular member drive unit 63 moves each of the semicircular members 61 and 62 in its retreat position to a position slightly above the upper surface of the spin base 21. Then, the advance-and-retreat drive part 632 of the semicircular member drive unit 63 moves each of the semicircular members 61 and 62 in a horizontal plane in a direction where this semicircular member 61 or 62 gets closer to the other of the semicircular members 61 and 62, thereby making abutting contact between the semicircular members 61 and 62 at the respective end faces thereof in their circumferential directions. As a result, the ring-shaped guard member 60 is placed in the processing position. The guard member 60 in the processing position is kept standstill without being rotated after rotation of the spin base 21 is started.

When the guard member 60 is placed in the processing position, the cup 31 in the retreat position is then moved up to be placed in the processing position (step S103). This places the cup 31 such that the cup 31 surrounds the substrate 9 held on the spin base 21 and the guard member 60 together.

When the cup 31 is placed in the processing position, the cover gas nozzle 41 is then moved from the retreat position to the processing position. Then, discharge of cover gas is started from the cover gas nozzle 41 in the processing position toward the center and its vicinity of the front surface 91 of the substrate 9 (step S104). Supply of the cover gas to the center and its vicinity of the front surface 91 of the substrate 9 started in this step continues until process on this substrate 9 is finished. Continuously supplying the cover gas to the center and its vicinity of the front surface 91 of the substrate 9 prevents exposure of the device region 90 for example to an atmosphere of a processing liquid supplied to the front surface peripheral area 911 and the like while the substrate 9 is being processed. Specifically, the device region 90 continues to be protected from an atmosphere of a processing liquid supplied to the front surface peripheral area 911, for example.

Here, discharge of the cover gas from the cover gas nozzle 41 is started after the cup 31 is placed in the processing position. It is assumed that discharge of the cover gas from the cover gas nozzle 41 is started before the cup 31 is moved up to the processing position. In this case, a gas flow generated near the front surface peripheral area 911 of the substrate 9 is disturbed to roll up, so that particles or the like might adhere to the substrate 9. Such a situation can be prevented by the structure of starting discharge of the cover gas after the cup 31 is placed in the processing position.

Next, rotation of the spin base 21 is started. This starts rotation of the substrate 9 in a horizontal posture held on the spin base 21 (step S105) (as described above, at this time, the substrate 9 is held by the second abutting members 220). At this time, the frequency of rotation of the spin base 21 (specifically, the frequency of rotation of the substrate 9) is 600 rpm, for example. This frequency of rotation is determined appropriately such that a processing liquid supplied to the front surface peripheral area 911 will not go into the device region 90 or will not move toward the end face 93 (specifically, such that the processing liquid will be held stably in a region to be processed inside the front surface peripheral area 911) during the front surface peripheral process. Next, steam is discharged from the steam nozzle 71 toward the back surface 92 of the rotated substrate 9 (pre-steaming) (step S106). After elapse of a certain time (such as five seconds) from start of discharge of the steam, discharge of the steam from the steam nozzle 71 is stopped. This pre-steaming heats the substrate 9. Most of the chemical liquids used for processing the substrate 9 react in an accelerated manner at a higher temperature. From this viewpoint, heating the substrate 9 in advance by this pre-streaming accelerates reaction between a chemical liquid and the substrate 9 during chemical liquid process. This shortens a time of the chemical liquid process and reduces the usage of a chemical liquid. Then, the preparatory process is completed.

<3-2. Front Surface Peripheral Process>

When the preparatory process (step S1) is finished, the front surface peripheral process (step S2) is performed thereafter. The front surface peripheral process is described below by referring to FIGS. 17 and 18. FIG. 17 shows a flow of the front surface peripheral process. FIG. 18 explains the front surface peripheral process. In FIG. 18, some of the elements of the substrate processing apparatus 1 performing each step of the front surface peripheral process are schematically shown.

In the second preferred embodiment, while the front surface peripheral process described below is being performed, the substrate 9 continues to be rotated at a given speed (such as 600 rpm) not falling below the threshold T. Thus, in the second preferred embodiment, the switching part 230 does not make a switch from the second holding condition to the first holding condition so as to coincide with start of the front surface peripheral process. Specifically, the front surface peripheral process is performed while the second holding condition continues where the substrate 9 is held by the second abutting members 220.

The particulars of the front surface peripheral process are the same as those of the first preferred embodiment. First, the front surface peripheral area 911 of the substrate 9 is subjected to chemical liquid process with SC-1 (step S201), then rinsing process (step S202), and then liquid shake-off process (step S203). Next, the front surface peripheral area 911 of the substrate 9 is subjected to chemical liquid process with SC-2 (step S204). Then, liquid shake-off process (step S205), rinsing process (step S206), and liquid shake-off process (step S207) are performed sequentially on the front surface peripheral area 911 of the substrate 9. Next, the front surface peripheral area 911 of the substrate 9 is subjected to chemical liquid process with DHF (step S208), then rinsing process (step S209), and then liquid shake-off process (step S210). Then, the front surface peripheral process is finished. As described above, supply of the cover gas from the cover gas nozzle 41 toward the center and its vicinity of the front surface 91 of the substrate 9 continues during the front surface peripheral process. This protects the device region 90 from an atmosphere of a processing liquid supplied to the front surface peripheral area 911, for example.

<3-3. Processing Surface Switching Process>

When the front surface peripheral process (step S2) is finished, the processing surface switching process (step S3) is performed thereafter. As described above, during the processing surface switching process, supply of the cover gas continues from the cover gas nozzle 41 toward the center and its vicinity of the front surface 91 of the substrate 9.

In the processing surface switching process, the rotation speed of the spin base 21 (specifically, the rotation speed of the substrate 9) is first reduced (step S31). Specifically, the rotation speed of the spin base 21 is reduced from the rotation speed applied during the front surface peripheral process (such as 600 rpm) to a lower rotation speed (low rotation speed) (such as 20 rpm).

The rotation speed of the substrate 9 becomes lower than the threshold T as a result of step S31. Accordingly, after step S31, the switching part 230 makes a switch from the second holding condition to the first holding condition (step S32).

<3-4. Back Surface Process>

When the processing surface switching process (step S3) is finished, the back surface process (step S4) is performed thereafter. The back surface process is described below by referring to FIGS. 37 and 20. FIG. 37 shows a flow from step S3 to step S5. FIG. 20 explains process including the back surface process. In FIG. 20, some of the elements of the substrate processing apparatus 1 performing each step of the back surface process are schematically shown.

As clearly seen from the foregoing description, during the back surface process described below, the substrate 9 continues to be rotated at a given speed (low rotation speed that is particularly 20 rpm, for example) lower than the threshold T. Thus, in the second preferred embodiment, the switching part 230 does not make a switch from the first holding condition to the second holding condition so as to coincide with start of the back surface process. Specifically, the back surface process is performed while the first holding condition continues where the substrate 9 is held by the first abutting members 210.

Before a processing liquid is supplied to the back surface 92, the rotation speed of the spin base 21 is reduced to 20 rpm applied as a low frequency of rotation. The "low rotation speed" mentioned herein is a speed that makes a processing liquid supplied to the back surface 92 of the substrate 9 spread throughout the back surface 92 and prevents the processing liquid from going into the front surface 91 of the substrate 9 while the substrate 9 is rotated at this rotation speed. This "low rotation speed" more specifically corresponds to a frequency of rotation of 20 rpm or less, for example.

The particulars of the back surface process are the same as those of the first preferred embodiment. First, the back surface 92 of the substrate 9 is subjected to chemical liquid process with SC-1 (step S401), and then rinsing process (step S402). Next, the back surface 92 of the substrate 9 is subjected to chemical liquid process with SC-2 (step S403), and then rinsing process (step S404). Next, the back surface 92 of the substrate 9 is subjected to chemical liquid process with DHF (step S405), and then rinsing process (step S406). Then, the back surface process is finished. As described above, the first holding condition where the substrate 9 is held by the first abutting members 210 continues during the back surface process. This suppresses going of a processing liquid supplied to the back surface 92 of the substrate 9 into the front surface of the substrate 9. As described above, supply of the cover gas continues from the cover gas nozzle 41 toward the center and its vicinity of the front surface 91 of the substrate 9 during the back surface process. This protects the device region 90 from an atmosphere of a processing liquid supplied to the back surface 92, for example.

<3-5. Drying Process>

When the back surface process (step S4) is finished, the drying process (step S5) is performed thereafter. As described above, supply of the cover gas from the cover gas nozzle 41 toward the center and its vicinity of the front surface 91 of the substrate 9 continues during the drying process.

In the drying process, while discharge of a processing liquid toward the substrate 9 is stopped, the rotation speed of the spin base 21 (specifically, the rotation speed of the substrate 9) is increased from the low rotation speed to a relatively high rotation speed for drying. During a certain time after increase of the rotation speed of the substrate 9 is started (step S51), the substrate 9 is rotated at a frequency lower than the threshold T. While the substrate 9 is rotated at a relatively low speed lower than the threshold T, the switching part 230 does not make a switch from the first holding condition to the second holding condition. Specifically, the first holding condition where the substrate 9 is held by the first abutting members 210 continues while the substrate 9 is rotated at the relatively low speed. During this time, a rinse liquid adhering to the substrate 9 is shaken off roughly.

After elapse of a certain time from start of increase of the rotation speed of the substrate 9, the rotation speed of the substrate 9 reaches the threshold T. The switching part 230 make a switch from the first holding condition to the second holding condition (step S52) before the rotation speed of the substrate 9 reaches the threshold T.

The rotation speed of the substrate 9 is increased further after it reaches the threshold T. The rotation speed of the substrate 9 eventually becomes a speed for drying (step S53). The second holding condition where the substrate 9 is held by the second abutting members 220 continues while the substrate 9 is rotated at a relatively high speed same as or higher than the threshold T. During this time, the rinse liquid adhering to the substrate 9 is removed completely, so that the substrate 9 is dried eventually. After elapse of a certain time from start of rotation of the substrate 9 at the speed for drying, rotation of the spin base 21 is stopped. Then, the drying process is finished.

As described above, during a certain time after start of the drying process (early stage of the drying process), the substrate 9 is rotated at a relatively low speed to shake off a rinse liquid adhering to the substrate 9 roughly. During this time, the first holding condition continues where the substrate 9 is held by the first abutting members 210. Accordingly, while the rinse liquid is shaken off roughly, going of the rinse liquid into the front surface of the substrate 9 is suppressed. The rotation speed of the substrate 9 is relatively low in the early stage of the drying process. Thus, the substrate 9 can be kept in a certain position in a horizontal plane by the first abutting members 210.

After elapse of the certain time from start of the drying process (latter stage of the drying process), the substrate 9 is rotated at a relatively high speed to shake off the rinse liquid adhering to the substrate 9 completely. During this time, the second holding condition continues where the substrate 9 is held by the second abutting members 220. Accordingly, no matter how high the rotation speed of the substrate 9 is, the substrate 9 can be maintained in a desired position without causing a position shift of the substrate 9. The rinse liquid is already shaken off roughly from the lower surface of the substrate 9 in the early stage of the drying process, so that the rinse liquid is not left in large amount in the latter stage of the drying process. Further, the substrate 9 is rotated at a relatively high speed in the latter stage of the drying process. Thus, the rinse liquid remaining on the substrate 9 is shaken off to the outside of the substrate 9 under strong centrifugal force, so that the rinse liquid is unlikely to go into the front surface of the substrate 9 through the second abutting member 220 in the latter stage of the drying process.

When the drying process is finished, discharge of the gas from the cover gas nozzle 41 is stopped and the cover gas nozzle 41 is moved to the retreat position. Further, the discharge head 51, the cup 31, and the semicircular members 61 and 62 are moved to their respective retreat positions. Then, the switching part 230 makes a switch from the second holding condition to the first holding condition. This releases the substrate 9 from the grip by the second abutting members 220. Next, the transport robot CR transfers the substrate 9 held by the first abutting members 210 onto the hand 121 and takes the substrate 9 out of the substrate processing apparatus 1. Then, the series of processes on the substrate 9 is completed.

<4. Effects>

There has conventionally been a substrate processing apparatus that supplies a processing liquid to a rotated substrate to process the substrate with the liquid (see Japanese Patent Application Laid-Open Nos. 7-115081 (1995), 2000-235948 and 2002-359220). As an example, Japanese Patent Application Laid-Open No. 2000-235948 describes a structure where a wafer is supported in a position spaced from a surface of a spin base by holding an outer circumferential end portion of the wafer by three or more holding members provided to the spin base, and a processing liquid is supplied toward the lower surface of the wafer while the wafer is rotated.

While a processing liquid is supplied to the lower surface of a rotated substrate to process the lower surface of the substrate, part of the processing liquid supplied to the lower surface of the substrate might go into the upper surface of the substrate. As an example, like in Japanese Patent Application Laid-Open No. 2000-235948, where a substrate is supported in a position spaced from a surface of a spin base by holding an outer circumferential end portion of the substrate by a holding member provided to the spin base, and a processing liquid is supplied toward the lower surface of the substrate while the substrate is rotated, the processing liquid supplied to the lower surface of the substrate might go into the upper surface of the substrate through the holding member.

Going of a processing liquid into the upper surface of a substrate is generally not preferred. When a processing liquid is supplied to the lower surface of a rotated substrate (specifically, back surface of the rotated substrate) while the substrate is supported with the front surface of the substrate pointed upward to process the back surface of the substrate with the liquid, for example, part of the processing liquid supplied to the back surface might go into the front surface of the substrate. The processing liquid might adhere to a region (device region) in the front surface of the substrate where a device pattern is to be formed. This may act disadvantageously on a device pattern, bringing about the danger of yield reduction.

Accordingly, a technique that can suppress going of a processing liquid supplied to the lower surface of a substrate into the upper surface of the substrate has been desired.

In the second preferred embodiment, in the first holding condition where the substrate 9 is held by the first abutting members 210, the upper surface of the substrate 9 is in a position above the upper end (more specifically, upper end surface 2121) of the first abutting member 210 while the second abutting member 220 is separated from the substrate 9. Thus, in the first holding condition, a processing liquid supplied to the lower surface of the substrate 9 finds difficulty in going into the upper surface of the substrate 9 through the first abutting member 210 while finding difficulty as well in going into the upper surface of the substrate 9 through the second abutting member 220. This can suppress going of the processing liquid supplied to the lower surface of the substrate 9 into the upper surface of the substrate 9.

In the second preferred embodiment, the substrate 9 rotated at a speed lower than the threshold T is held by the first abutting members 210 whereas the substrate 9 rotated at the threshold T or a speed higher than the threshold T is held by the second abutting members 220. With a lower rotation speed of the substrate 9, a processing liquid supplied to the lower surface of the substrate 9 becomes less likely to be blown away by centrifugal force so the processing liquid may go into the upper surface of the substrate 9 easily. Meanwhile, the substrate 9 is placed in the first holding condition where it is held by the first abutting members 210 while the substrate 9 is rotated at a relatively low speed. This can suppress going of a processing liquid supplied to the lower surface of the substrate 9 into the upper surface of the substrate 9. With a higher rotation speed of the substrate 9, the position of the substrate 9 may be shifted more easily in a horizontal plane. Meanwhile, the substrate 9 is placed in the second holding condition where it is held by the second abutting members 220 while the substrate 9 is rotated at a relatively high speed. This can prevent the position shift of the substrate 9 in a horizontal plane.

In the second preferred embodiment, the first abutting member 210 abuts on the substrate 9 at its tilted side surface 2120. This structure makes liquid gathering in clearance space between the lower surface of the substrate 9 and the tilted side surface 2120 drop downward easily through the tilted side surface 2120. Specifically, an accumulation of liquid is unlikely to be formed in this clearance space. This can suppress the occurrence of a situation where an accumulation of liquid is formed in this clearance space and this accumulation goes into the upper surface of the substrate 9. A processing liquid supplied to the lower surface of the substrate 9 drops downward through the tilted side surface 2120. This flow of a processing liquid (flow of a processing liquid that guides a processing liquid downward supplied to the lower surface of the substrate 9) can remove a processing liquid supplied to the lower surface of the substrate 9 readily from the substrate 9 without making the processing liquid go into the upper surface of the substrate 9.

In particular, if the angle θ formed between the tilted side surface 2120 and a horizontal plane is 45 degrees or more in the first holding condition where the first abutting member 210 holds the substrate 9, liquid gathering in the clearance space between the lower surface of the substrate 9 and the tilted side surface 2120 drops downward readily through the tilted side surface 2120. This can sufficiently suppress the occurrence of a situation where an accumulation of liquid is formed in this clearance space and this accumulation goes into the upper surface of the substrate 9. This can also remove a processing liquid supplied to the lower surface of the substrate 9 particularly readily from the substrate 9 without making the processing liquid go into the upper surface of the substrate 9. Additionally, if the angle θ formed between the tilted side surface 2120 and a horizontal plane is 45 degrees or more, a contact area between the substrate 9 and the tilted side surface 2120 becomes small. This also suppresses going of a processing liquid into the upper surface of the substrate 9 to be caused by the capillary action.

In particular, if the surface of the first abutting member 210 is hydrophobic, a processing liquid finds difficulty in adhering to the first abutting member 210 while an accumulation of liquid is unlikely to be formed in the clearance space between the lower surface of the substrate 9 and the first abutting member 210. This can suppress the occurrence of a situation where an accumulation of liquid is formed in this clearance space and this accumulation goes into the upper surface of the substrate 9.

In the second preferred embodiment, a switch is made between the first and second holding conditions by moving the second abutting member 220 in a direction where the second abutting member 220 gets closer to or farther from the periphery of the substrate 9. In this structure, a switch can be made easily and readily between the first and second holding conditions.

<5. Modifications>

In the second preferred embodiment, the substrate 9 is subjected to the front surface peripheral process and the back surface process in the order named. Meanwhile, the back surface process may be performed while the front surface peripheral process is skipped. In this case, the substrate 9 is rotated at a speed lower than the threshold T in process to be performed first after rotation of the substrate 9 is started. Thus, for the reasons mentioned above, the switching part 230 makes a switch from the second holding condition to the first holding condition after step S1012 is finished.

Third Preferred Embodiment

<1. Structure of Substrate Processing Apparatus 1>

Figure 38:
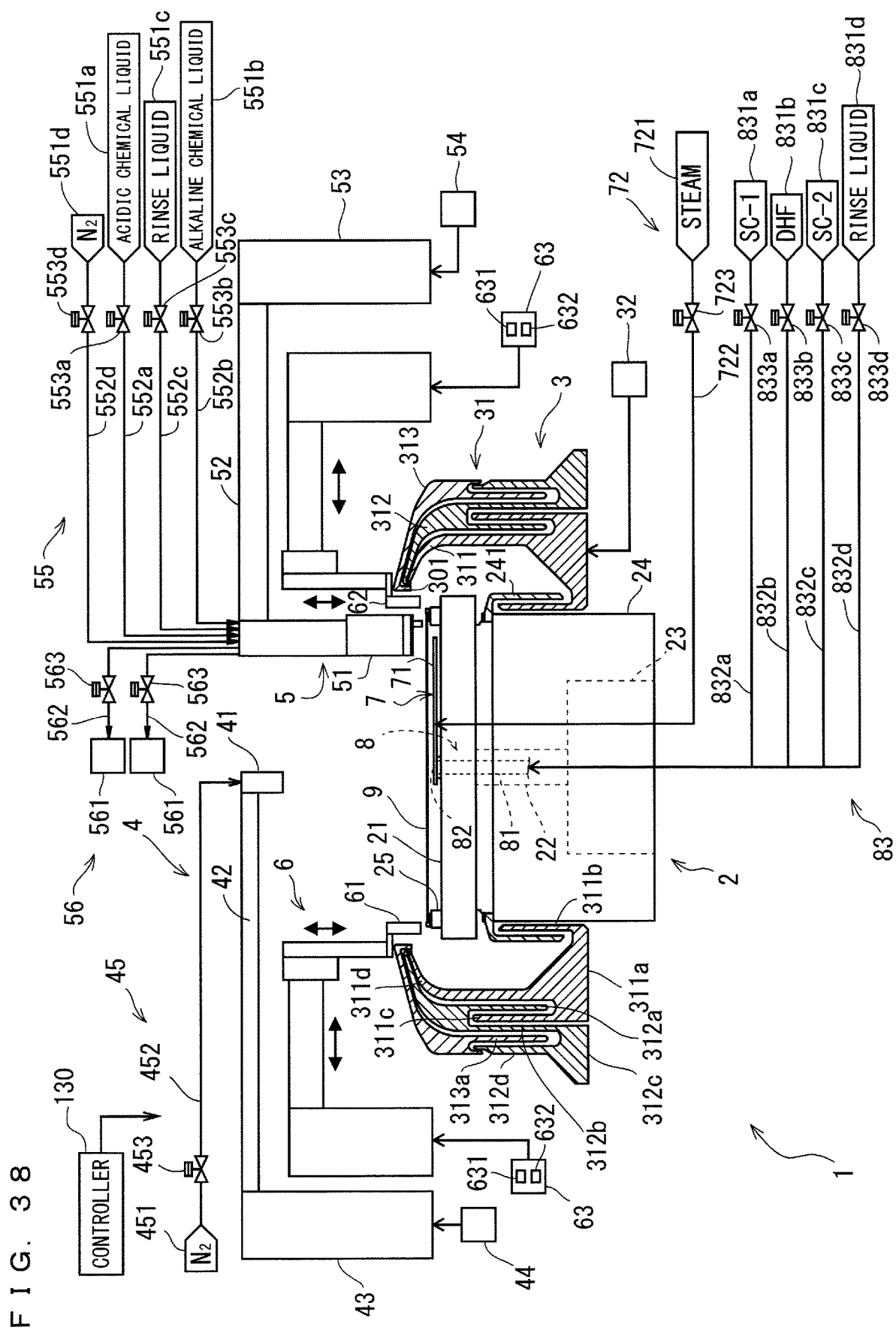
FIG. 38 is a schematic view describing the structure of a substrate processing apparatus.

The following describes the structure of a substrate processing apparatus 1 of a third preferred embodiment by referring to FIGS. 3, 4 and 38. FIG. 3 is a diagrammatic perspective view of the substrate processing apparatus 1 showing a condition where semicircular members 61 and 62 forming a guard member 60, a cup 31, and a processing head 51 for peripheral area are placed in their respective retreat positions. FIG. 4 is also a diagrammatic perspective view of the substrate processing apparatus 1 showing a condition where the guard member 60, the cup 31, and the processing head 51 are placed in their respective processing positions. FIG. 38 is a schematic view describing the structure of the substrate processing apparatus 1. The substrate processing apparatus 1 is installed for example on the aforementioned substrate processing system 100. The substrate processing apparatus 1 is to process the aforementioned substrate 9, for example.

In the following description, a "processing liquid" includes a "chemical liquid" used in chemical liquid process, and a "rinse liquid" used in rinsing process performed to wash out the chemical liquid.

The substrate processing apparatus 1 includes a spin chuck 2, an anti-splash unit 3, a front surface protecting unit 4, a peripheral processing unit 5, a liquid bounce suppressing unit 6, a heat processing unit 7, and a back surface processing unit 8. Each of these units 2 to 8 is electrically connected to a controller 130 and operates in response to an order from the controller 130. The respective structures of the spin chuck 2, the anti-splash unit 3, the front surface protecting unit 4, the liquid bounce suppressing unit 6, the heat processing unit 7, and the back surface processing unit 8 are the same as those of the first preferred embodiment.

<2. Peripheral Processing Unit 5>
<2-1. Overall Structure>

The peripheral processing unit 5 is to process the front surface peripheral area 911 of the substrate 9 held on the spin base 21. The overall structure of the peripheral processing unit 5 is described below by further referring to FIGS. 3, 4 and 38.

The peripheral processing unit 5 includes the processing head 51 to process the front surface peripheral area 911 of the substrate 9 held on the spin base 21. The processing head 51 is attached to a tip portion of a horizontally extending arm 52. A base end portion of the arm 52 is coupled to a nozzle base 53. The nozzle base 53 is placed in a posture that makes the axis line of the nozzle base 53 extend in the vertical direction. The base end portion of the arm 52 is coupled to the upper end of the nozzle base 53.

The nozzle base 53 is provided with a drive unit 54 to drive the processing head 51. The drive unit 54 is composed for example of a rotation drive part (such as a servomotor) to rotate the nozzle base 53 about the axis line of the nozzle base 53, and an up-and-down drive part (such as a stepping motor) to expand and contract the nozzle base 53 along the axis line of the nozzle base 53. In response to rotation of the nozzle base 53 by the drive unit 54, the processing head 51 moves along an arcuate orbit in a horizontal plane. In response to expansion or contraction of the nozzle base 53 by the drive unit 54, the processing head 51 moves in a direction where the processing head 51 gets closer to or farther from the substrate 9.

In response to drive by the drive unit 54, the processing head 51 moves between a processing position and a retreat position. The processing position of the processing head 51 mentioned herein is a position (position of FIG. 4) above the substrate 9 held on the spin base 21 that makes the processing head 51 face the front surface peripheral area 911 while placing the processing head 51 close to the front surface peripheral area 911 in a noncontact manner. While the processing head 51 is placed in the processing position, at least part of the processing head 51 is housed in a cut 605 formed in an inner circumferential wall of the guard member 60 described later. The retreat position of the processing head 51 is a position (position of FIG. 3) that does not interfere with a transport path for the substrate 9 which is outside a top edge portion 301 of the cup 31 as viewed from above, for example. The drive unit 54 is electrically connected to the controller 130 and operates under control by the controller 130. Specifically, the position of the processing head 51 is controlled by the controller 130.

<2-2. Processing Head 51 for Peripheral Area>

Figure 39:
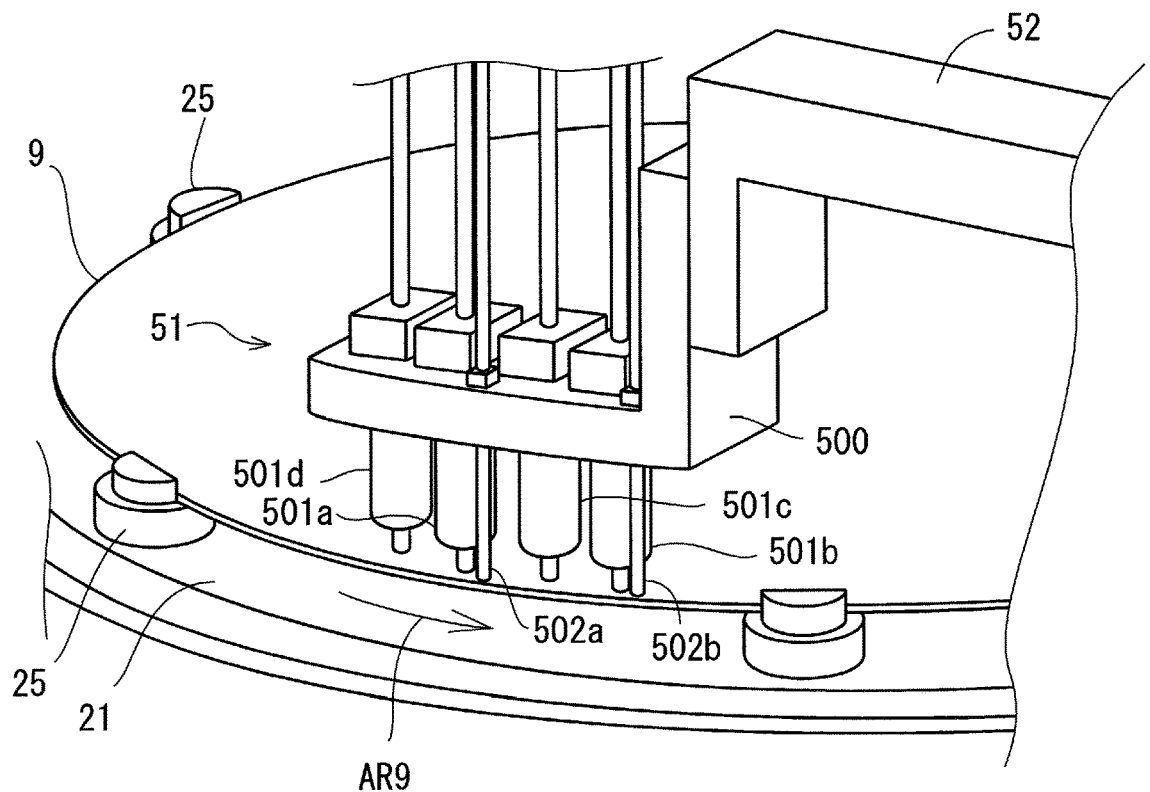
FIG. 39 is a perspective view of a processing head for peripheral area.

The processing head 51 is described next by referring to FIGS. 38 and 39. FIG. 39 is a perspective view of the processing head 51. For the convenience of description, the guard member 60 and the cup 31 are omitted from FIG. 39.

The processing head 51 has the structure of discharging a fluid (processing liquid and gas) toward the front surface peripheral area 911 and the structure of sucking a processing liquid on the front surface peripheral area 911.

<2-2-1. Structure Relating to Discharge of Fluid>
<i. Discharge Nozzles 501a to 501d>

The processing head 51 includes multiple (here, four) discharge nozzles 501a to 501d from which fluids are discharged toward the front surface peripheral area 911. The nozzles 501a to 501d in a group of the processing head 51 include one or more (here, three) discharge nozzles (hereinafter also called "processing liquid nozzles") 501a, 501b and 501c from which processing liquids are discharged toward the front surface peripheral area 911, and the discharge nozzle (hereinafter also called "gas nozzle") 501d from which gas (here, nitrogen gas) is discharged toward the front surface peripheral area 911. In particular, the processing liquid nozzles 501a, 501b and 501c of the processing head 51 include two discharge nozzles (hereinafter also called "chemical liquid nozzles") 501a and 501b from which chemical liquids are discharged, and the discharge nozzle (hereinafter also called a "rinse liquid nozzle") 501c from which a rinse liquid is discharged. More particularly, the chemical liquid nozzles 501a and 501b of the processing head 51 include the discharge nozzle (hereinafter also called a "first chemical liquid nozzle") 501a from which an acidic chemical liquid is discharged, and the discharge nozzle (hereinafter also called a "second chemical liquid nozzle") 501b from which an alkaline chemical liquid is discharged.

<ii. Fluid Supplier 55>

The processing head 51 is connected to a fluid supplier 55 that is a pipe system to supply a fluid (more specifically, processing liquid and gas) to each of the discharge nozzles 501a to 501d in a group of the processing head 51.

More specifically, the fluid supplier 55 is formed by combining for example an acidic chemical liquid source 551a, an alkaline chemical liquid source 551b, a rinse liquid source 551c, a nitrogen gas source 551d, multiple pipes 552a, 552b, 552c and 552d, and multiple open-close valves 553a, 553b, 553c and 553d.

The acidic chemical liquid source 551a is a source to supply an acidic chemical liquid. As an example, the acidic chemical liquid source 551a mentioned herein can selectively supply diluted hydrofluoric acid (hereinafter called "DHF") and hydrochloric acid-hydrogen peroxide-water (chemical liquid hereinafter called "SC-2" containing hydrochloric acid (HCl), hydrogen peroxide ($H_2O_2$), and pure water (DIW: deionized water) mixed in a prescribed ratio). The acidic chemical liquid source 551a is connected to the first chemical liquid nozzle 501a through the pipe 552a in which the open-close valve 553a is interposed. Accordingly, opening the open-close valve 553a discharges an acidic chemical liquid (DHF or SC-2) from the first chemical liquid nozzle 501a supplied from the acidic chemical liquid source 551a. The acidic chemical liquid source 551a does not always supply DHF and SC-2 selectively. As an example, the acidic chemical liquid source 551a may supply at least one of DHF, SC-2, BDHF (buffered hydrofluoric acid), HF (hydrofluoric acid), hydrochloric acid, sulfuric acid, nitric acid, phosphoric acid, acetic acid, oxalic acid, and mixed solutions thereof, for example.

The alkaline chemical liquid source 551$b$ is a source to supply an alkaline chemical liquid. As an example, the alkaline chemical liquid source 551$b$ mentioned herein can supply ammonia-hydrogen peroxide-water (chemical liquid hereinafter called "SC-1" containing ammonium hydroxide ($NH_4OH$), hydrogen peroxide ($H_2O_2$), and pure water mixed in a prescribed ratio). The alkaline chemical liquid source 551$b$ is connected to the second chemical liquid nozzle 501$b$ through the pipe 552$b$ in which the open-close valve 553$b$ is interposed. Accordingly, opening the open-close valve 553$b$ discharges an alkaline chemical liquid (SC-1) from the second chemical liquid nozzle 501$b$ supplied from the alkaline chemical liquid source 551$b$. It is preferable that SC-1 to be supplied from the alkaline chemical liquid source 551$b$ be controlled in temperature to fall in a range of from 60° C. to 80° C., for example. The alkaline chemical liquid source 551$b$ may supply a chemical liquid (such as ammonia aqueous solution) other than SC-1.

The rinse liquid source 551$c$ is a source to supply a rinse liquid. The rinse liquid source 551$c$ mentioned herein supplies for example carbonated water as a rinse liquid containing pure water dissolved carbon dioxide ($CO_2$). The rinse liquid source 551$c$ is connected to the rinse liquid nozzle 501$c$ through the pipe 552$c$ in which the open-close valve 553$c$ is interposed. Accordingly, opening the open-close valve 553$c$ discharges a rinse liquid from the rinse liquid nozzle 501$c$ supplied from the rinse liquid source 551$c$. A rinse liquid to be used can be pure water, warm water, ozone water, magnetic water, regenerated water (hydrogen water), various organic solvents, ionized water, IPA (isopropyl alcohol) and functional water, for example.

The nitrogen gas source 551$d$ is a source to supply gas (nitrogen ($N_2$) gas is supplied here, for example). The nitrogen gas source 551$d$ is connected to the gas nozzle 501$d$ through the pipe 552$d$ in which the open-close valve 553$d$ is interposed. Accordingly, opening the open-close valve 553$d$ discharges nitrogen gas from the gas nozzle 501$d$ supplied from the nitrogen gas source 551$d$. The nitrogen gas source 551$d$ may supply gas other than nitrogen gas (such as inert gases of various types other than nitrogen gas or dry air).

While the processing head 51 is in the processing position, each of the discharge nozzles 501$a$ to 501$d$ is placed in a position (discharge position) that makes a discharge port 515 (described later) formed at the tip of each of the discharge nozzles 501$a$ to 501$d$ face the front surface peripheral area 911 of the substrate 9 held on the spin base 21 while placing the discharge port 515 close to the front surface peripheral area 911 in a noncontact manner. When the fluid supplier 55 supplies fluids to the discharge nozzles 501$a$ to 501$d$ in this condition, the fluids are discharged toward the front surface peripheral area 911. As an example, if the fluid supplier 55 supplies an acidic chemical liquid (DHF or SC-2) to the first chemical liquid nozzle 501$a$, the acidic chemical liquid is discharged from the first chemical liquid nozzle 501$a$ toward the front surface peripheral area 911. If the fluid supplier 55 supplies an alkaline chemical liquid (SC-1) to the second chemical liquid nozzle 501$b$, the alkaline chemical liquid is discharged from the second chemical liquid nozzle 501$b$ toward the front surface peripheral area 911. If the fluid supplier 55 supplies a rinse liquid to the rinse liquid nozzle 501$c$, the rinse liquid is discharged from the rinse liquid nozzle 501$c$ toward the front surface peripheral area 911. If the fluid supplier 55 supplies gas to the gas nozzle 501$d$, the gas is discharged from the gas nozzle 501$d$ toward the front surface peripheral area 911.

The open-close valves 553$a$, 553$b$, 553$c$ and 553$d$ of the fluid supplier 55 are each electrically connected to the controller 130 and are opened and closed under control by the controller 130. Specifically, a mode of discharge of a fluid from each of the discharge nozzles 501$a$ to 501$d$ (more specifically, timing of starting discharge, timing of finishing the discharge, and discharge flow rate, for example) is controlled by the controller 130.

<iii. Discharge Nozzle 501>

Figure 40:
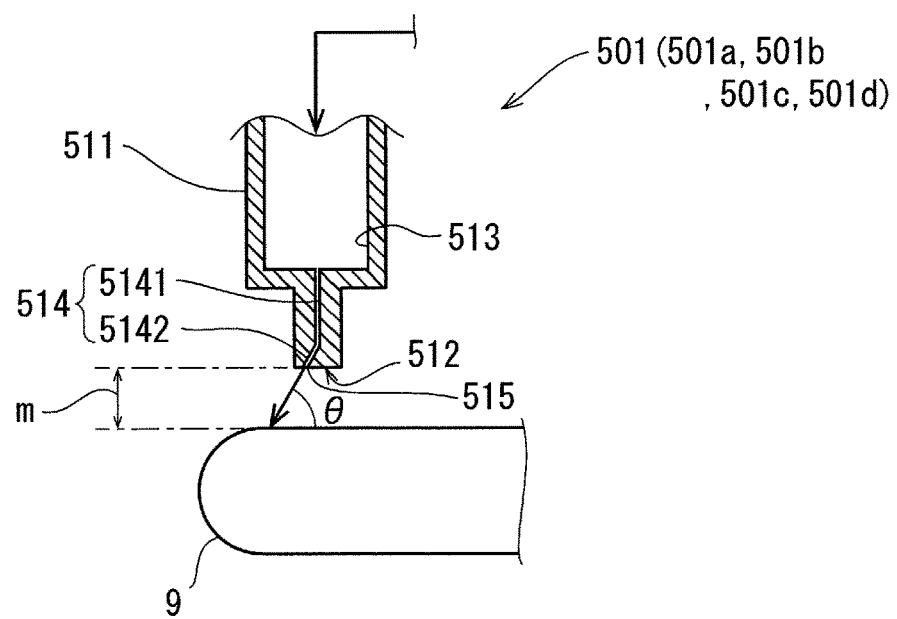
FIG. 40 is a side sectional view schematically showing the structure of the tip and its vicinity of a discharge nozzle.

The following describes the specific structure of each of the discharge nozzles 501$a$ to 501$d$ in a group of the processing head 51 by referring to FIG. 40. The discharge nozzles 501$a$ to 501$d$ in a group have substantially the same structure. In the below, where the discharge nozzles 501$a$ to 501$d$ are not to be distinguished from each other, they may also be called a "discharge nozzle 501" simply. FIG. 40 is a side sectional view schematically showing the structure of the tip and its vicinity of the discharge nozzle 501.

The discharge nozzle 501 includes a nozzle body 511 having an outer shape of an elongated bar with a narrowed lower end. The nozzle body 511 has an axis direction extending in the vertical direction. The nozzle body 511 is supported by a support part 500 (described later) such that a lower surface (hereinafter also called a "discharge surface") 512 of the nozzle body 511 is placed in a horizontal posture. Thus, while the processing head 51 is in the processing position, the discharge surface 512 in a posture parallel to the front surface 91 of the substrate 9 held on the spin base 21 is placed to be close to the front surface peripheral area 911 in a noncontact manner. A distance m determined in this condition between the discharge surface 512 and the front surface peripheral area 911 is sufficiently small (distance m is about 1 mm, for example).

An introduction flow path 513 and a discharge flow path 514 communicating with the lower end of the introduction flow path 513 are formed inside the nozzle body 511. The upper end of the introduction flow path 513 is connected to one of the aforementioned pipes 552$a$, 552$b$, 552$c$ and 552$d$. The lower end of the discharge flow path 514 communicates with the open discharge port 515 formed in the discharge surface 512. As an example, the discharge port 515 is a circular through hole having a diameter for example of 0.6 mm that is smaller than a minute width d extending from the end face 93 of the substrate 9 shown in FIG. 2. Thus, a fluid supplied from a pipe is first held in the introduction flow path 513. Then, the fluid flows into the discharge flow path 514 to be discharged from the discharge port 515.

The discharge flow path 514 is bent in the middle. More specifically, the discharge flow path 514 has a vertical flow path section 5141 and a tilted flow path section 5142 extending continuously from the vertical flow path section 5141. The vertical flow path section 5141 extends parallel to the axis direction of the nozzle body 511 to communicate with the tilted flow path section 5142 at a lower end of the vertical flow path section 5141. The tilted flow path section 5142 extends obliquely downward such that it gets farther in a lower position from an inner side of the substrate 9 (on the part of the center of the substrate 9) toward an outer side of the substrate 9 (on the part of the end face 93) to communicate with the discharge port 515 at a lower end of the tilted flow path section 5142.

In the discharge nozzle 501, a fluid passes through the obliquely extending tilted flow path section 5142 and is then discharged from the discharge port 515. Thus, a fluid discharged from the discharge nozzle 501 toward the front surface peripheral area 911 of the substrate 9 can be caused to flow toward the outside of the substrate 9 in the front surface peripheral area 911. This can suppress flow of a processing liquid into the device region 90 having been discharged from the processing liquid nozzle 501*a*, 501*b*, 501*c* or 501*d* toward the front surface peripheral area 911, for example. This can also accurately control an inner edge position of a region in the front surface peripheral area 911 to be acted on by the processing liquid. Further, while gas is discharged from the gas nozzle 501*d* toward the front surface peripheral area 911, a gas flow traveling toward an outer side of the substrate 9 can be formed in the front surface peripheral area 911, for example. This gas flow can blow away a processing liquid or mist of the processing liquid on the front surface peripheral area 911 to the outer side of the substrate 9.

In particular, in the discharge nozzle 501, the nozzle body 511 itself is not in a tilted posture while supported by the support part 500 but the tilted flow path section 5142 forming part of the discharge flow path 514 inside the nozzle body 511 is tilted. It is assumed that a flow path extending straight along the axis direction of a nozzle body is formed inside the nozzle body and the nozzle body itself is in a tilted posture to tilt a discharge surface relative to a horizontal plane. This might easily generate an accumulation of liquid near the lowest end of the discharge surface and this accumulation might drop onto the substrate 9 (dripping). Such dripping of a processing liquid is caused in a position on an inner side (on the part of the center of the substrate 9) relative to a position where the processing liquid is to be supplied originally, so that this processing liquid is hard to remove even with gas discharged from the gas nozzle 501*d*. In contrast, in the third preferred embodiment, not the nozzle body 511 but part of the discharge flow path 514 formed inside the nozzle body 511 is tilted. This structure can place the discharge surface 512 in a horizontal posture, making the aforementioned dripping of a processing liquid unlikely.

To control the width of a region to be acted on by a processing liquid (such as an etching width to be acted on by a chemical liquid for etching) with a higher degree of accuracy, it is preferable that an angle (angle of tilt) θ formed between a direction where the tilted flow path section 5142 extends and a horizontal plane be 45 degrees or more, or more preferably, 60 degrees or more.

<2-2-2. Structure Relating to Suction of Processing Liquid>

<i. Suction Tubes 502*a* and 502*b*>

Referring again to FIGS. 38 and 39, the processing head 51 includes suction tubes 502*a* and 502*b* into which a residual processing liquid on the front surface peripheral area 911 is sucked. The "residual processing liquid" mentioned herein means a processing liquid determined by subtracting a processing liquid of an amount sufficient and necessary for performing desired process on a desired region from a processing liquid supplied to the front surface peripheral area 911. Specifically, only the residual processing liquid on the front surface peripheral area 911 is sucked into the suction tubes 502*a* and 502*b* while a processing liquid of an amount sufficient and necessary for performing desired process on a desired region remains on the front surface peripheral area 911.

Each of the suction tubes 502*a* and 502*b* is associated with one of the processing liquid nozzles 501*a*, 501*b* and 501*c*. A processing liquid supplied onto the front surface peripheral area 911 from an associated processing liquid nozzle is sucked into each of the suction tubes 502*a* and 502*b*. In the third preferred embodiment, the processing head 51 includes the two suction tubes 502*a* and 502*b*. One of the suction tubes (hereinafter also called a "first suction tube") 502*a* is associated with the first chemical liquid nozzle 501*a*. A chemical liquid discharged from the first chemical liquid nozzle 501*a* is sucked into the suction tube 502*a*. The other suction tube (hereinafter also called a "second suction tube") 502*b* is associated with the second chemical liquid nozzle 501*b*. A chemical liquid discharged from the second chemical liquid nozzle 501*b* is sucked into the suction tube 502*b*.

<ii. Suction Pressure Forming Unit 56>

The processing head 51 is connected to a suction pressure forming unit 56 that is a pipe system to form negative pressure (suction pressure) in hollow space of each of the suction tubes 502*a* and 502*b* of the processing head 51.

According to an exemplary specific structure of the suction pressure forming unit 56, a suction source 561 is connected to each of the suction tubes 502*a* and 502*b* through a pipe 562 in which an open-close valve 563 is interposed. More specifically, the suction source 561 is formed for example of a pump (such as a positive displacement pump or non-positive displacement pump) to suck liquid and eject the liquid, and a collection tank where the liquid ejected from the pump is collected. In this structure, opening the open-close valve 563 forms negative pressure (suction pressure) in the hollow space of each of the suction tubes 502*a* and 502*b* to suck a processing liquid and the like through an open suction port 521 (described later) formed at the lower end of each of the suction tubes 502*a* and 502*b*. The sucked processing liquid is collected in the collection tank. The structure of the suction pressure forming unit 56 may also be such that a sucked processing liquid is not collected in the collection tank but it is ejected directly to an external drainage line or is caused to flow back to a source for this processing liquid in the fluid supplier 55.

While the processing head 51 is in the processing position, each of the suction tubes 502*a* and 502*b* is placed in a position (suction position) that makes the suction port 521 formed at the tip of each of the suction tubes 502*a* and 502*b* face the front surface peripheral area 911 of the substrate 9 held on the spin base 21 while placing the suction port 521 close to the front surface peripheral area 911 in a noncontact manner. When the suction pressure forming unit 56 forms negative pressure (suction pressure) in the hollow space of the suction tube 502*a* or 502*b* in this condition, a processing liquid on the front surface peripheral area 911 is sucked into the suction tube 502*a* or 502*b* through the suction port 521.

The suction source 561 and the open-close valve 563 are electrically connected to the controller 130 and are driven (opened and closed) under control by the controller 130. Specifically, a mode of suction of a processing liquid into the suction tubes 502*a* and 502*b* (more specifically, timing of starting suction, timing of finishing the suction, and suction pressure (namely, the amount of suction), for example) is controlled by the controller 130. The controller 130 adjusts the suction pressure (more specifically, pressure of the pump of the suction source 561, for example) of each of the suction tubes 502*a* and 502*b* such that a processing liquid of an amount sufficient and necessary for process remains on the front surface peripheral area 911 while only the residual remainder of the processing liquid is sucked into each of the suction tubes 502*a* and 502*b*.

In this substrate processing apparatus 1, while prescribed process is performed on the front surface peripheral area 911 by discharging a processing liquid from each of the aforementioned processing liquid nozzles 501*a*, 501*b* and 501*c*, an inner edge position of a region in the front surface peripheral area 911 to be acted on by the processing liquid should be controlled accurately. An inner edge position of a region in the front surface peripheral area 911 to be acted on by a chemical liquid (such as one for etching) should be controlled particularly accurately. However, supplying a processing liquid of an amount larger than an amount sufficient and necessary for process from the processing liquid nozzle 501a, 501b or 501c to the front surface peripheral area 911 may make a residue of the processing liquid on the front surface peripheral area 911 spread toward the center of the substrate 9. In this case, the aforementioned inner edge position might be shifted toward the center of the substrate 9 from a desired position. At worst, the processing liquid spreading toward the center of the substrate 9 may enter a device region 90 to act disadvantageously on a device pattern.

In this substrate processing apparatus 1, a residual processing liquid on the front surface peripheral area 911 can be removed by sucking the residual processing liquid on the front surface peripheral area 911 into each of the suction tubes 502a and 502b provided to the processing head 51. This can suppress spreading of the residual processing liquid on the front surface peripheral area 911 toward the center of the substrate 9. Specifically, this can suppress shift of an inner edge position of a region in the front surface peripheral area 911 to be acted on by the processing liquid from a desired position toward the center of the substrate 9. This can also prevent the occurrence of a situation where a processing liquid spreading toward the center of the substrate 9 enters the device region 90 to act disadvantageously on a device pattern.

If a residual processing liquid is present on the front surface peripheral area 911, a processing liquid newly supplied to the front surface peripheral area 911 might collide with the residual processing liquid to bounce into the device region 90. Meanwhile, removing the residual processing liquid from the front surface peripheral area 911 can further suppress the occurrence of such a situation.

<iii. Suction Tubes 502a and 502b>

Figure 41:
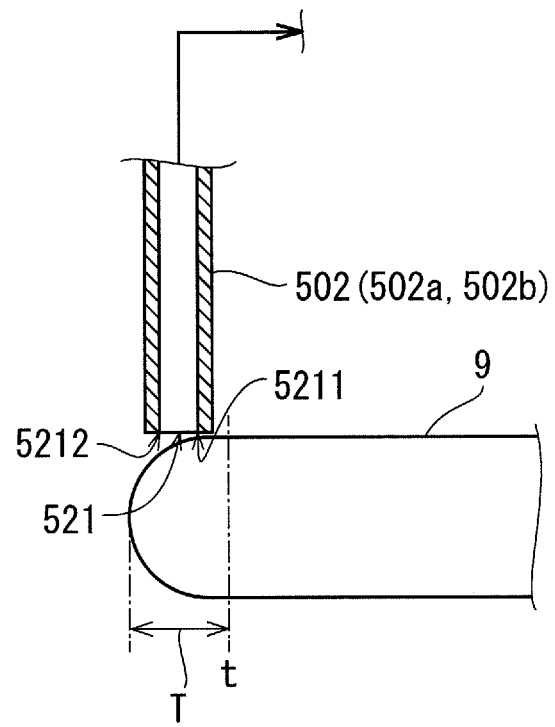
FIG. 41 is a side sectional view schematically showing the structure of the tip and its vicinity of a suction tube.

The specific structure of each of the suction tubes 502a and 502b of the processing head 51 is described next by referring to FIG. 41. The suction tubes 502a and 502b have substantially the same structure. In the below, where the suction tubes 502a and 502b are not to be distinguished from each other, they may also be called a "suction tube 502" simply. FIG. 41 is a side sectional view schematically showing the structure of the tip and its vicinity of the suction tube 502.

The suction tube 502 has an outer shape of a long and thin circular cylinder and is hollow inside. The hollow space inside the suction tube 502 communicates with the suction port 521 formed at the lower end of the suction tube 502. The suction tube 502 may have a straight shape such as one shown in FIG. 41, or may have a nozzle shape reduced more in diameter in a position closer to the tip of the suction tube 502.

The diameter of the suction port 521 of the suction tube 502 is smaller than a width T of a region in the front surface peripheral area 911 to be acted on by a processing liquid (this region is more specifically a region (hereinafter called a "target processing region") to be acted on by a processing liquid discharged from the processing liquid nozzle 501a or 501b associated with this suction tube 502).

While the suction tube 502 is placed in the suction position, an end (inner end) 5211 of the suction port 521 on the part of the center of the substrate 9 is closer to the end face 93 of the substrate 9 than an inner edge position (hereinafter called a "target inner edge position") t of the target processing region. In this structure, suction pressure can act on a place on an outer side (on the part of the end face 93 of the substrate 9) relative to the target inner edge position t. This can suppress spreading of a residual processing liquid toward the center of the substrate 9 that may lead to protrusion of the residual processing liquid from the target processing region.

While the suction tube 502 is placed in the suction position, an end (outer end) 5212 of the suction port 521 on the part of the end face 93 of the substrate 9 is closer to the inside (closer to the center of the substrate 9) than the end face 93 of the substrate 9. In this structure, suction pressure can act on effectively on a processing liquid.

<2-2-3. Layout>

The processing head 51 includes the support part 500 fixed to the aforementioned arm 52. The support part 500 supports the discharge nozzles 501a to 501d and the suction tubes 502a and 502b integrally. A layout of the integrally supported discharge nozzles 501a to 501d and the suction tubes 502a and 502b is described below by referring to FIG. 39.

As described above, the processing head 51 of the peripheral processing unit 5 in the processing position is placed on the same side as the inner circumferential wall of the guard member 60 (specifically, on a side opposite the cup 31 with respect to the guard member 60). In this condition, the discharge nozzles 501a to 501d and the suction tubes 502a and 502b of the processing head 51 are placed on a side opposite the cup 31 with respect to the guard member 60. The inner circumferential wall of the guard member 60 is given the cut 605 where at least part of the processing head 51 is housed. While the processing head 51 is in the processing position, at least part of the processing head 51 (more specifically, at least part of each of the discharge nozzles 501a to 501d and the suction tubes 502a and 502b, for example) is housed in the cut 605. Thus, the processing head 51 is placed in the processing position above the front surface peripheral area 911 without interfering with the guard member 60.

<i. Layout of Discharge Nozzles 501a to 501d>

The support part 500 is a member curving in a arcuate pattern extending along the front surface peripheral area 911 as viewed from above. The discharge nozzles 501a to 501d in a group are arranged in a direction where the support part 500 curving in an arcuate pattern extends. Accordingly, while the processing head 51 is placed in the processing position, the discharge nozzles 501a to 501d in a group are aligned along the front surface peripheral area 911 of the substrate 9. The gas nozzle 501d, the first chemical liquid nozzle 501a, the rinse liquid nozzle 501c, and the second chemical liquid nozzle 501b are arranged in a rotative direction AR9 of the substrate 9 in the order named as viewed from an upstream side of the rotative direction AR9.

In the processing head 51, the gas nozzle 501d is placed upstream of the rotative direction AR9 of the substrate 9 relative to the processing liquid nozzles 501a, 501b and 501c. Thus, in the substrate 9 to be rotated, each position within the front surface peripheral area 911 of the substrate 9 first passes through a place below the gas nozzle 501d and then passes through places below the processing liquid nozzles 501a, 501b and 501c. In this structure, before being supplied with a new processing liquid from the processing liquid nozzle 501a, 501b or 501c, each position within the front surface peripheral area 911 of the rotated substrate 9 can be supplied with gas from the gas nozzle 501d (specifically, gas can be sprayed onto this position).

According to a surface condition of the substrate 9, for example, a processing liquid having been supplied from the processing liquid nozzle 501a, 501b or 501c before one rotation of the substrate 9 and not having been shaken off during this rotation may adhere to each position within the front surface peripheral area 911 having reached a place below the processing head 51. In this case, in the processing head 51, such an old processing liquid can be removed with gas discharged from the gas nozzle 501d and then new processing liquids can be supplied from the processing liquid nozzles 501a, 501b and 501c. This structure makes the occurrence of a situation unlikely where a processing liquid newly supplied to each position within the front surface peripheral area 911 collides with an old processing liquid to bounce. This suppresses entry of a processing liquid into the device region 90. Further, this structure allows the substrate 9 to be always acted on by a fresh processing liquid, thereby enhancing processing efficiency. It is assumed that a new processing liquid is supplied further to a place where an old chemical liquid remains unremoved. In this case, the processing liquid might temporarily remain in large amount in this place. In contrast, the structure of removing an old chemical liquid with gas and then supplying a new processing liquid makes the occurrence of a situation unlikely where a processing liquid temporarily remains in large amount in each position within the front surface peripheral area 911. This can suppress change of the amount of a processing liquid with time held in each position within the front surface peripheral area 911. As a result, an inner edge position of a region in the front surface peripheral area 911 to be acted on by a processing liquid can be controlled accurately.

From a different viewpoint, in the processing head 51, the processing liquid nozzles 501a, 501b and 501c are placed downstream of the rotative direction AR9 of the substrate 9 relative to the gas nozzle 501d. Thus, in the substrate 9 to be rotated, each position within the front surface peripheral area 911 of the substrate 9 passes through places below the processing liquid nozzles 501a, 501b and 501c and then reaches a place below the gas nozzle 501d after the substrate 9 is rotated substantially one turn. This structure makes at least some of the processing liquids supplied from the processing liquid nozzles 501a, 501b and 501c to each position within the front surface peripheral area 911 stay on the front surface peripheral area 911 while the substrate 9 is rotated substantially one turn. Thus, each position within the front surface peripheral area 911 can be acted on satisfactorily by a processing liquid.

In the processing head 51, the rinse liquid nozzle 501c from which a rinse liquid is discharged is placed between the first chemical liquid nozzle 501a from which an acidic chemical liquid is discharged and the second chemical liquid nozzle 501b from which an alkaline chemical liquid is discharged. This structure can suppress the occurrence of a situation where an atmosphere generated during discharge of a chemical liquid from one of the chemical liquid nozzles reacts with a chemical liquid remaining in the other chemical liquid nozzle, for example. As a more specific example, this structure can suppress the occurrence of a situation where an atmosphere generated during discharge of an acidic chemical liquid from the first chemical liquid nozzle 501a reacts with an alkaline chemical liquid remaining inside of the second chemical liquid nozzle 501b, or an atmosphere generated during discharge of an alkaline chemical liquid from the second chemical liquid nozzle 501b reacts with an acidic chemical liquid remaining inside of the first chemical liquid nozzle 501a.

<ii. Layout of Suction Tubes 502a and 502b>

The first suction tube 502a is placed close to the first chemical liquid nozzle 501a as a processing liquid nozzle associated with the first suction tube 502a and downstream of the rotative direction AR9 of the substrate 9 relative to the first chemical liquid nozzle 501a. The second suction tube 502b is placed close to the second chemical liquid nozzle 501b as a processing liquid nozzle associated with the second suction tube 502b and downstream of the rotative direction AR9 of the substrate 9 relative to the second chemical liquid nozzle 501b. Here, "being close to" means that an angle formed between the first suction tube 502a and the first chemical liquid nozzle 501a (or an angle formed between the second suction tube 502b and the second chemical liquid nozzle 501b) is 10 degrees or less and particularly preferably, 5 degrees or less as viewed from the center of the substrate 9 (as viewed from a rotary axis A of the spin base 21).

It is preferable that the first suction tube 502a be placed downstream of the rotative direction AR9 of the substrate 9 relative to the first chemical liquid nozzle 501a and upstream of the rotative direction AR9 of the substrate 9 relative to the rinse liquid nozzle 501c (specifically, placed between the first chemical liquid nozzle 501a and the rinse liquid nozzle 501c as viewed from the center of the substrate 9).

In this way, in the processing head 51, each of the suction tubes 502a and 502b is placed close to an associated processing liquid nozzle and downstream of the rotative direction AR9 of the substrate 9 relative to this processing liquid nozzle. Thus, in the substrate 9 to be rotated, each position within the front surface peripheral area 911 of the substrate 9 first passes through a place below each of the chemical liquid nozzle 501a and 501b and immediately thereafter, passes through a place below each of the suction tubes 502a and 502b associated with the chemical liquid nozzles 501a and 501b respectively. In this structure, in the substrate 9 to be rotated, a new chemical liquid is supplied from each of the chemical liquid nozzles 501a and 501b to each position within the front surface peripheral area 911 and immediately thereafter, a residual remainder of the processing liquid supplied to this position can be sucked into each of the suction tubes 502a and 502b associated with the chemical liquid nozzles 501a and 501b respectively. As a result, a chemical liquid to be held on each position within the front surface peripheral area 911 can always be maintained at a sufficient and necessary amount. This can accurately control an inner edge position of a region in the front surface peripheral area 911 to be acted on by a processing liquid.

<2-2-4. Discharge Position and Suction Position>

Figure 42:
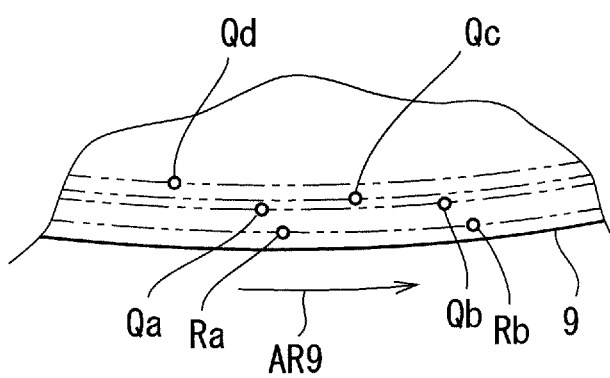
FIG. 42 schematically shows exemplary placement of target discharge positions and target suction positions.
Figure 43:
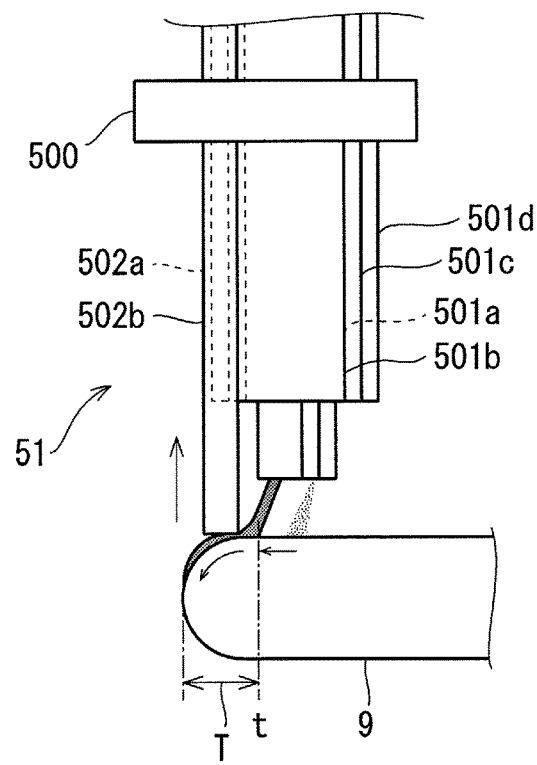
FIGS. 43 and 44 each show the processing head for peripheral area as viewed from a downstream side of a rotative direction of a substrate.
Figure 44:
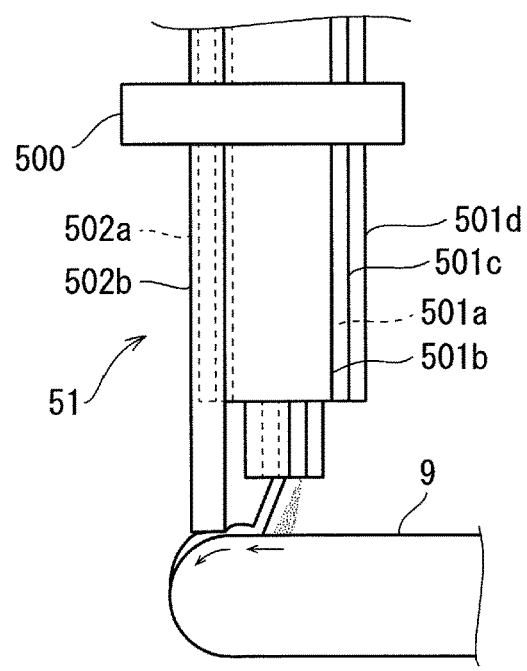

A position on the substrate 9 where a fluid discharged from each of the discharge nozzles 501a to 501d of the processing head 51 is to reach is called a "target discharge position" of each of the discharge nozzles 501a to 501d. A position on the substrate 9 where a processing liquid (more specifically, a processing liquid discharged from each of the processing liquid nozzles 501a and 501b associated with the suction tubes 502a and 502b) is sucked into each of the suction tubes 502a and 502b of the processing head 51 is called a "target suction position" of each of the suction tubes 502a and 502b. The following describes target discharge positions Qa to Qd of the discharge nozzles 501a to 501d respectively and target suction positions Ra and Rb of the suction tubes 502a and 502b respectively by referring to FIGS. 42 to 44. FIG. 42 schematically shows exemplary placement of the target discharge positions Qa to Qd and the target suction positions Ra and Rb. FIGS. 43 and 44 show the processing head 51 as viewed from a downstream side of the rotative direction AR9 of the substrate 9. FIG. 43 shows a condition where a chemical liquid and gas are discharged from the processing head 51. FIG. 44 show a condition where a rinse liquid and gas are discharged from the processing head 51.

The respective target discharge positions Qa to Qd of the discharge nozzles 501a to 501d are shifted from each other in the radial direction of the substrate 9. Specifically, the target discharge position Qd of the gas nozzle 501d is on an inner side of the radial direction of the substrate 9 (on the part of the center) relative to the respective target discharge positions Qa, Qb and Qc of the processing liquid nozzles 501a, 501b and 501c. The target discharge position Qc of the rinse liquid nozzle 501c is on an inner side of the radial direction of the substrate 9 relative to the respective target discharge positions Qa and Qb of the chemical liquid nozzles 501a and 501b. The target discharge position Qa of the first chemical liquid nozzle 501a and the target discharge position Qb of the second chemical liquid nozzle 501b are the same in the radial direction. "Positions being the same in the radial direction" means positions spaced by the same distance from the end face 93 of the substrate 9 (specifically, positions spaced by the same distance from the center of the substrate 9). Here, the target discharge position Qa of the first chemical liquid nozzle 501a and the target discharge position Qb of the second chemical liquid nozzle 501b are spaced by the same distance from the end face 93 of the substrate 9.

The position on the substrate 9 (target suction position) Ra where a chemical liquid discharged from the first chemical liquid nozzle 501a is to be sucked into the first suction tube 502a is on an outer side of the radial direction of the substrate 9 (on the part of the end face 93) relative to the target discharge position Qa of the first chemical liquid nozzle 501a. Specifically, a chemical liquid is discharged from the first chemical liquid nozzle 501a toward a first position (target discharge position Qa) on the substrate 9, and this chemical liquid is sucked into the first suction tube 502a in a second position (target suction position Ra) closer to the end face 93 of the substrate 9 than the target discharge position Qa.

Likewise, the position on the substrate 9 (target suction position) Rb where a chemical liquid discharged from the second chemical liquid nozzle 501b is to be sucked into the second suction tube 502b is on an outer side of the radial direction of the substrate 9 (on the part of the end face 93) relative to the target discharge position Qb of the second chemical liquid nozzle 501b. Specifically, a chemical liquid is discharged from the second chemical liquid nozzle 501b toward the first position (target discharge position Qb) on the substrate 9, and this chemical liquid is sucked into the second suction tube 502b in the second position (target suction position Rb) closer to the end face 93 of the substrate 9 than the target discharge position Qb.

As described above, each of the suction tubes 502a and 502b is placed downstream of the rotative direction AR9 of the substrate 9 relative to a processing liquid nozzle associated with each of the suction tubes 502a and 502b. Accordingly, the target suction position Ra of the first suction tube 502a is downstream of the rotative direction AR9 of the substrate 9 relative to the target discharge position Qa of the first chemical liquid nozzle 501a whereas the target suction position Rb of the second suction tube 502b is downstream of the rotative direction AR9 of the substrate 9 relative to the target discharge position Qb of the second chemical liquid nozzle 501b.

By way of example, the respective target discharge positions Qa and Qb of the first and second chemical liquid nozzle 501a and 501b are both separated inward from the end face 93 of the substrate 9 by 1.0 mm. The respective target suction positions Ra and Rb of the first and second suction tubes 502a and 502b are both separated from the end face 93 of the substrate 9 by a distance of from 0 to 1.0 mm. The target discharge position Qd of the gas nozzle 501d is spaced inward further in the substrate 9 from the respective target discharge positions Qa and Qb of the chemical liquid nozzles 501a and 501b (or from the respective target suction positions Ra and Rb of the suction tubes 502a and 502b) by 0.5 mm. The target discharge position Qc of the rinse liquid nozzle 501c is separated from the end face 93 of the substrate 9 by a distance of from 1.0 to 0.5 mm.

All the discharge nozzles 501a to 501d and the suction tubes 502a and 502b are supported by the support part 500 while being placed in their positions shifted from each other in the radial direction of the substrate 9 such that fluids can reach their respective target discharge positions Qa, Qb, Qc and Qd and that processing liquids can be sucked in the respective target suction positions Ra and Rb. Specifically, the gas nozzle 501d is supported by the support part 500 while being placed on an inner side of the radial direction of the substrate 9 (on the part of the center) relative to the processing liquid nozzles 501a, 501b and 501c. The rinse liquid nozzle 501c is supported by the support part 500 while being placed on an inner side of the radial direction of the substrate 9 relative to the chemical liquid nozzles 501a and 501b. The first and second chemical liquid nozzles 501a and 501b are supported by the support part 500 while being placed in the same position in the radial direction. The nozzles 501a to 501d are placed in their positions shifted from each other by an amount that is determined based on the aforementioned angle of the tilted flow path section 5142 in a manner that allows fluids to reach the corresponding target discharge positions Qa, Qb, Qc and Qd. Each of the suction tubes 502a and 502b is supported by the support part 500 while being placed on an outer side of the radial direction of the substrate 9 (on the part of the end face 93) relative to associated one of the chemical liquid nozzles 501a and 501b.

In the processing head 51, the target discharge position Qd of the gas nozzle 501d is on an inner side of the radial direction of the substrate 9 relative to the respective target discharge positions Qa, Qb and Qc of the processing liquid nozzles 501a, 501b and 501c. Accordingly, in the front surface peripheral area 911 of the substrate 9, gas is supplied to a position inside a position where a processing liquid is discharged. In this structure, a processing liquid supplied to the front surface peripheral area 911 can be removed from an inner side toward an outer side of the substrate 9 with gas. This can suppress entry of the processing liquid on the front surface peripheral area 911 into the device region 90. This can further stabilize the width of a region to be acted on by the processing liquid (such as the width of a region to be acted on by a chemical liquid for etching (etching width)), so that this width can be controlled with a higher degree of accuracy.

In the processing head 51, the target discharge position Qc of the rinse liquid nozzle 501c is on an inner side of the radial direction of the substrate 9 relative to the respective target discharge positions Qa and Qb of the chemical liquid nozzles 501a and 501b. Accordingly, in the front surface peripheral area 911 of the substrate 9, a rinse liquid is supplied to a position closer to the inside than a position where a chemical liquid is discharged. In this structure, the chemical liquid supplied to the front surface peripheral area 911 can be washed away from an inner side toward an outer side of the substrate 9 with the rinse liquid. This can sufficiently suppress entry of the chemical liquid into the device region 90 and at the same time, can wash out the chemical liquid satisfactorily without generating a residue of the chemical liquid.

In the processing head 51, the respective target discharge positions Qa and Qb of the first and second chemical liquid nozzles 501a and 501b are the same in the radial direction of the substrate 9. Accordingly, in the front surface peripheral area 911 of the substrate 9, an alkaline chemical liquid can be discharged to a position where an acidic chemical liquid is discharged. This structure allows both of the chemical liquids to act on the same region accurately.

In the processing head 51, the respective target suction positions Ra and Rb of the suction tubes 502a and 502b are closer to the end face 93 of the substrate 9 than the respective target discharge positions Qa and Qb of the processing liquid nozzles 501a and 501b associated with the suction tubes 502a and 502b respectively. Specifically, in the front surface peripheral area 911 of the substrate 9, a residual processing liquid is sucked in a position closer to the end face 93 of the substrate 9 than a position where the processing liquid is discharged. In this structure, the residual processing liquid on the front surface peripheral area 911 flows from an inner side toward an outer side of the substrate 9 and is then sucked into each of the suction tubes 502a and 502b. This can sufficiently suppress spreading of the residual processing liquid on the front surface peripheral area 911 toward the center of the substrate 9.

<3. Operation of Substrate Processing Apparatus 1>

The following describes the operation of the substrate processing apparatus 1. The substrate processing apparatus 1 performs a series of processes described below under control by the controller 130. The processes described below are merely examples of processes that can be performed by the substrate processing apparatus 1.

In the substrate processing apparatus 1, preparatory process (step S1), front surface peripheral process (step S2), processing surface switching process (step S3), back surface process (step S4), and drying process (step S5) are performed in the order named on one substrate 9, for example (FIG. 14). Each of the processes is described in detail below.

<3-1. Preparatory Process>

The preparatory process (step S1) is performed first. The particulars of the preparatory process are the same as those of the first preferred embodiment.

<3-2. Front Surface Peripheral Process>

Figure 45:
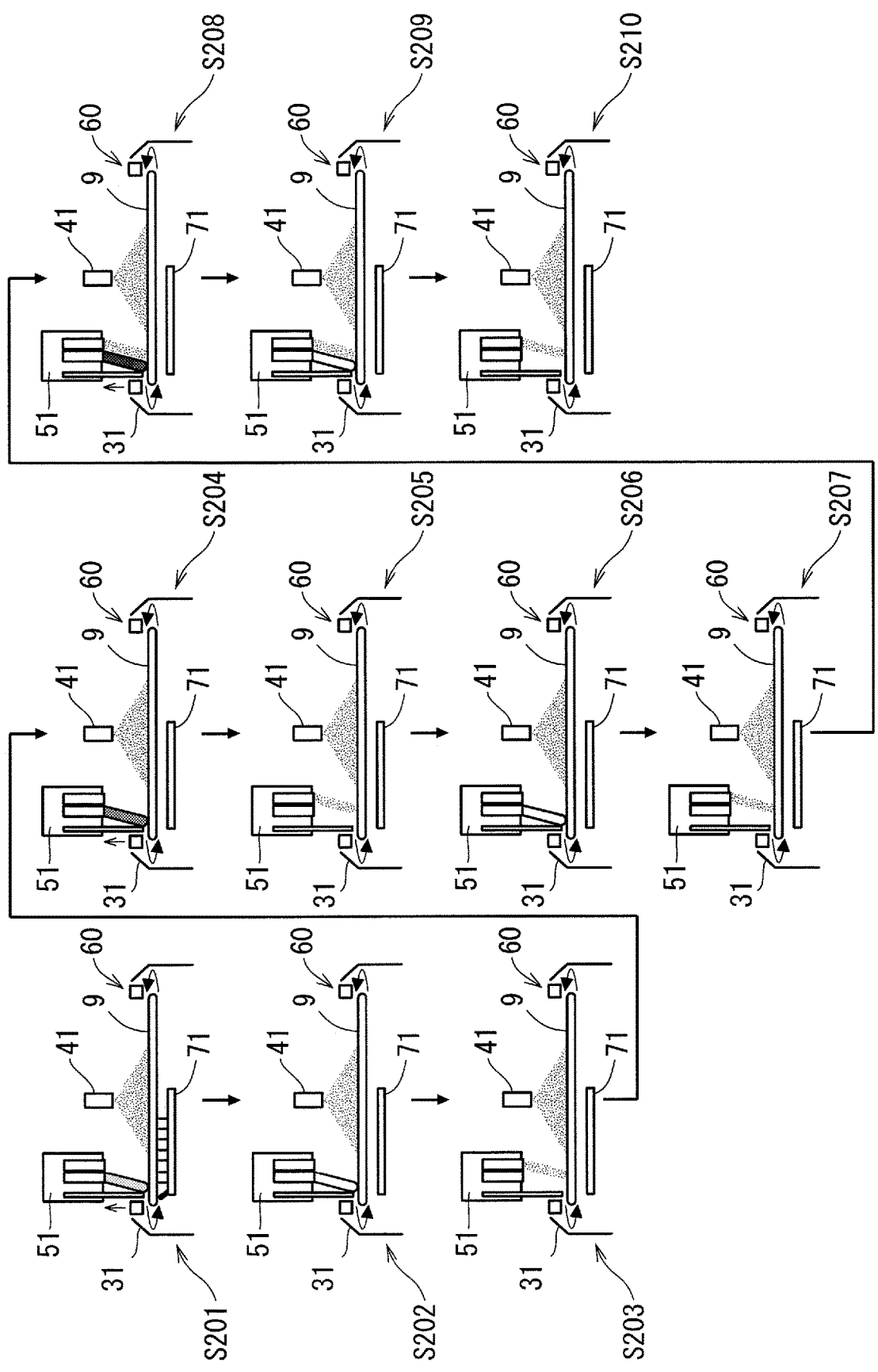
FIG. 45 explains front surface peripheral process.

When the preparatory process (step S1) is finished, the front surface peripheral process (step S2) is performed thereafter. The front surface peripheral process is described below by referring to FIGS. 17 and 45. FIG. 17 shows a flow of the front surface peripheral process. FIG. 45 explains the front surface peripheral process. In FIG. 45, some of the elements of the substrate processing apparatus 1 performing each step of the front surface peripheral process are schematically shown.

While the front surface peripheral process described below is being performed, the substrate 9 continues to be rotated at a given frequency (such as 600 rpm). As described above, supply of cover gas from the cover gas nozzle 41 toward the center and its vicinity of the front surface 91 of the substrate 9 continues during the front surface peripheral process. This protects the device region 90 from an atmosphere of a processing liquid supplied to the front surface peripheral area 911, for example.

<Alkaline Process (SC-1)>

<i. Chemical Liquid Process>

First, the front surface peripheral area 911 of the substrate 9 is subjected to chemical liquid process with SC-1 (step S201). More specifically, the processing head 51 is first moved from the retreat position to the processing position. Then, SC-1 is discharged from the second chemical liquid nozzle 501b of the processing head 51 in the processing position toward the front surface peripheral area 911 of the rotated substrate 9. At this time, SC-1 is discharged at a rate of from 20 to 50 mL/min, for example. After elapse of a certain time (such as 20 seconds) from start of discharge of SC-1, discharge of SC-1 from the processing head 51 is stopped.

This chemical liquid process removes a thin film formed on the front surface peripheral area 911 of the substrate 9 (etching process). During this chemical liquid process, in parallel with discharge of SC-1 from the second chemical liquid nozzle 501b toward the front surface peripheral area 911, residual SC-1 on the front surface peripheral area 911 is sucked into the second suction tube 502b. Specifically, suction into the second suction tube 502b is started simultaneously with start of discharge of SC-1 from the second chemical liquid nozzle 501b toward the front surface peripheral area 911. Suction into the second suction tube 502b is stopped simultaneously with stop of discharge of SC-1 from the second chemical liquid nozzle 501b toward the front surface peripheral area 911. In this way, spreading of residual SC-1 supplied to the front surface peripheral area 911 toward the center of the substrate 9 can be suppressed.

During this chemical liquid process, steam is discharged from the steam nozzle 71 toward the back surface 92 of the substrate 9. During this process, the steam is discharged at a rate of from 500 to 2000 mL/min, for example. The temperature of the discharged steam is from 110° C. to 130° C., for example. For the reason that SC-1 reacts in an accelerated manner at a higher temperature, supplying the steam to the substrate 9 to heat the substrate 9 being subjected to the chemical liquid process with SC-1 accelerates reaction between the front surface peripheral area 911 of the substrate 9 and SC-1 (specifically, increases an etching rate) (what is called heat assist). This shortens a time of the chemical liquid process with SC-1 and reduces the usage of SC-1. In particular, intensively heating the back surface peripheral area 921 of the substrate 9 during this process can effectively accelerate reaction between the front surface peripheral area 911 and SC-1.

<ii. Rinsing Process>

Next, rinsing process is performed (step S202). More specifically, a rinse liquid is discharged from the rinse liquid nozzle 501c of the processing head 51 in the processing position toward the front surface peripheral area 911 of the rotated substrate 9. After elapse of a certain time (such as five seconds) from start of discharge of the rinse liquid, discharge of the rinse liquid from the processing head 51 is stopped. This rinsing process washes out the processing liquid (here, SC-1) adhering to the front surface peripheral area 911.

<iii. Liquid Shake-Off Process>

Next, liquid shake-off process is performed (step S203). The liquid shake-off process is performed to move a processing liquid remaining on the front surface peripheral area 911 (here, the rinse liquid remaining on the front surface peripheral area 911 for not having been shaken off from the substrate 9 in the rinsing process in step S202) toward the end face 93 of the substrate 9 and to shake off the remaining processing liquid from the end face 93 to the outside of the substrate 9. The processing liquid moved toward the end face 93 is held in a non-flat surface area including the end face 93 and its neighboring area. The processing liquid held in the non-flat surface area is unlikely to be separated, so that it is shaken off collectively to the outside of the substrate 9. Specifically, the processing liquid remaining on the front surface peripheral area 911 is moved toward the end face 93 of the substrate 9 and then shaken off to the outside of the substrate 9. This can remove much of the remaining processing liquid from the substrate 9 without causing substantially no residue of the liquid on the front surface peripheral area 911.

The following describes examples of the particulars of the liquid shake-off process. First, the substrate 9 is rotated for a given time (liquid moving step) (step S2031) while discharge of a fluid (processing liquid and gas) from the processing head 51 toward the front surface peripheral area 911 is stopped. This moves the processing liquid remaining on the front surface peripheral area 911 in a direction toward the end face 93 of the substrate 9 in response to centrifugal force generated as a result of the rotation of the substrate 9, so that the processing liquid is held in the non-flat surface area including the end face 93 and its neighboring area. Next, gas is discharged from the gas nozzle 501d of the processing head 51 in the processing position toward the front surface peripheral area 911 of the rotated substrate 9 (blow-away step) (step S2032). At this time, the gas is discharged at a rate of 14 L/min, for example. This shakes off the processing liquid held in the non-flat surface area collectively to the outside of the substrate 9 in response to the wind pressure of the gas and centrifugal force generated as a result of the rotation of the substrate 9. After elapse of a certain time (such as 15 seconds) from start of discharge of the gas from the processing head 51, discharge of the gas from the processing head 51 is stopped.

This liquid shake-off process shakes off much of the processing liquid remaining on the front surface peripheral area 911 (specifically, the rinse liquid remaining on the front surface peripheral area 911 for not having been shaken off from the substrate 9 in the rinsing process in step S202).

<First Acidic Process (SC-2)>
<i. Chemical Liquid Process>

Next, the front surface peripheral area 911 of the substrate 9 is subjected to chemical liquid process with SC-2 (step S204). More specifically, SC-2 is discharged from the first chemical liquid nozzle 501a of the processing head 51 in the processing position toward the front surface peripheral area 911 of the rotated substrate 9. After elapse of a certain time (such as 20 seconds) from start of discharge of SC-2, discharge of SC-2 from the processing head 51 is stopped.

This chemical liquid process removes a metallic composition (such as Mo or Co) and the like adhering to the front surface peripheral area 911 of the substrate 9 (cleaning process). This chemical liquid process is performed after the liquid shake-off process (step S203). Accordingly, SC-2 is discharged toward the front surface peripheral area 911 on which substantially no rinse liquid remains. It is assumed that this chemical liquid process is performed without the presence of the liquid shake-off process in step S203. In this case, SC-2 is discharged toward the front surface peripheral area 911 on which the rinse liquid remains. Hence, the discharged SC-2 might collide with the remaining rinse liquid to bounce into the device region 90. However, in this chemical liquid process, substantially no rinse liquid remains on the front surface peripheral area 911 as a result of the presence of the liquid shake-off process, making entry of a processing liquid into the device region 90 unlikely due to the aforementioned collision between processing liquids. It is assumed that the liquid shake-off process in step S203 is absent. In this case, the rinse liquid remaining on the front surface peripheral area 911 and the supplied SC-2 might mix with each other. Meanwhile, the presence of the liquid shake-off process makes occurrence of such a situation unlikely. This allows SC-2 of a desired concentration to act appropriately on the front surface peripheral area 911. This can also prevent contamination between the rinse liquid having been used for washing out SC-1 as an alkaline chemical liquid and SC-2 as an acidic chemical liquid.

During this chemical liquid process, in parallel with discharge of SC-2 from the first chemical liquid nozzle 501a toward the front surface peripheral area 911, residual SC-2 on the front surface peripheral area 911 is sucked into the first suction tube 502a. Specifically, suction into the first suction tube 502a is started simultaneously with start of discharge of SC-2 from the first chemical liquid nozzle 501a toward the front surface peripheral area 911. Suction into the first suction tube 502a is stopped simultaneously with stop of discharge of SC-2 from the first chemical liquid nozzle 501a toward the front surface peripheral area 911. In this way, spreading of residual SC-2 supplied to the front surface peripheral area 911 toward the center of the substrate 9 can be suppressed.

<ii. Liquid Shake-Off Process>

Next, liquid shake-off process is performed (step S205). A specific flow of this liquid shake-off process is the same as that of step S203. Specifically, the substrate 9 is rotated for a given time (liquid moving step) while discharge of a fluid toward the front surface peripheral area 911 is stopped. Next, gas is discharged from the gas nozzle 501d of the processing head 51 in the processing position toward the front surface peripheral area 911 of the rotated substrate 9 (blow-away step). After elapse of a certain time (such as 15 seconds) from start of discharge of the gas from the processing head 51, discharge of the gas from the processing head 51 is stopped.

This liquid shake-off process shakes off much of the processing liquid remaining on the front surface peripheral area 911 (specifically, SC-2 remaining on the front surface peripheral area 911 for not having been shaken off from the substrate 9 in the cleaning process in step S204). Impurities such as the metallic composition removed from the substrate 9 by the cleaning process are left in SC-2 remaining on the front surface peripheral area 911 for not having been shaken off from the substrate 9 in the cleaning process in step S204. Meanwhile, the liquid shake-off process performed after the cleaning process shakes off these impurities at an early stage from the substrate 9. This reduces the risk of re-adhesion of the impurities to the substrate 9 after the impurities are removed from the substrate 9 during the chemical liquid process with SC-2.

<iii. Rinsing Process>

Next, rinsing process is performed (step S206). A specific flow of this rinsing process is the same as that of step S202. Specifically, a rinse liquid is discharged from the rinse liquid nozzle 501c of the processing head 51 in the processing position toward the front surface peripheral area 911 of the rotated substrate 9. After elapse of a certain time (such as five seconds) from start of discharge of the rinse liquid, discharge of the rinse liquid from the processing head 51 is stopped.

This rinsing process washes out the processing liquid (here, SC-2) adhering to the front surface peripheral area 911. This rinsing process is performed after the liquid shake-off process (step S205). Accordingly, substantially no SC-2 remains on the front surface peripheral area 911. This shortens a time of the rinsing process, compared to the case where the liquid shake-off process is absent. In this rinsing process, the rinse liquid is discharged toward the front surface peripheral area 911 on which substantially no SC-2 remains, making entry of a processing liquid into the device region 90 unlikely due to collision between processing liquids.

<iv. Liquid Shake-Off Process>

Next, liquid shake-off process is performed (step S207). A specific flow of this liquid shake-off process is the same as that of step S203. Specifically, the substrate 9 is rotated for a given time (liquid moving step) while discharge of a fluid toward the front surface peripheral area 911 is stopped. Next, gas is discharged from the gas nozzle 501d of the processing head 51 in the processing position toward the front surface peripheral area 911 of the rotated substrate 9 (blow-away step). After elapse of a certain time (such as 15 seconds) from start of discharge of the gas from the processing head 51, discharge of the gas from the processing head 51 is stopped.

This liquid shake-off process shakes off much of the processing liquid remaining on the front surface peripheral area 911 (specifically, the rinse liquid remaining on the front surface peripheral area 911 for not having been shaken off from the substrate 9 in the rinsing process in step S206).

<Second Acidic Process (DHF)>
<i. Chemical Liquid Process>

Next, the front surface peripheral area 911 of the substrate 9 is subjected to chemical liquid process with DHF (step S208). More specifically, DHF is discharged from the first chemical liquid nozzle 501a of the processing head 51 in the processing position toward the front surface peripheral area 911 of the rotated substrate 9. At this time, DHF is discharged at a rate of from 20 to 50 mL/min, for example. After elapse of a certain time (such as 10 seconds) from start of discharge of DHF, discharge of DHF from the processing head 51 is stopped.

This chemical liquid process removes a thin film formed on the front surface peripheral area 911 of the substrate 9 (etching process). This chemical liquid process is performed after the liquid shake-off process (step S207). Accordingly, DHF is discharged toward the front surface peripheral area 911 on which substantially no rinse liquid remains, making entry of a processing liquid into the device region 90 unlikely due to collision between processing liquids. Additionally, DHF and the rinse liquid will not mix with each other on the front surface peripheral area 911. This allows DHF of a desired concentration to act appropriately on the front surface peripheral area 911.

During this chemical liquid process, in parallel with discharge of DHF from the first chemical liquid nozzle 501a toward the front surface peripheral area 911, residual DHF on the front surface peripheral area 911 is sucked into the first suction tube 502a. Specifically, suction into the first suction tube 502a is started simultaneously with start of discharge of DHF from the first chemical liquid nozzle 501a toward the front surface peripheral area 911. Suction into the first suction tube 502a is stopped simultaneously with stop of discharge of DHF from the first chemical liquid nozzle 501a toward the front surface peripheral area 911. In this way, spreading of residual DHF supplied to the front surface peripheral area 911 toward the center of the substrate 9 can be suppressed.

During this chemical liquid process, gas is discharged from the gas nozzle 501d of the processing head 51 toward the front surface peripheral area 911. At this time, the gas is discharged at a rate of 14 L/min, for example. Specifically, in each position within the front surface peripheral area 911, old DHF (having been supplied from the first chemical liquid nozzle 501a before one rotation of the substrate 9 and not having been shaken off during this rotation) is removed with the gas discharged from the gas nozzle 501d. Then, new DHF is supplied to this position from the first chemical liquid nozzle 501a. As described above, this structure can suppress entry of a processing liquid into the device region 90 due to collision between an old processing liquid not having been shaken off during one rotation of the substrate 9 and a newly supplied processing liquid. This structure further allows the substrate 9 to be always acted on by fresh DHF, thereby enhancing processing efficiency. This structure also prevents a situation where DHF temporarily remains in large amount in each position within the front surface peripheral area 911. This can stabilize an etching width, so that the etching width can be controlled with a higher degree of accuracy. Supplying DHF makes the front surface peripheral area 911 water repellent, so that an old processing liquid held on the front surface peripheral area 911 may become thick partially. If a new processing liquid is supplied in this condition, the processing liquid may be repelled to bounce easily. In response, an old processing liquid is blown away toward an outer side of the substrate 9 with the gas discharged from the gas nozzle 501d. This sufficiently suppresses entry of droplets of this old processing liquid or the like into the device region 90.

<ii. Rinsing Process>

Next, rinsing process is performed (step S209). A specific flow of this rinsing process is the same as that of step S202. Specifically, a rinse liquid is discharged from the rinse liquid nozzle 501c of the processing head 51 in the processing position toward the front surface peripheral area 911 of the rotated substrate 9. After elapse of a certain time (such as five seconds) from start of discharge of the rinse liquid, discharge of the rinse liquid from the processing head 51 is stopped.

This rinsing process washes out the processing liquid (here, DHF) adhering to the front surface peripheral area 911. During this rinsing process, gas is discharged from the gas nozzle 501d of the processing head 51 toward the front surface peripheral area 911 of the substrate 9. At this time, the gas is discharged at a rate of 14 L/min, for example. Specifically, in each position within the front surface peripheral area 911, an old rinse liquid (having been supplied from the rinse liquid nozzle 501c before one rotation of the substrate 9 and not having been shaken off during this rotation) is removed with the gas discharged from the gas nozzle 501d. Then, a new rinse liquid is supplied to this position from the rinse liquid nozzle 501c. As described above, this structure can suppress entry of a processing liquid into the device region 90 due to collision between an old processing liquid not having been shaken off during one rotation of the substrate 9 and a newly supplied processing liquid. This structure removes an old rinse liquid containing DHF readily from the front surface peripheral area 911 and allows the substrate 9 to be acted on by a new rinse liquid not containing DHF, thereby enhancing efficiency of the rinsing process. In this structure, as described above, droplets of a processing liquid or the like repelled by the front surface peripheral area 911 are blown off toward an outer side of the substrate 9 with a flow of the gas discharged from the gas nozzle 501*d*, so that entry of these droplets or the like into the device region 90 is suppressed sufficiently.

<iii. Liquid Shake-Off Process>

Next, liquid shake-off process is performed (step S210). A specific flow of this liquid shake-off process is the same as that of step S203. Specifically, the substrate 9 is rotated for a given time (liquid moving step) while discharge of a fluid toward the front surface peripheral area 911 is stopped. Next, gas is discharged from the gas nozzle 501*d* of the processing head 51 in the processing position toward the front surface peripheral area 911 of the rotated substrate 9 (blow-away step). After elapse of a certain time (such as five seconds) from start of discharge of the gas from the processing head 51, discharge of the gas from the processing head 51 is stopped.

This liquid shake-off process shakes off much of the processing liquid remaining on the front surface peripheral area 911 (specifically, the rinse liquid remaining on the front surface peripheral area 911 for not having been shaken off from the substrate 9 in the rinsing process in step S209).

<3-3. Processing Surface Switching Process>

When the front surface peripheral process (step S2) is finished, the processing surface switching process (step S3) is performed thereafter. The particulars of the processing surface switching process are the same as those of the first preferred embodiment.

<3-4. Back Surface Process>

When the processing surface switching process (step S3) is finished, the back surface process (step S4) is performed thereafter. The particulars of the back surface process are the same as those of the first preferred embodiment.

<3-5. Drying Process>

When the back surface process (step S4) is finished, the drying process (step S5) is performed thereafter. The particulars of the drying process are the same as those of the first preferred embodiment.

<4. Effects>

Not many device patterns (circuit patterns) are formed to reach a place as near as an end face of a substrate. In many cases, a device pattern is formed on a surface region spaced inward a given width from an end face of a substrate.

However, in a film formation step performed to form a device pattern, a film may be formed to reach a place outside a region (device region) where the device pattern is to be formed. The film formed outside the device region is not only being unnecessary but it might also become a cause for various troubles. As an example, the film outside the device region might come unstuck during a process step. This may bring about the danger for example of yield reduction or a trouble in a substrate processing apparatus.

This may be handled by the process of removing a thin film by etching formed outside a device region (what is called bevel etching process). An apparatus responsible for such process has been suggested (see Japanese Patent Application Laid-Open Nos. 2006-229057, 2003-264168, 2007-258274 and 2003-286597, for example).

During process on a front surface peripheral area outside a device region with a processing liquid, supplying the processing liquid of an amount larger than an amount necessary for the process onto the front surface peripheral area may make a residue of the processing liquid spread toward the center of a substrate. In this case, an inner edge position of a region in the front surface peripheral area to be acted on by the processing liquid might be shifted toward the center of the substrate from a desired position. At worst, the processing liquid spreading toward the center of the substrate enters a device region to act disadvantageously on a device pattern.

Accordingly, a technique that can suppress spreading of a residual processing liquid supplied to a front surface peripheral area of a substrate toward the center of the substrate has been desired.

In the third preferred embodiment, a residual processing liquid on the front surface peripheral area 911 can be removed by sucking the residual processing liquid into each of the suction tubes 502*a* and 502*b* having been supplied from a processing liquid nozzle (more specifically, a processing liquid nozzle associated with each of the suction tubes 502*a* and 502*b*: in the third preferred embodiment, this processing liquid nozzle corresponds to each of the chemical liquid nozzles 501*a* and 501*b*). This can suppress spreading of the residual processing liquid on the front surface peripheral area 911 toward the center of the substrate 9. Specifically, this can suppress shift of an inner edge position of a region in the front surface peripheral area 911 to be acted on by a processing liquid from a desired position toward the center of the substrate 9. This can also prevent the occurrence of a situation where a processing liquid spreading toward the center of the substrate 9 enters the device region 90 to act disadvantageously on a device pattern.

In the third preferred embodiment, in the processing head 51, each of the suction tubes 502*a* and 502*b* and a processing liquid nozzle associated with this suction tube are supported integrally. In this structure, as viewed from each position within the front surface peripheral area 911 of the rotated substrate 9, each of the suction tubes 502*a* and 502*b* and a processing liquid nozzle associated with this suction tube are moved integrally relative to each other. Accordingly, timing of supplying a processing liquid from a processing liquid nozzle and timing of sucking the processing liquid into each of the suction tubes 502*a* and 502*b* are the same in all the positions within the front surface peripheral area 911. Thus, a processing liquid can be held in each position within the front surface peripheral area 911 while suppressing variations of the amount of the processing liquid among all the positions within the front surface peripheral area 911. As a result, each position within the front surface peripheral area 911 can be processed uniformly.

In the third preferred embodiment, in the processing head 51, each of the first and second suction tubes 502*a* and 502*b* is placed close to a processing liquid nozzle associated with this suction tube and downstream of a rotative direction of the substrate 9 relative to this processing liquid nozzle. In this structure, in the substrate 9 to be rotated, a new processing liquid is supplied from a processing liquid nozzle to each position within the front surface peripheral area 911 and immediately thereafter, a residual remainder of the processing liquid supplied to this position can be sucked into the suction tube 502*a* or 502*b* associated with this processing liquid nozzle. As a result, a processing liquid to be held on each position within the front surface peripheral area 911 can always be maintained at a sufficient and necessary amount. This can accurately control an inner edge position of a region in the front surface peripheral area 911 to be acted on by a processing liquid.

In the third preferred embodiment, while each of the suction tubes 502*a* and 502*b* is placed in the suction position, the inner end 5211 of the suction port 521 is closer to the end face 93 of the substrate 9 than an inner edge position (target inner edge position t) of a region in the front surface peripheral area 911 to be acted on by a processing liquid (target processing region to be acted on by a processing liquid discharged from a processing liquid nozzle associated with each of the suction tubes 502a and 502b). In this structure, suction pressure can act on a place on the part of the end face 93 of the substrate 9 relative to the target inner edge position t. This can suppress protrusion of a processing liquid into an inner side relative to a region to be acted on by this processing liquid.

In the third preferred embodiment, while each of the suction tubes 502a and 502b is placed in the suction position, the outer end 5212 of the suction port 521 is closer to the inside than the end face 93 of the substrate 9. In this structure, suction pressure can act on effectively on a processing liquid.

In the third preferred embodiment, a processing liquid is discharged toward the first position on the substrate 9, and a residue of the processing liquid is sucked in the second position closer to the end face 93 of the substrate 9 than the first position. In this structure, the residual processing liquid on the front surface peripheral area 911 flows from an inner side toward an outer side of the substrate 9 and is then sucked into each of the suction tubes 502a and 502b. This can sufficiently suppress spreading of the residual processing liquid on the front surface peripheral area 911 toward the center of the substrate 9.

In the third preferred embodiment, the processing head 51 includes the gas nozzle 501d from which gas is discharged toward the front surface peripheral area 911. In this structure, an old processing liquid supplied to the front surface peripheral area 911 from the processing liquid nozzle 501a, 501b or 501c can be removed with gas discharged from the gas nozzle 501d. This makes the occurrence of a situation unlikely where a newly supplied processing liquid on the front surface peripheral area 911 collides with an old processing liquid to bounce. This suppresses entry of a processing liquid into the device region 90.

In the third preferred embodiment, in parallel with discharge of a processing liquid toward the front surface peripheral area 911 of the rotated substrate 9, a residue of the processing liquid on the front surface peripheral area 911 is sucked. This structure can suppress spreading of the residual processing liquid on the front surface peripheral area 911 toward the center of the substrate 9 while avoiding reduction of processing efficiency.

<5. Modification of Processing Head for Peripheral Area>

Figure 46:
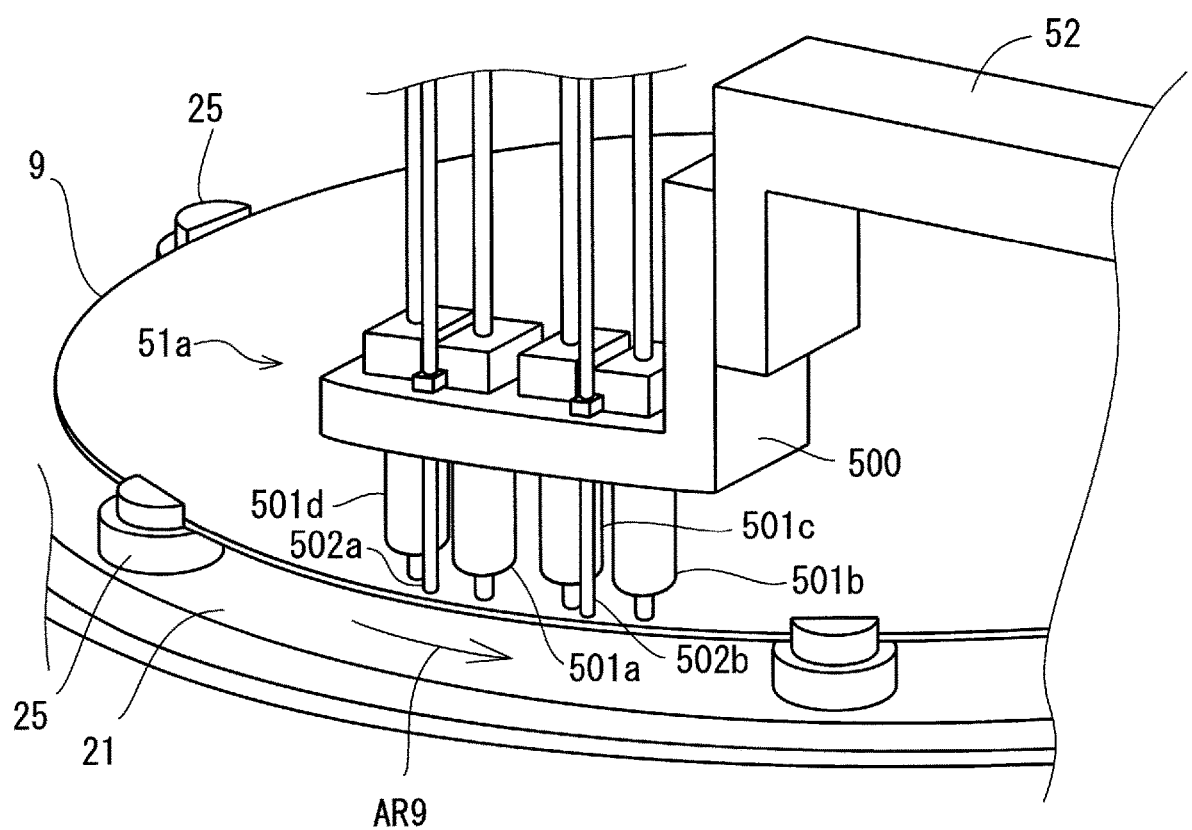
FIG. 46 is a perspective view showing a processing head for peripheral area according to a modification.

A processing head 51a for peripheral area according to a different preferred embodiment is described below by referring to FIG. 46. FIG. 46 is a perspective view of the processing head 51a. In FIG. 46, structures same as those of the third preferred embodiment are identified by the same signs. In the following, structures same as those of the third preferred embodiment are identified by the same signs and will not be described repeatedly.

Like the processing head 51 of the third preferred embodiment, the processing head 51a includes the discharge nozzles 501a to 501d and the suction tubes 502a and 502b. The processing head 51a further includes the support part 500 that supports the discharge nozzles 501a to 501d and the suction tubes 502a and 502b integrally.

The processing head 51a differs from the processing head 51 of the third preferred embodiment in the layout of the suction tubes 502a and 502b. Specifically, in the processing head 51a, the first suction tube 502a is placed close to the first chemical liquid nozzle 501a associated with the first suction tube 502a and upstream of the rotative direction AR9 of the substrate 9 relative to the first chemical liquid nozzle 501a. The second suction tube 502b is placed close to the second chemical liquid nozzle 501b associated with the second suction tube 502b and upstream of the rotative direction AR9 of the substrate 9 relative to the second chemical liquid nozzle 501b. Like in the third preferred embodiment, "being close to" mentioned herein means that an angle formed between the first suction tube 502a and the first chemical liquid nozzle 501a (or an angle formed between the second suction tube 502b and the second chemical liquid nozzle 501b) is 10 degrees or less and particularly preferably, 5 degrees or less as viewed from the center of the substrate 9.

In this way, in the processing head 51a, each of the suction tubes 502a and 502b is placed close to an associated processing liquid nozzle and upstream of the rotative direction AR9 of the substrate 9 relative to this processing liquid nozzle. In this structure, a residual processing liquid supplied from a processing liquid nozzle and flowing toward an upstream side of the rotative direction of the substrate 9 can be removed from the front surface peripheral area 911 by sucking the residual processing liquid into each of the suction tubes 502a and 502b associated with this processing liquid nozzle. This can suppress spreading of the residual processing liquid on the front surface peripheral area 911 toward the center of the substrate 9.

In this structure, in the substrate 9 to be rotated, each position within the front surface peripheral area 911 of the substrate 9 passes through a place below each of the suction tubes 502a and 502b associated with the chemical liquid nozzles 501a and 501b respectively immediately before it passes through a place below each of the chemical liquid nozzle 501a and 501b. Thus, an old processing liquid having been supplied from a processing liquid nozzle before one rotation of the substrate 9 and not having been shaken off during this rotation is sucked into the suction tube 502a or 502b associated with this processing liquid nozzle. Then, a new processing liquid can be supplied to this position. This can suppress the occurrence of a situation where a newly supplied processing liquid collides with an old processing liquid on the front surface peripheral area 911 to bounce into the device region 90.

<6. Modifications>

In the third preferred embodiment, the processing head 51 includes the two suction tubes 502a and 502b and the suction tubes 502a and 502b are associated with the chemical liquid nozzles 501a and 501b respectively. The processing head 51 may further include a suction tube associated with the rinse liquid nozzle 501c. The processing head 51 is not always required to include two or more suction tubes but it may include at least one suction tube associated with one of the processing liquid nozzles 501a, 501b and 501c. The processing head 51 may also include multiple suction tubes associated with one processing liquid nozzle.

In the processing head 51 of the third preferred embodiment, the first and second chemical liquid nozzles 501a and 501b are placed upstream and downstream respectively of the rotative direction AR9 of the substrate 9 relative to the rinse liquid nozzle 501c. Alternatively, the second and first chemical liquid nozzles 501b and 501a may be placed upstream and downstream respectively of the rotative direction AR9 of the substrate 9 relative to the rinse liquid nozzle 501c.

In the third preferred embodiment, a residual chemical liquid on the front surface peripheral area 911 of the substrate 9 is sucked into each of the suction tubes 502a and 502b during each of the chemical liquid process with SC-1 (step S201), the chemical liquid process with SC-2 (step S204), and the chemical liquid process with DHF (step S208). However, suction into the suction tubes 502a and 502*b* is not always required to be performed in all the chemical liquid processes. As an example, in chemical liquid process intended for cleaning, suction into the suction tubes 502*a* and 502*b* may be omitted.

In the third preferred embodiment, suction into each of the suction tubes 502*a* and 502*b* is started simultaneously with start of discharge of a chemical liquid from each of the chemical liquid nozzles 501*a* and 501*b* toward the front surface peripheral area 911. Meanwhile, suction into each of the suction tubes 502*a* and 502*b* may be started after or before discharge of a chemical liquid is started.

In the third preferred embodiment, suction into each of the suction tubes 502*a* and 502*b* is stopped simultaneously with stop of discharge of a chemical liquid from each of the chemical liquid nozzles 501*a* and 501*b* toward the front surface peripheral area 911. Meanwhile, suction into each of the suction tubes 502*a* and 502*b* may be stopped after or before discharge of a chemical liquid is stopped.

Other Preferred Embodiments

In each of the aforementioned preferred embodiments, steam is not supplied (heat assist is not given) to the back surface 92 of the substrate 9 during the chemical liquid process with SC-2 (step S204) and the chemical liquid process with DHF (step S208). Specifically, in each of the aforementioned preferred embodiments, the chemical liquid process with SC-2 is intended to advance not etching process but cleaning process, so heat assist is not given in this chemical liquid process. Regarding DHF, etching with DHF proceeds at a relatively high rate without heat assist, so that heat assist is not given either in the chemical liquid process with DHF. Meanwhile, depending on a process target, for example, steam may be supplied to the back surface 92 of the substrate 9 during the chemical liquid process with SC-2 or the chemical liquid process with DHF.

In each of the aforementioned preferred embodiments, gas is not supplied from the gas nozzle 50*d* to the front surface peripheral area 911 during each of the chemical liquid process with SC-1 (step S201), its subsequent rinsing process (step S202), the chemical liquid process with SC-2 (step S204), and its subsequent ringing process (step S206). This is for the reason as follows. Supplying SC-1 or SC-2 makes the front surface peripheral area 911 hydrophilic, so that a film of a processing liquid supplied to this front surface peripheral area 911 can be held relatively stably on this peripheral area only by centrifugal force generated as a result of rotation of the substrate 9. Supplying gas to the front surface peripheral area 911 in this condition in turn disadvantageously causes bounce of liquid. Meanwhile, depending on a process target, for example, gas can be supplied to the front surface peripheral area 911 during each of the aforementioned processes.

In each of the aforementioned preferred embodiments, the liquid shake-off process is not performed after the chemical liquid process with SC-1. This is for the reason as follows. The substrate 9 is etched by the chemical liquid process with SC-1 in each of the aforementioned preferred embodiments. The rinsing process is performed after the etching without intervention of the liquid shake-off process to wash out a chemical liquid readily having been used for the etching, so that an etching width and an etching depth can be controlled favorably. Supplying SC-1 makes the front surface peripheral area 911 hydrophilic. Thus, SC-1 remaining on the front surface peripheral area 911 at the time when the chemical liquid process with SC-1 is finished spreads thinly on the front surface peripheral area 911. Supplying a rinse liquid as a next processing liquid to the front surface peripheral area 911 in this condition makes bounce of liquid relatively unlikely. Specifically, omitting the liquid shake-off process after the chemical liquid process with SC-1 is not likely to cause a serious problem. Meanwhile, depending on a process target, for example, the liquid shake-off process may be performed after the chemical liquid process with SC-1. As an example, if the chemical liquid process with SC-1 realizes not etching but cleaning of the substrate 9 (such as cleaning of removing of an organic substance or the like adhering to the front surface peripheral area 911 of the substrate 9), it is rather preferable that the liquid shake-off process be performed after the chemical liquid process with SC-1.

In each of the aforementioned preferred embodiments, the liquid shake-off process is not performed after the chemical liquid process with DHF. This is for the reason as follows. The substrate 9 is etched by the chemical liquid process with DHF in each of the aforementioned preferred embodiments. As described above, the rinsing process is performed after the etching without intervention of the liquid shake-off process to wash out a chemical liquid readily having been used for the etching, so that an etching width and an etching depth can be controlled favorably. Supplying DHF makes the front surface peripheral area 911 water repellent, so that a processing liquid is hard to stay on the front surface peripheral area 911. Additionally, in each of the aforementioned preferred embodiments, gas is supplied from the gas nozzle 50*d* to the front surface peripheral area 911 during the chemical liquid process with DHF. Thus, much of unnecessary DHF supplied to the front surface peripheral area 911 is removed from the end face 93 of the substrate 9. Thus, when the chemical liquid process with DHF is finished, substantially no DHF remains on the front surface peripheral area 911 of the substrate 9 (without requiring the liquid shake-off process). Accordingly, there is scarce need to perform the liquid shake-off process particularly after the chemical liquid process with DHF. Meanwhile, depending on a process target, for example, the liquid shake-off process may be performed after the chemical liquid process with DHF.

In each of the aforementioned preferred embodiments, the chemical liquid processes with three types of chemical liquids (SC-1, SC-2 and DHF) are performed in order in each of the front surface peripheral process (step S2) and the back surface process (step S4) while process such as rinsing process is performed between these chemical liquid processes. Meanwhile, chemical liquid processes do not always use these three types of chemical liquids. As an example, chemical liquid process on the front surface peripheral area 911 or the back surface 92 may be performed using one or more chemical liquids selected from aqueous solutions of SC-1, SC-2, DHF, BDHF (buffered hydrofluoric acid), HF (hydrofluoric acid), hydrochloric acid, sulfuric acid, nitric acid, phosphoric acid, acetic acid, oxalic acid and ammonia, and mixed solutions thereof, for example.

The fluid supplier 55 of each of the aforementioned preferred embodiments can be formed by combining a hydrofluoric acid source to supply hydrofluoric acid (49% of hydrofluoric acid, for example), a hydrochloric acid source to supply hydrochloric acid, a hydrogen peroxide source to supply hydrogen peroxide, an ammonium hydroxide source to supply ammonium hydroxide, a pure water source to supply pure water, a carbon dioxide gas source to supply carbon dioxide, a nitrogen gas source to supply nitrogen gas, pipes, open-close valves, and a mixing valve, for example. By way of example, in this structure, hydrofluoric acid from the hydrofluoric acid source and pure water from the pure water source are mixed in the mixing valve in a prescribed ratio to generate DHF. Then, the resultant DHF is supplied to the discharge head 51 (more specifically, first chemical liquid nozzle 50a or 501a). Further, hydrochloric acid from the hydrochloric acid source and hydrogen peroxide from the hydrogen peroxide source are mixed in the mixing valve in a prescribed ratio to generate SC-2. Then, the resultant SC-2 is supplied to the discharge head 51 (more specifically, first chemical liquid nozzle 50a or 501a). Further, ammonium hydroxide from the ammonium hydroxide source and hydrogen peroxide from the hydrogen peroxide source are mixed in the mixing valve in a prescribed ratio to generate SC-1. Then, the resultant SC-1 is supplied to the discharge head 51 (more specifically, second chemical liquid nozzle 50b or 501b). Further, carbon dioxide is dissolved in pure water from the pure water source to generate a rinse liquid. Then, the resultant rinse liquid is supplied to the discharge head 51 (more specifically, rinse liquid nozzle 50c or 501c).

In each of the aforementioned preferred embodiments, the heat processing unit 7 heats the substrate 9 with steam. The heat processing unit 7 may use a different heat source (such as a heating wire heater or a lamp heater) to heat the substrate 9. Meanwhile, heating the substrate 9 with steam is particularly preferable as it can heat the substrate 9 locally in a short time (and eventually, achieve a favorable throughput) compared to heating the substrate 9 with a heating wire heater or a lamp heater.

In each of the aforementioned preferred embodiments, the liquid shake-off process includes the liquid moving step (step S2031) and the blow-away step (step S2032) that are performed in order. Meanwhile, the liquid moving step (step S2031) and the blow-away step (step S2032) can be performed in parallel.

Timing of the liquid shake-off process is not limited to that described as an example in each of the aforementioned preferred embodiments. As an example, the liquid shake-off process to be performed after the chemical liquid process with SC-2 may be omitted, or at least one of the liquid shake-off processes to be performed after corresponding rinsing processes may be omitted. Additionally, as described above, the liquid shake-off process may be performed after the chemical liquid process with SC-1 or after the chemical liquid process with DHF.

In each of the aforementioned preferred embodiments, the front surface peripheral area 911 and the back surface 92 of the substrate 9 are processed by the substrate processing apparatus 1. Meanwhile, only the front surface peripheral area 911 or the back surface 92 may be processed by the substrate processing apparatus 1.

In the discharge head 51 of each of the aforementioned preferred embodiments, the first and second chemical liquid nozzles 50a and 50b are placed upstream and downstream respectively of the rotative direction AR9 of the substrate 9 relative to the rinse liquid nozzle 50c. Alternatively, the second and first chemical liquid nozzles 50b and 50a may be placed upstream and downstream respectively of the rotative direction AR9 of the substrate 9 relative to the rinse liquid nozzle 50c.

In each of the aforementioned preferred embodiments, while the discharge head 51 is placed in the processing position, at least part of the discharge head 51 is housed in the cut 605 formed in the inner circumferential wall 601 of the guard member 60. Meanwhile, while the discharge head 51 is placed in the processing position, at least part of the discharge head 51 (as a specific example, at least part of the nozzle 50 of the discharge head 51) may be housed in a through hole penetrating through the guard member 60 from the upper surface 604 toward the lower surface 602, for example. Specifically, the nozzle 50 of the discharge head 51 in the processing position may be placed on a side opposite the cup 31 with respect to part of the guard member 60.

In the substrate processing apparatus 1 of each of the aforementioned preferred embodiments, at least one of the front surface peripheral area 911 and the back surface 92 may be subjected to process other than etching process and cleaning process (such as film deposition process).

In each of the aforementioned preferred embodiments, the back surface 92 of the substrate 9 is processed after the front surface peripheral area 911 of the substrate 9 is processed in the substrate processing apparatus 1. Meanwhile, the front surface peripheral area 911 and the back surface 92 can be processed in parallel.

In each of the aforementioned preferred embodiments, the substrate 9 is described as a semiconductor wafer. The substrate 9 may also be a glass substrate for a liquid crystal display, a glass substrate for a plasma display, a substrate for an optical disk, a substrate for a magnetic disk, a substrate for a magnetooptical disk, a glass substrate for a photomask, or a substrate for a solar cell, for example.

While the invention has been shown and described in detail, the foregoing description is in all aspects illustrative and not restrictive. It is therefore understood that numerous modifications and variations can be devised without departing from the scope of the invention.

What is claimed is:

1. A substrate processing method comprising the steps of:
    a) providing a substrate holder configured to hold a substrate on which a film is formed in a horizontal orientation;
    b) rotating said substrate holder about a vertical rotary axis passing through the center of a plane of said substrate;
    c) discharging a first processing liquid for removing said film toward a front surface peripheral area of said substrate held and rotated by said substrate holder; and
    d) discharging a second processing liquid for removing said film toward a back surface of said substrate held and rotated by said substrate holder without discharging a processing liquid to a front surface of said substrate, said step d) being performed after said step c).

2. The substrate processing method according to claim 1, wherein said second processing liquid is a same processing liquid as said first processing liquid.

3. A substrate processing method comprising the steps of:
    a) providing a substrate holder to hold a substrate on which a film is formed in a horizontal orientation;
    b) rotating said substrate holder about a vertical rotary axis passing through the center of a plane of said substrate;
    c) discharging a first processing liquid for removing said film toward a front surface peripheral area of said substrate held and rotated by said substrate holder;
    d) reducing a rotation speed of said substrate held by said substrate holder, said step d) being performed after said step c); and
    e) discharging a second processing liquid for removing said film toward a back surface of said substrate held and rotated by said substrate holder, said step e) being performed, after said step d).

4. The substrate processing method according to claim 3, wherein in said step e), said second processing liquid is discharged toward said back surface of said substrate with said substrate held by said substrate holder without a processing liquid being discharged to a front surface of said substrate after said step c).

5. The substrate processing method according to claim 3, wherein said second processing liquid is a same processing liquid as in said first processing liquid.

6. A substrate processing apparatus comprising:
a substrate holder to hold a substrate on which a film is formed in a horizontal orientation, said substrate holder rotating said substrate about a vertical rotary axis passing through the center of a plane of said substrate;
a discharge head for a peripheral area from which a first processing liquid for removing said film is discharged to a front surface peripheral area of said substrate held by said substrate holder;
a back surface processing unit to discharge a second processing liquid for removing said film to a back surface of said substrate held by said substrate holder; and
a controller to control said substrate holder, said discharge head for the peripheral area, and said back surface processing unit,
wherein said controller causes said first processing liquid to be discharged from said discharge head for the peripheral area toward said front surface peripheral area of said substrate held and rotated by said substrate holder and thereafter, said controller actuates said back surface processing unit to discharge said second processing liquid toward said back surface of said substrate without a processing liquid being discharged to a front surface of said substrate.

7. The substrate processing apparatus according to claim 6,
wherein said substrate holder includes a group of holding members, said group of holding members abutting an end surface of said substrate, and holding said substrate in a horizontal orientation, and
wherein said controller causes said first processing liquid to be discharged from said discharge head for peripheral area toward said front surface peripheral area of said substrate held and rotated by said group of holding members and thereafter, said controller actuates said back surface processing unit discharge said second processing liquid toward said back surface of said substrate with said substrate held by said group of holding members without a processing liquid being discharged to a front surface of said substrate.

8. The substrate processing apparatus according to claim 6,
wherein said second processing liquid is a same processing liquid as in said first processing liquid.

9. A substrate processing apparatus comprising:
a substrate holder to hold a substrate on which a film is formed in a horizontal orientation, said substrate holder rotating said substrate about a vertical rotary axis passing through the center of a plane of said substrate;
a discharge head for peripheral area from which a first processing liquid for removing said film is discharged to a front surface peripheral area of said substrate held by said substrate holder;
a back surface processing unit to discharge a second processing liquid for removing said film to a back surface of said substrate held by said substrate holder; and
a controller to control said substrate holder, said discharge head for peripheral area, and said back surface processing unit,
wherein said controller causes said first processing liquid to be discharged from said discharge head for peripheral area toward said front surface peripheral area of said substrate held and rotated by said substrate holder and thereafter, said controller actuates said back surface processing unit discharge said second processing liquid toward said back surface of said substrate, and
wherein said controller actuates said substrate holder to reduce a rotation speed of said substrate after stopping discharge of said first processing liquid from said discharge head for peripheral area and before starting discharge of said second processing liquid from said back surface processing unit.

10. The substrate processing apparatus according to claim 9,
wherein said controller causes said first processing liquid to be discharged from said discharge head for peripheral area toward said front surface peripheral area of said substrate held and rotated by said substrate holder and thereafter, said controller actuates said back surface processing unit discharge said second processing liquid toward said back surface of said substrate with said substrate held by said substrate holder without a processing liquid being discharged to a front surface of said substrate.

11. The substrate processing apparatus according to claim 10,
wherein said substrate holder includes a group of holding members, said group of holding members abutting an end surface of said substrate, and holding said substrate in a horizontal posture, and
wherein said controller causes said first processing liquid to be discharged from said discharge head for peripheral area toward said front surface peripheral area of said substrate held and rotated by said group of holding members and thereafter, said controller actuates said back surface processing unit discharge said second processing liquid toward said back surface of said substrate with said substrate held by said group of holding members without a processing liquid being discharged to a front surface of said substrate.

12. The substrate processing apparatus according to claim 9,
wherein said second processing liquid is a same processing liquid as in said first processing liquid.

* * * * *